United States Patent
Hamaguchi et al.

(10) Patent No.: US 12,034,274 B2
(45) Date of Patent: Jul. 9, 2024

(54) LIGHT EMITTING ELEMENT

(71) Applicant: Sony Corporation, Tokyo (JP)

(72) Inventors: Tatsushi Hamaguchi, Kanagawa (JP); Jugo Mitomo, Kanagawa (JP); Hiroshi Nakajima, Kanagawa (JP); Masamichi Ito, Miyagi (JP); Susumu Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 18/111,686

(22) Filed: Feb. 20, 2023

(65) Prior Publication Data
US 2023/0208106 A1 Jun. 29, 2023

Related U.S. Application Data

(63) Continuation of application No. 16/471,428, filed as application No. PCT/JP2017/037234 on Oct. 13, 2017, now Pat. No. 11,611,196.

(30) Foreign Application Priority Data
Dec. 20, 2016 (JP) .................. 2016-246654

(51) Int. Cl.
*H01S 5/183* (2006.01)
*H01S 5/02* (2006.01)
(Continued)

(52) U.S. Cl.
CPC ........ *H01S 5/18327* (2013.01); *H01S 5/0207* (2013.01); *H01S 5/18341* (2013.01);
(Continued)

(58) Field of Classification Search
CPC .. H01S 5/18327; H01S 5/2022; H01S 5/2219; H01S 5/3095
See application file for complete search history.

(56) References Cited

U.S. PATENT DOCUMENTS 5,719,892 A 2/1998 Jiang et al.
6,233,267 B1 5/2001 Nurmikko et al.
(Continued)

FOREIGN PATENT DOCUMENTS

JP H04-363081 A 12/1992
JP H10-051068 A 2/1998
(Continued)

OTHER PUBLICATIONS

International Search Report and Written Opinion issued in connection with International Patent Application No. PCT/JP2017/037234, dated Nov. 14, 2017. (12 pages).
(Continued)

*Primary Examiner* — Yuanda Zhang
(74) *Attorney, Agent, or Firm* — K&L Gates LLP

(57) ABSTRACT

A light emitting element according to the present disclosure includes a first light reflecting layer 41, a laminated structure 20, and a second light reflecting layer 42 laminated to each other. The laminated structure 20 includes a first compound semiconductor layer 21, a light emitting layer 23, and a second compound semiconductor layer 22 laminated to each other from a side of the first light reflecting layer. Light from the laminated structure 20 is emitted to an outside via the first light reflecting layer 41 or the second light reflecting layer 42. The first light reflecting layer 41 has a structure in which at least two types of thin films 41A and 41B are alternately laminated to each other in plural numbers. A film thickness modulating layer 80 is provided between the laminated structure 20 and the first light reflecting layer 41.

14 Claims, 39 Drawing Sheets

(51) Int. Cl.
*H01S 5/20* (2006.01)
*H01S 5/22* (2006.01)
*H01S 5/343* (2006.01)
*H01S 5/042* (2006.01)

(52) U.S. Cl.
CPC ........ *H01S 5/18369* (2013.01); *H01S 5/2022* (2013.01); *H01S 5/2219* (2013.01); *H01S 5/34333* (2013.01); *H01S 5/04253* (2019.08); *H01S 5/04256* (2019.08); *H01S 2301/176* (2013.01); *H01S 2304/12* (2013.01)

(56) References Cited

U.S. PATENT DOCUMENTS

| | | | |
|---|---|---|---|
| 6,611,003 B1 | 8/2003 | Hatakoshi et al. | |
| 11,611,196 B2 * | 3/2023 | Hamaguchi | H01S 5/34333 |
| 2002/0075921 A1 * | 6/2002 | Kitatani | H01S 5/18341 |
| | | | 372/45.01 |
| 2002/0105988 A1 | 8/2002 | Park et al. | |
| 2011/0150023 A1 | 6/2011 | Higuchi | |
| 2014/0126600 A1 | 5/2014 | Kawashima | |
| 2015/0043606 A1 * | 2/2015 | Hamaguchi | H01S 5/18391 |
| | | | 438/29 |
| 2016/0072258 A1 | 3/2016 | Seurin | |
| 2017/0201073 A1 | 7/2017 | Futagawa et al. | |
| 2017/0353004 A1 * | 12/2017 | Chen | H01S 5/02234 |

FOREIGN PATENT DOCUMENTS

| | | |
|---|---|---|
| JP | H10-200200 A | 7/1998 |
| JP | H10-308558 A | 11/1998 |
| JP | 2000-022277 A | 1/2000 |
| JP | 2002-237653 A | 8/2002 |
| JP | 2006-114753 A | 4/2006 |
| JP | 2009-164466 A | 7/2009 |
| JP | 2009-200318 A | 9/2009 |
| JP | 2011-151364 A | 8/2011 |
| JP | 2012-253351 A | 12/2012 |
| JP | 2013-197377 A | 9/2013 |
| JP | 2014-086565 A | 5/2014 |
| JP | 2014-112654 A | 6/2014 |
| JP | 2016-015416 A | 1/2016 |
| JP | 2016-021516 A | 2/2016 |
| JP | 2016027648 A | 2/2016 |
| WO | 2015/194243 A1 | 12/2015 |

OTHER PUBLICATIONS

Tien-Chang Lu, Continuous wave operation of ucrrent injected GaN vertical cavity surface emitting lasers at room temperature, Appl. Phys. Lett. 97, 071114 (2010).

Tatsushi Hamaguchi, Milliwatt-class GaN-based blue vertical-cavity surface-emitting lasers fabricated by epitaxial lateral overgrowth, Phys, Status Solidi A, 1-7 (2016).

\* cited by examiner

LIGHT EMITTING ELEMENT

CROSS-REFERENCE TO RELATED APPLICATIONS

The present application is a continuation of U.S. patent application Ser. No. 16/471,428, filed on Jun. 19, 2019, which is a national stage of International Application No. PCT/JP2017/037234, filed Oct. 13, 2017 and claims priority to Japanese Application No. 2016-246654, filed Dec. 20, 2016, the disclosures of which are incorporated herein by reference.

BACKGROUND

The present disclosure relates to a light emitting element.

In a light emitting element including a surface emitting laser element (VCSEL), laser oscillation generally occurs when laser light is caused to produce resonance between two light reflecting layers (Distributed Bragg Reflector layers, i.e., DBR layers). In such a light emitting element, for example, a first light reflecting layer including a plurality of thin films laminated to each other is formed on the exposed surface of a substrate, and a laminated structure in which a first compound semiconductor layer, a light emitting layer (active layer) including a compound semiconductor, and a second compound semiconductor layer are laminated to each other is formed using a method such as an ELO (Epitaxial Lateral Overgrowth) method for achieving epitaxial growth in a lateral direction over the first light reflecting layer from above the exposed surface of the substrate where the first light reflecting layer is not formed (see, for example, T. Hamaguchi, et al., "Milliwatt-class GaN-based blue vertical-cavity surface-emitting lasers fabricated by epitaxial lateral overgrowth", Phys. Status Solidi A, 1-7 (2016)/DOI 10.1002/pssa.201532759). Then, a second electrode made of a transparent conductive material is formed on the second compound semiconductor layer, and a second light reflecting layer including the laminated structure of thin films is formed on the second electrode. Alternatively, after the laminated structure, the second electrode, and the second light reflecting layer are formed on the substrate, the substrate is removed on the basis of, for example, a CMP method (Chemical Machine Polishing method) and then the first light reflecting layer including the plurality of thin films laminated to each other is formed on the exposed first compound semiconductor layer (see, for example, Japanese Patent Application Laid-open No. 2011-151364). Alternatively, the first light reflecting layer including the thin films of a plurality of compound semiconductors laminated to each other is formed on the substrate on the basis of the epitaxial growth method, and the laminated structure, the second electrode, and the second light reflecting layer are further formed on the first light reflecting layer (see, for example, Tien-Chang Lu, et al., "Continuous wave operation of current injected GaN vertical cavity surface emitting lasers at room temperature", Appl. Phys. Lett. 97, 071114 (2010); doi: 10.1063/1.3483133).

SUMMARY

Technical Problem

Meanwhile, even with any of these methods, it may be difficult to favorably maintain the state of the interface between the first light reflecting layer and the laminated structure when the first light reflecting layer or the laminated structure is formed. Then, if the state of the interface cannot be favorably maintained, the absorption or scattering of light generated in a light emitting layer (active layer), i.e., optical loss is caused. As a result, there are possibilities of an increase in the threshold of the light emitting element, a reduction in light emission efficiency, and a reduction in the quality of emitted light.

Accordingly, the present disclosure has an object of providing a light emitting element having a configuration and a structure that hardly cause optical loss at the interface between a first light reflecting layer and a laminated structure.

Solution to Problem

In order to achieve the above object, the light emitting element of the present disclosure includes
  a first light reflecting layer, a laminated structure, and a second light reflecting layer laminated to each other, wherein
  the laminated structure includes a first compound semiconductor layer, a light emitting layer, and a second compound semiconductor layer laminated to each other from a side of the first light reflecting layer,
  light from the laminated structure is emitted to an outside via the first light reflecting layer or the second light reflecting layer,
  the first light reflecting layer has a structure in which at least two types of thin films are alternately laminated to each other in plural numbers, and
  a film thickness modulating layer is provided between the laminated structure and the first light reflecting layer.

Advantageous Effects of Invention

Since a film thickness modulating layer is provided between a laminated structure and a first light reflecting layer in the light emitting element of the present disclosure, optical loss is hardly caused in the region of the first light reflecting layer facing the laminated structure or in the region of the laminated structure facing the first light reflecting layer. Therefore, the occurrence of problems such as an increase in the threshold of the light emitting element, a reduction in light emitting efficiency, and a reduction in the quality of emitted light can be reliably avoided. Note that effects described in the present specification are given only for exemplification and not limitative, and additional effects may be produced.

Figure 28:
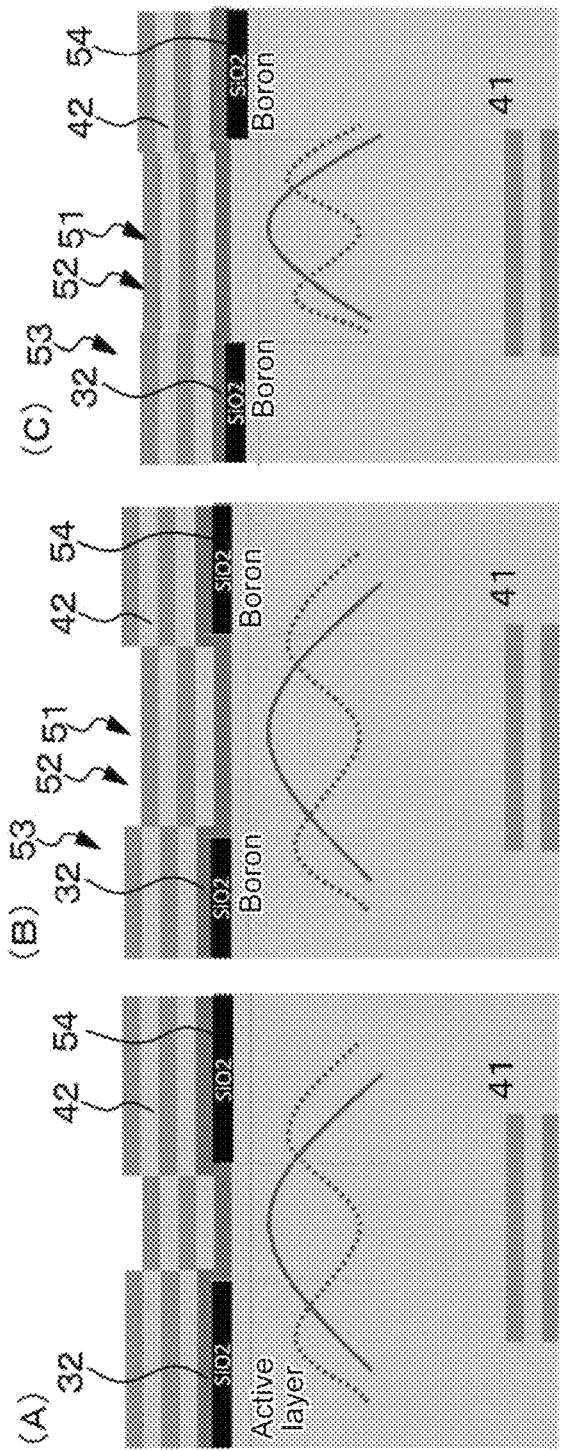

(A) to (C) of FIG. 28 are a conceptual diagram showing optical field intensity in a conventional light emitting element, a conceptual diagram showing optical field intensity in the light emitting element of the twelfth embodiment, and a conceptual diagram showing optical field intensity in the light emitting element of a fifteenth embodiment, respectively.

Figure 29:
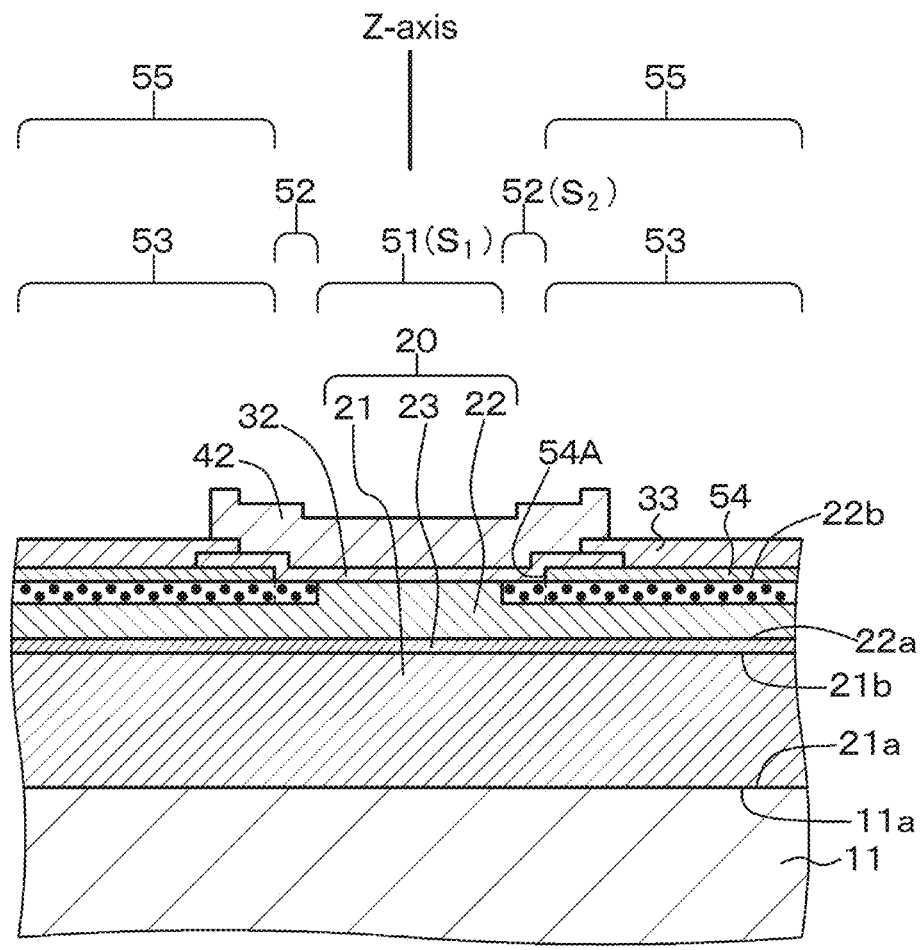

FIG. 29 is a schematic partial end view of the light emitting element of a thirteenth embodiment.

Figure 30:
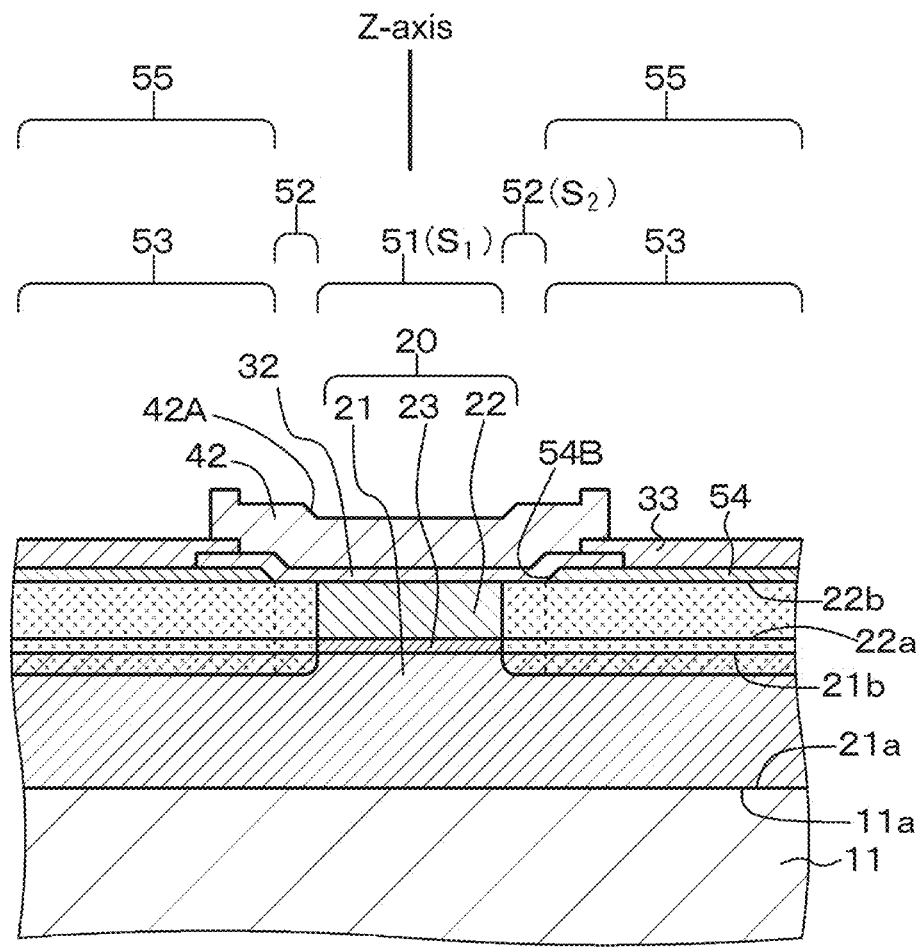

FIG. 30 is a schematic partial end view of the light emitting element of a fourteenth embodiment.

Figure 31:
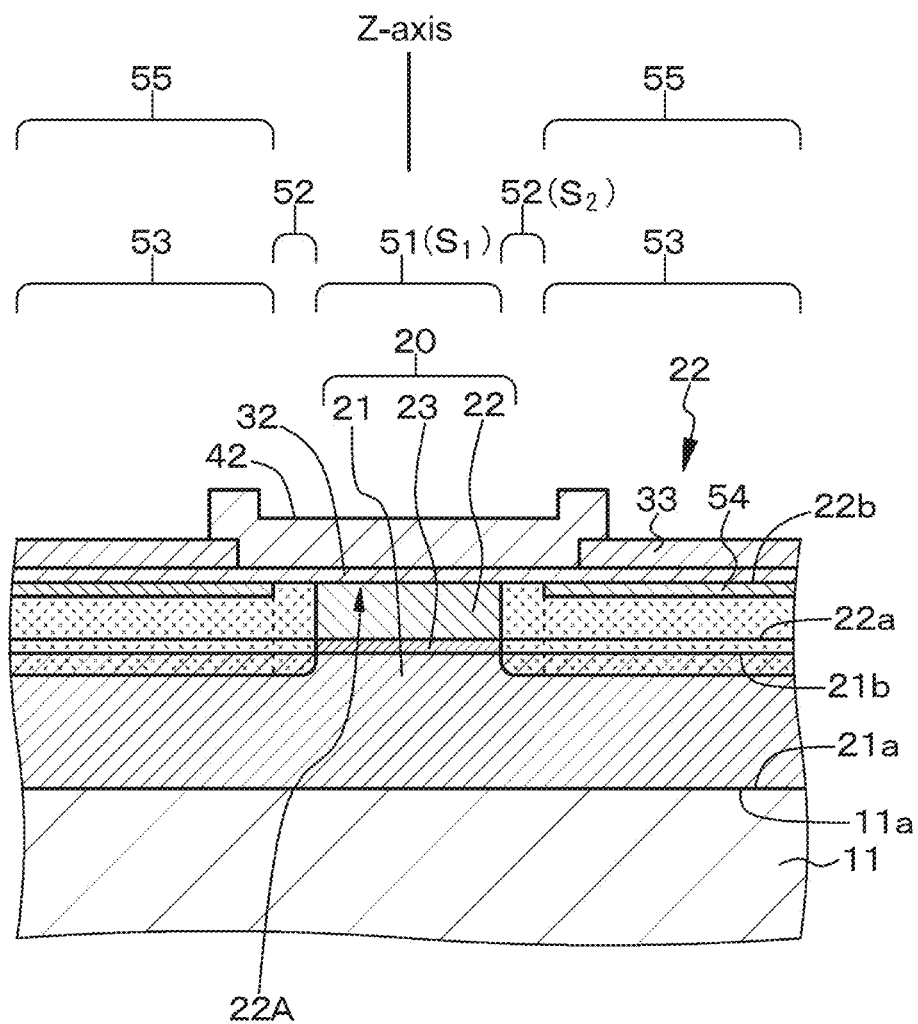

FIG. 31 is a schematic partial end view of the light emitting element of a fifteenth embodiment.

Figure 32:
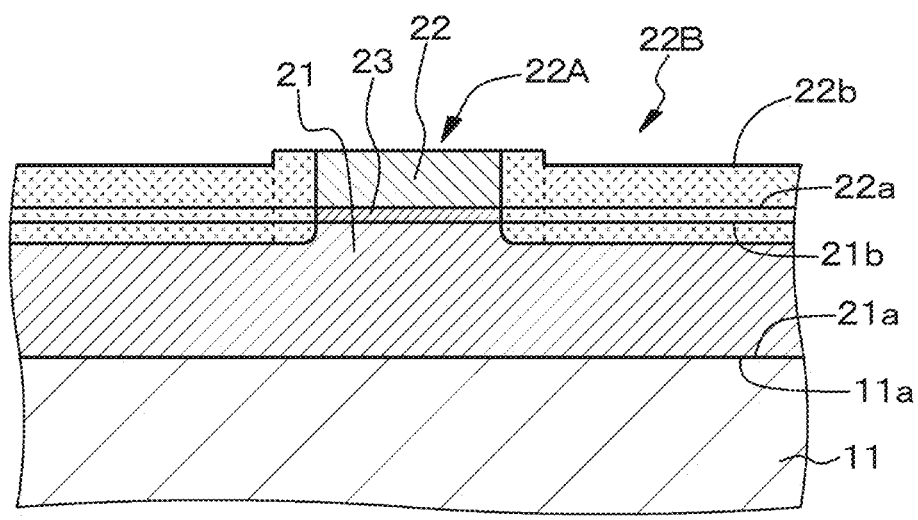

FIG. 32 is a schematic partial cross-sectional view in which the essential parts of the light emitting element of the fifteenth embodiment shown in FIG. 31 are cut out.

Figure 33:
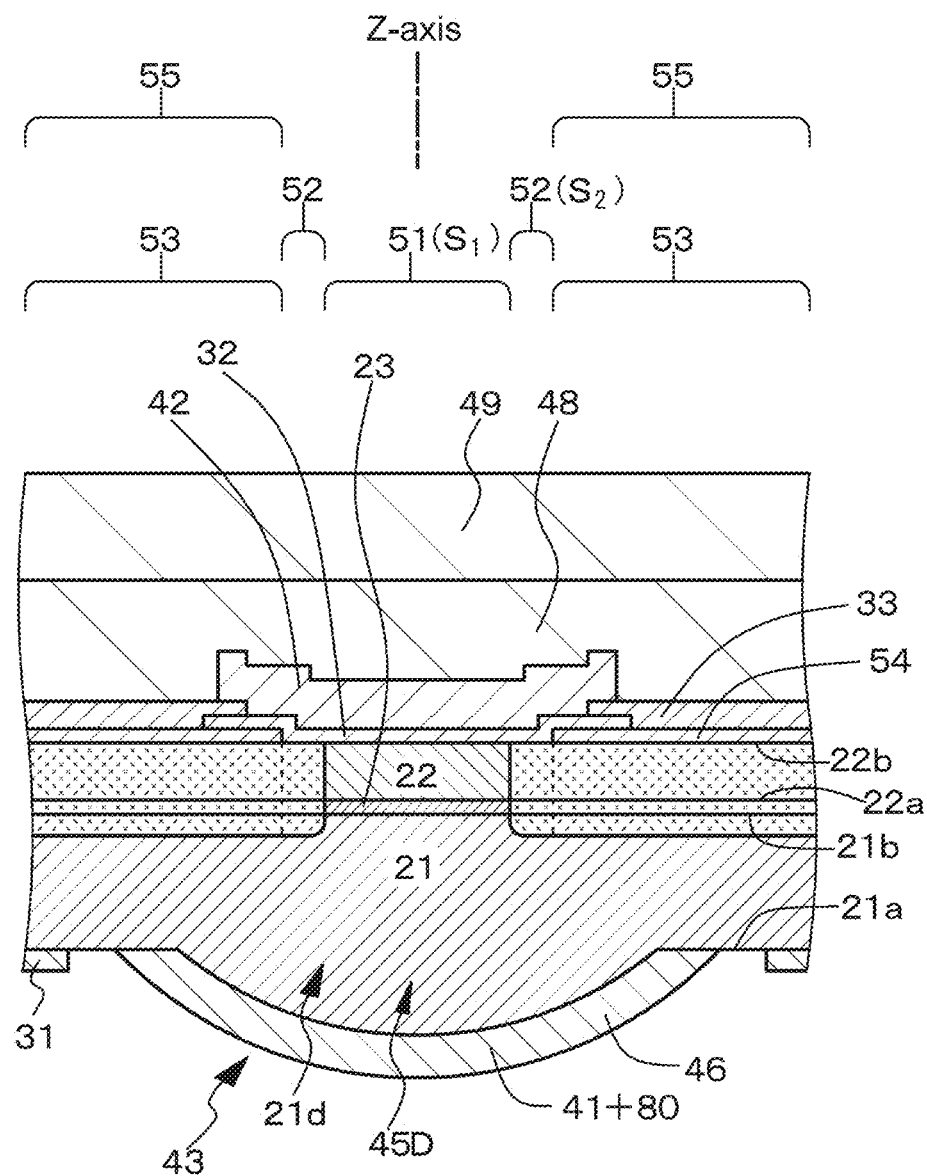

FIG. 33 is a schematic partial end view of the light emitting element of a sixteenth embodiment.

Figure 34:
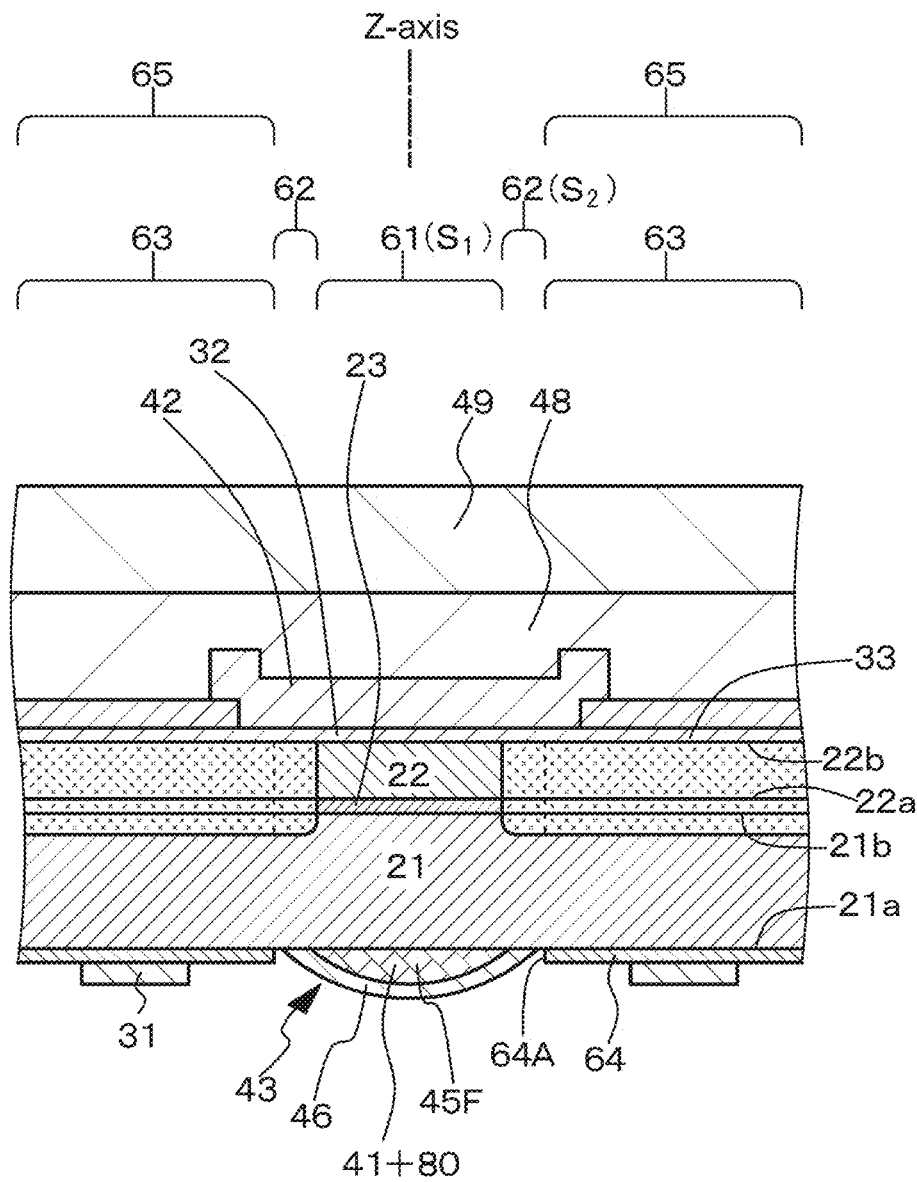

FIG. 34 is a schematic partial end view of the light emitting element of a seventeenth embodiment.

Figure 35:
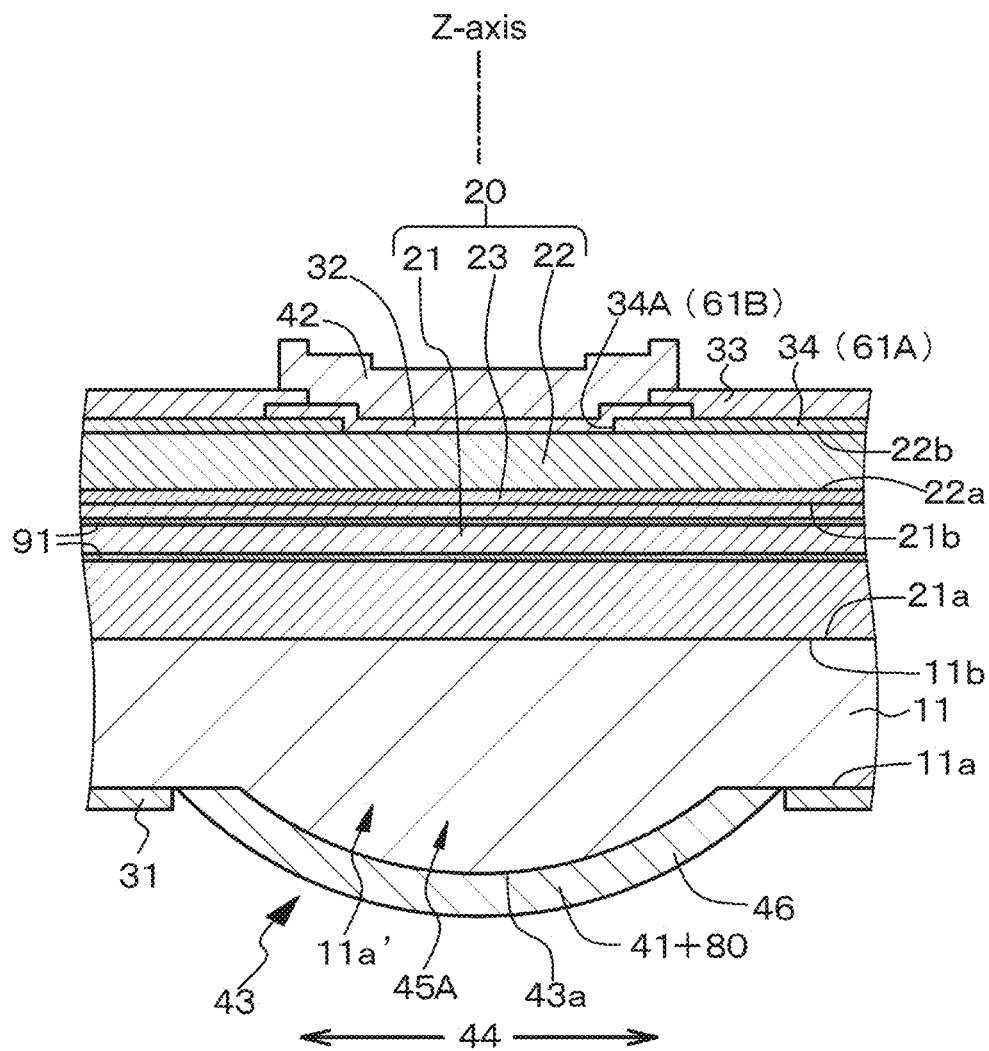

FIG. 35 is a schematic partial end view of the light emitting element of an eighteenth embodiment.

Figure 36:
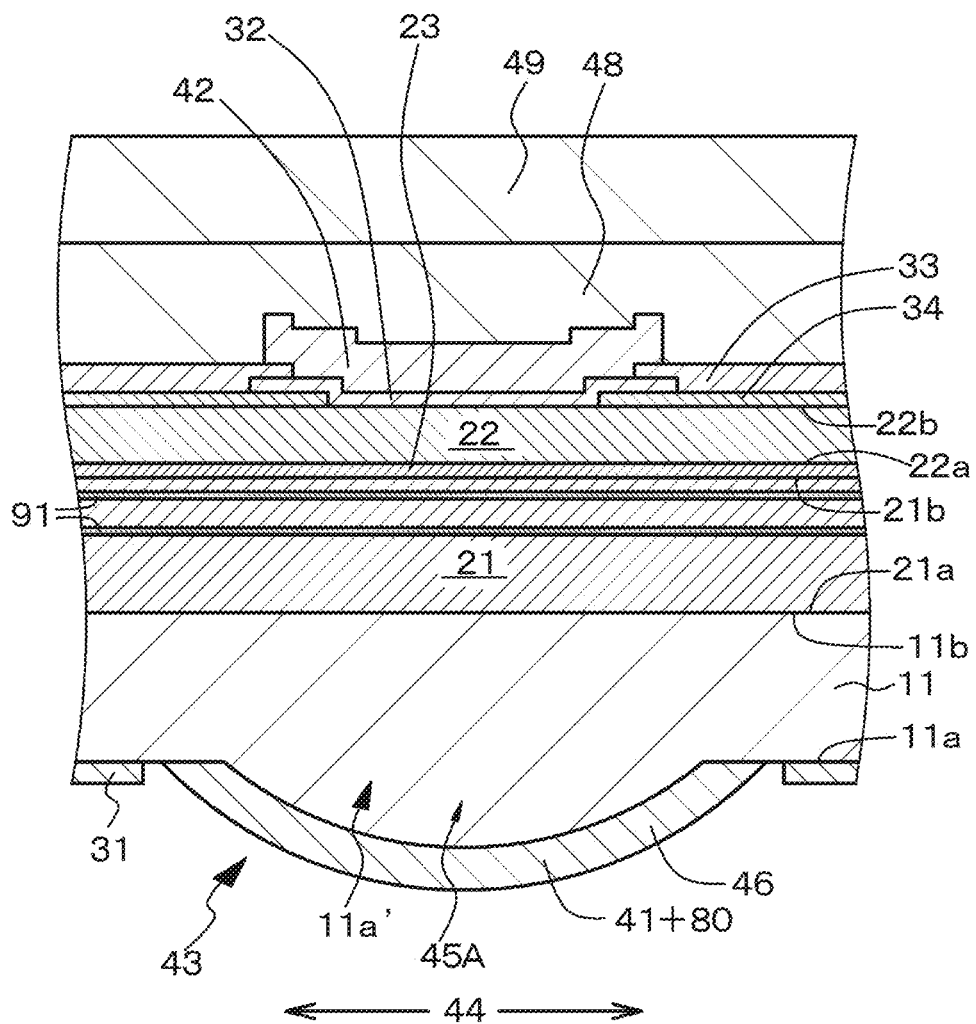

FIG. 36 is a schematic partial end view of the light emitting element of a modified example of the eighteenth embodiment.

Figure 37:
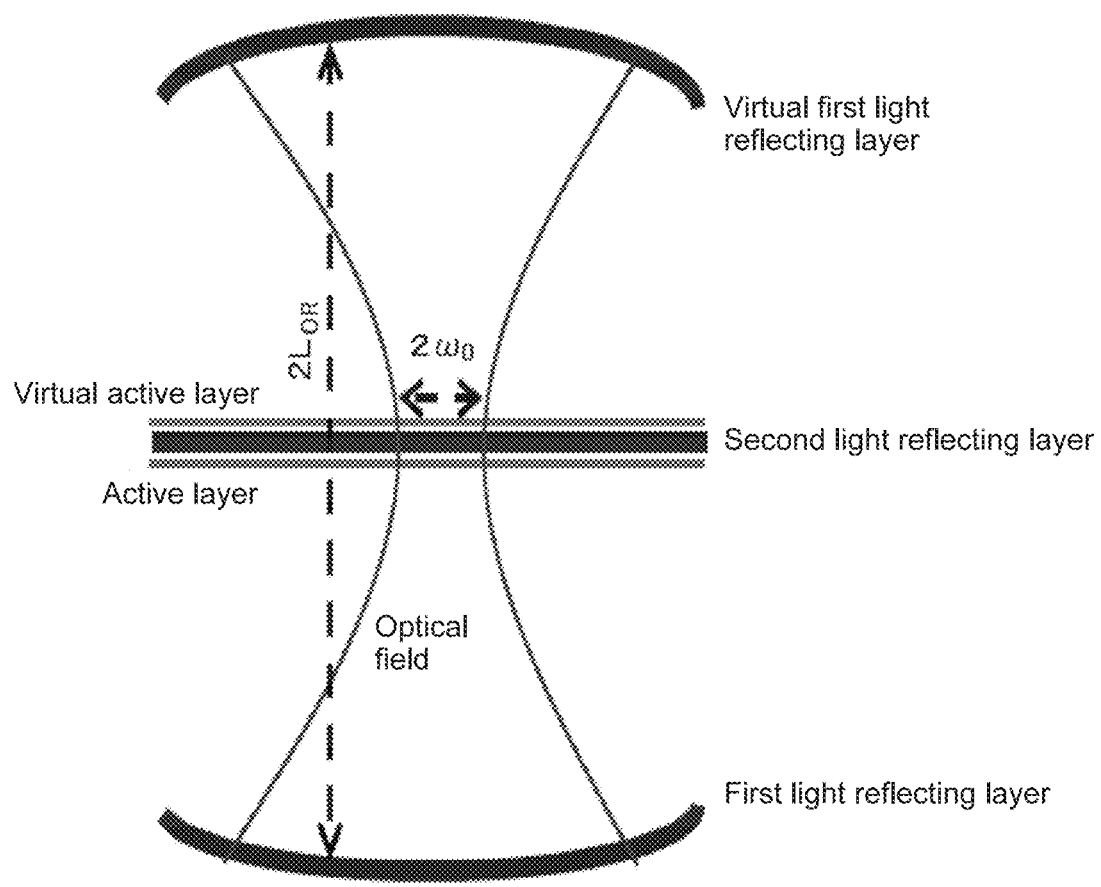

FIG. 37 is a conceptual diagram assuming a Fabry-Perot type resonator held by two concave mirror parts having the same curvature radius in the light emitting element of the eleventh embodiment.

Figure 38:
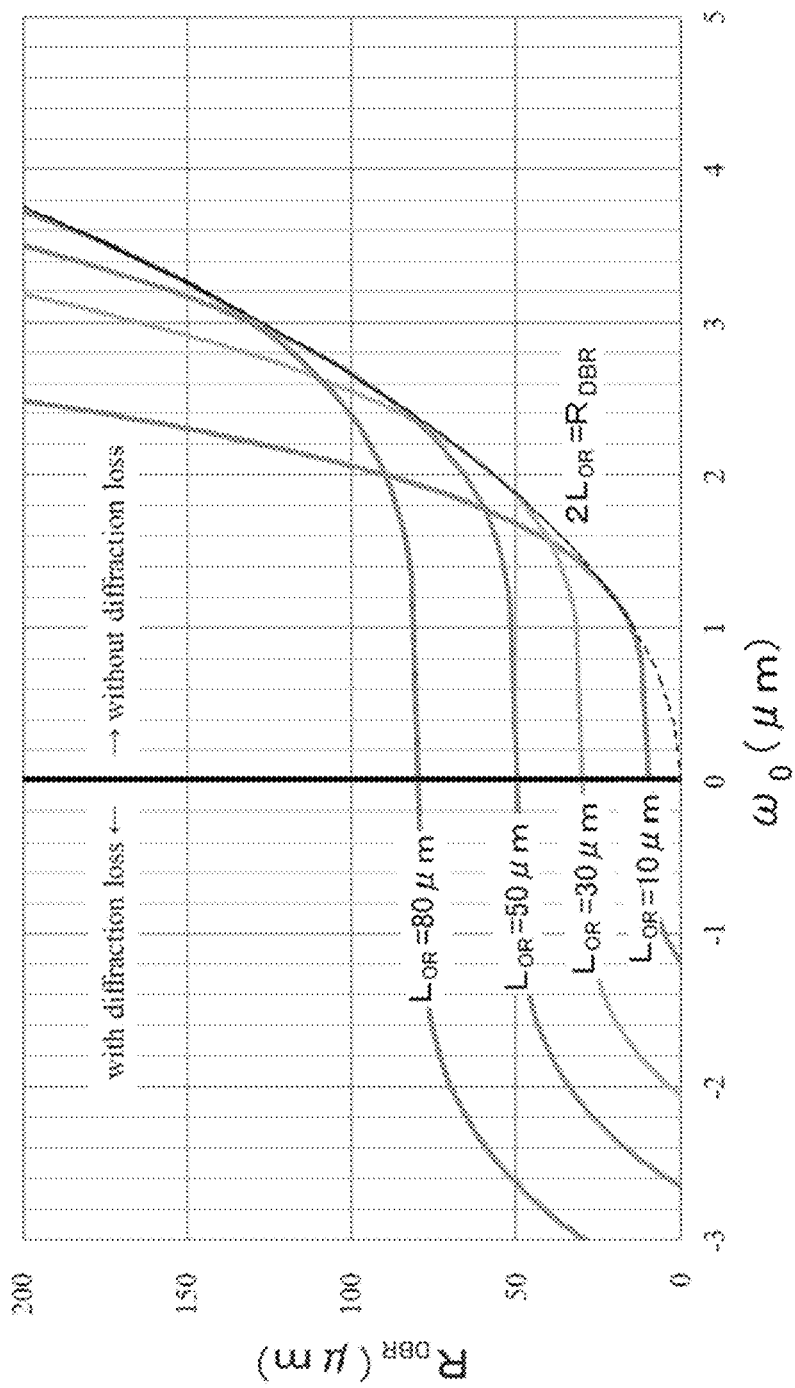

FIG. 38 is a graph showing the relationship between the value of $\omega_0$, the value of a resonator length $L_{OR}$, and the value of a curvature radius $R_{DBR}$ of a concave mirror part such as the first light reflecting layer.

Figure 39:
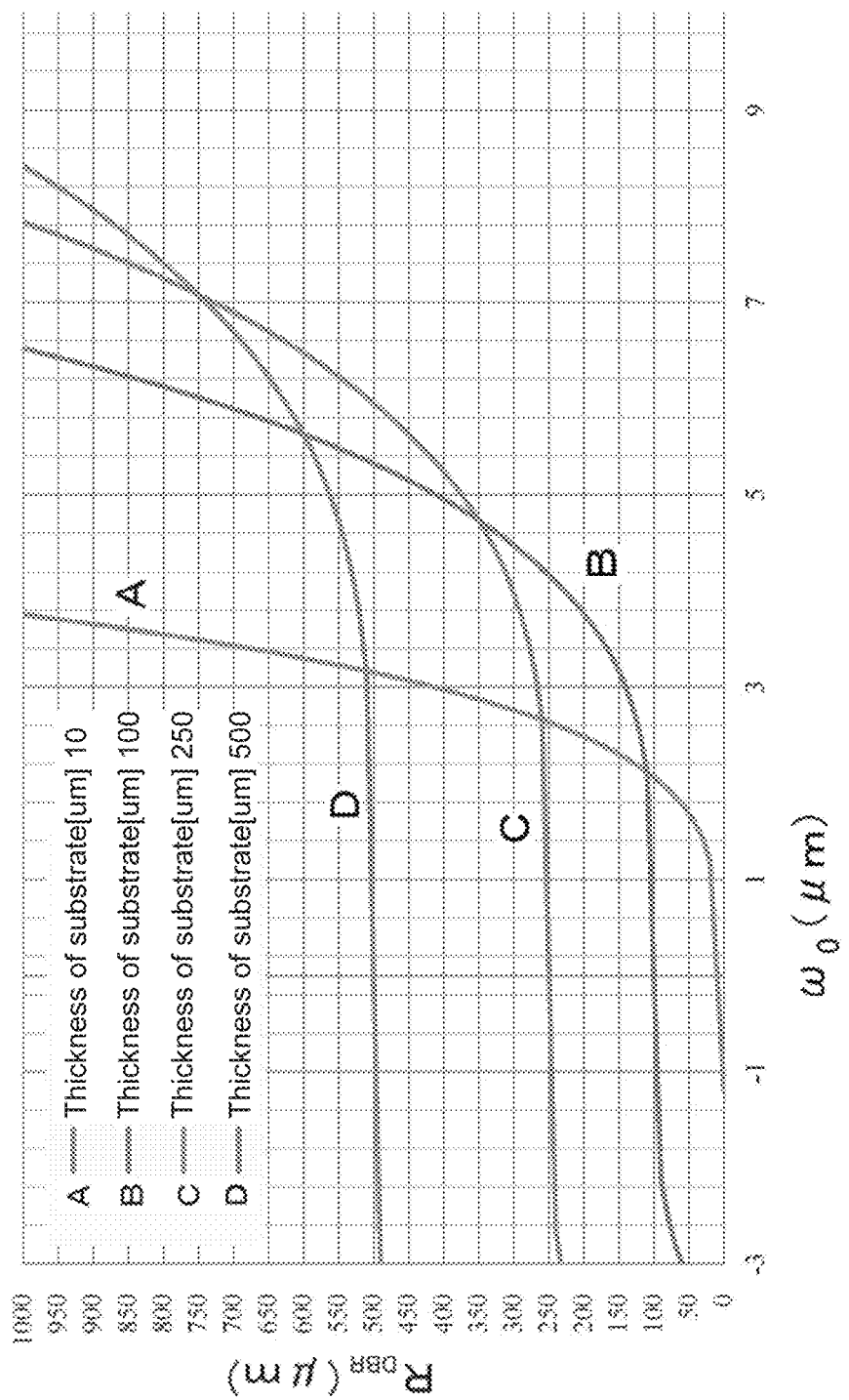

FIG. 39 is a graph showing the relationship between the value of $\omega_0$, the value of the resonator length $L_{OR}$, and the value of the curvature radius $R_{DBR}$ of the concave mirror part such as the first light reflecting layer.

DETAILED DESCRIPTION

Hereinafter, a description will be given, with reference to the drawings, of the present disclosure on the basis of embodiments. However, the present disclosure is not limited to the embodiments, and various numerical values or materials in the embodiments are given only for exemplification. Note that the description will be given in the following order.
1. Description of General Light Emitting Element of Present Disclosure
2. First Embodiment (Light Emitting Element of Present Disclosure)
3. Second Embodiment (Modification of First Embodiment)
4. Third Embodiment (Another Modification of First Embodiment)
5. Fourth Embodiment (Modification of First to Third Embodiments, Light Emitting Element Including Light Absorbing Material Layers)
6. Fifth Embodiment (Modification of Fourth Embodiment)
7. Sixth Embodiment (Another Modification of Fourth Embodiment)
8. Seventh Embodiment (Modification of First to Sixth Embodiments, Light Emitting Element Having Concave Mirror Part, Light Emitting Element Having Fifth-A Configuration)
9. Eighth Embodiment (Modification of Seventh Embodiment, Light Emitting Element Having Fifth-B Configuration)
10. Ninth Embodiment (Modification of Seventh and Eighth Embodiments, Light Emitting Element Having Sixth Configuration)
11. Tenth Embodiment (Modification of Ninth Embodiment)
12. Eleventh Embodiment (Modification of Seventh to Tenth Embodiments, Light Emitting Element Having First Configuration)
13. Twelfth Embodiment (Modification of Seventh to Eleventh Embodiments, Light Emitting Element Having Second-A Configuration)
14. Thirteenth Embodiment (Modification of Twelfth Embodiment, Light Emitting Element Having Second-B Configuration)
15. Fourteenth Embodiment (Modification of Twelfth and Thirteenth Embodiments, Light Emitting Element Having Second-C Configuration)
16. Fifteenth Embodiment (Modification of Twelfth to Fourteenth Embodiments, Light Emitting Element Having Second-D Configuration)
17. Sixteenth Embodiment (Modification of Twelfth to Fifteenth Embodiments)
18. Seventeenth Embodiment (Modification of Seventh to Eleventh Embodiments, Light Emitting Element Having Third-A Configuration, Light Emitting Element Having Third-B Configuration, Light Emitting Element Having Third-C Configuration, and Light Emitting Element Having Third-D Configuration)
19. Eighteenth Embodiment (Modification of Seventh to Seventeenth Embodiments, Light Emitting Element Having Fourth Configuration)
20. Other <Description of General Light Emitting Element of Present Disclosure>

In the light emitting element of the present disclosure, a first light reflecting layer can have a structure in which first thin films having an optical thickness of $t_1$ and second thin films having an optical film thickness of $t_2$ (where $t_2 \neq t_1$) are alternately laminated to each other in plural numbers, and a film thickness modulating layer can be constituted by at least one layer of a third thin film having an optical film thickness of $t_3$ (where $t_3 \neq t_1$). Further, in this case, it is desirable to satisfy $t_3/t_1 \geq 1.1$ and preferably $1.9 \geq t_3/t_1 \geq 1.1$ as a film thickness modulating degree. Alternatively, it is desirable to satisfy $t_3/t_1 \leq 0.9$ and preferably $0.1 \leq t_3/t_1 \leq 0.9$ as such.

Here, an optical film thickness is expressed by $n_0 \times t_{phys}$ when the physical thickness of a thin film is $t_{phys}$ and the refractive index of a material constituting the thin film at the oscillating wavelength (light emitting wavelength) $\lambda_0$ of the light emitting element is no. The value of the refractive index no changes when the material constituting the thin film is changed. However, even if the material constituting the thin film remains the same (for example, although an element constituting the thin film remains the same), it is possible to change the value of the refractive index no by changing a composition or is possible to change the value of the refractive index no by adding impurities or the like to the material constituting the thin film. Materials having different refractive indexes no like this will be called "materials different from each other" in the present application.

Further, in the above various preferred modes, the first thin film can be made of a first material, and the second thin film can be made of a second material different from the first material.

In addition, in the preferred modes described above, the film thickness modulating layer can have a structure in which third thin films and fourth thin films having an optical film thickness of $t_4$ are laminated to each other. Further, in this case, the film thickness modulating layer has a structure in which the third thin films and the fourth thin films are alternately laminated to each other in plural numbers. The optical film thickness of at least one layer among the third thin films can satisfy $t_3 \neq t_1$. In addition, in this case, the optical film thickness of at least one layer among the fourth thin films can satisfy $t_4 \neq t_2$. In addition, in this case, the third thin film satisfying $t_3 \neq t_1$ or the fourth thin film satisfying $t_4 \neq t_2$ can contact the first light reflecting layer. In addition, in these modes, the third thin film other than the third thin film satisfying $t_3 \neq t_1$ can satisfy $t_3 = t_1$, and the fourth thin film other than the fourth thin film satisfying $t_4 \neq t_2$ can satisfy $t_4 = t_2$. In addition, in these modes, the total number of the third thin films and the fourth thin films can be five or less. In addition, in these modes, the third thin films can be made of the first material, and the fourth thin films can be made of the second material.

In the light emitting element of the present disclosure including the preferred modes described above, the first light reflecting layer can be formed on a substrate. In this case, a laminated structure can be formed on the region of the substrate where the first light reflecting layer is not formed.

Alternatively, in the preferred modes described above, the first light reflecting layer can be formed on the exposed surface of the laminated structure.

Alternatively, in the preferred modes described above, the first material can be made of a compound semiconductor material, and the second material can also be made of a compound semiconductor material. In the preferred modes and configurations described above, the first material can be made of a dielectric material, and the second material can also be made of a dielectric material. However, a material constituting the film thickness modulating layer may be different from materials constituting a first compound semiconductor layer, a light emitting layer, and a second compound semiconductor layer.

In addition, in the light emitting element of the present disclosure including the preferred modes and configurations described above, the first light reflecting layer can have a concave mirror part, and the second light reflecting layer can have a flat shape.

In addition, in the light emitting element of the present disclosure including the preferred modes and configurations described above, the first compound semiconductor layer can have a thickness larger than the thickness of the second compound semiconductor layer.

In addition, in the light emitting element of the present disclosure including the preferred modes and configurations described above, the laminated structure can be made of a GaN-based compound semiconductor.

In addition, in the light emitting element of the present disclosure including the preferred modes and configurations described above, irregularity structures (such as, for example, fine irregularities, point defects, line defects, and pores) may exist at the interface between the film thickness modulating layer and the first light reflecting layer or may exist in the vicinity of the interface. Here, the irregularity structures may be formed in the film thickness modulating layer, may be formed in the first light reflecting layer, or may be formed to extend over the film thickness modulating layer and the first light reflecting layer. Note that the above three cases will be collectively expressed as "the formation of the irregularity structures at the interface between the film thickness modulating layer and the first light reflecting layer." Specifically, in the light emitting element of the present disclosure including the preferred modes and configurations described above, irregularities can be formed at the interface between the laminated structure and the film thickness modulating layer and have a root-mean-square roughness Rq of 1 nm or more as surface roughness. Note that the upper limit value of the root-mean-square roughness Rq is not limited but can include 10 nm. Alternatively, in the light emitting element of the present disclosure including the preferred modes and configurations described above, point defects can be formed at the interface between the laminated structure and the film thickness modulating layer and have a density of $1\times10^{17}/cm^3$ or more. Note that the upper limit value of point defects is not limited but can include $1\times10^{19}/cm^3$. Alternatively, in the light emitting element of the present disclosure including the preferred modes and configurations described above, line defects can be formed at the interface between the laminated structure and the film thickness modulating layer and have a density of $1\times10^6/cm^3$ or more. Note that the upper limit value of the density of the line defects is not limited but can include $1\times10^{11}/cm^3$. Alternatively, in the light emitting element of the present disclosure including the preferred modes and configurations described above, pores can be formed at the interface between the laminated structure and the film thickness modulating layer and have a thickness [maximum pore thickness] (the maximum separated distance between the laminated structure and the film thickness modulating layer) of 10 nm or less. Note that the lower limit value of the thickness [maximum pore thickness] of the pores is not limited but can include 0.2 nm. As the structure of the pores, a structure in which gas or a liquid is filled in the pores can be exemplified.

In the following description, the surface of the first compound semiconductor layer that faces the light emitting layer (active layer) will be called a second surface, and the surface thereof that faces the second surface will be called a first surface. Further, the surface of the second compound semiconductor layer that faces the light emitting layer will be called a first surface, and the surface thereof that faces the first surface will be called a second surface. The surface of a light emitting manufacturing substrate (that will be described later) that faces the first compound semiconductor layer will be called a second surface, and the surface thereof that faces the second surface will be called a first surface.

By the light emitting element of the present disclosure including the preferred modes and configurations described above, a surface emitting laser element (vertical cavity surface emitting laser, VCSEL) that emits laser light via the first light reflecting layer or a surface emitting laser element that emits laser light via the second light reflecting layer can be constituted. Note that the light emitting manufacturing substrate that will be described later may be removed in some cases depending on the configurations and structures of the light emitting element.

As described above, light reflecting layers (Distributed Bragg Reflector Layers, DBR layers) constituting the first light reflecting layer and the second light reflecting layer are constituted by, for example, compound semiconductor material multilayer films or dielectric material multilayer films. As compound semiconductor materials, GaN, AlInN, and AlGaN can be exemplified. As dielectric materials, an oxide such as Si, Mg, Al, Hf, Nb, Zr, Sc, Ta, Ga, Zn, Y, B, and Ti, a nitride (such as, for example, $SiN_x$, $AlN_x$, $AlGaN_x$, $GaN_x$, and $BN_x$), a fluoride, or the like can be exemplified. Specifically, $SiO_x$, $TiO_x$, $NbO_x$, $ZrO_x$, $TaO_x$, $ZnO_x$, $AlO_x$, $HfO_x$, $SiN_x$, $AlN_x$, or the like can be exemplified. Then, among the compound semiconductor materials and the dielectric materials, two types or more of compound semiconductor material films and dielectric material films made of compound semiconductor materials and dielectric materials having different refractive indexes are alternately laminated to each other, whereby the light reflecting layers can be obtained. For example, the multilayer films of as GaN/AlInN, $SiO_x/SiN_y$, $SiO_x/TaO_x$, $SiO_x/NbO_y$, $SiO_x/ZrO_y$, $SiO_x/AlN_y$, or the like are preferable. In order to obtain desired light reflectance, materials, film thicknesses, the number of laminated layers, or like constituting the respective compound semiconductor material films and dielectric material films may only be appropriately selected. The thicknesses (optical film thicknesses) of the respective compound semiconductor material films and the dielectric material films can be appropriately adjusted according to used materials or the like, and are determined on the basis of an oscillating wavelength (light emitting wavelength) $\lambda_0$ and refractive indexes n at the oscillating wavelengths $\lambda_0$ of the used materials. Specifically, the film thicknesses are preferably an odd multiple of $\lambda_0/(4n)$. For example, when the light reflecting layers are made of $SiO_x/Nbo_y$ in the light emitting element having an oscillating wavelength $\lambda_0$ of 410 nm, about 40 nm to 70 nm can be exemplified. As the number of laminated layers, two or more and preferably about 10 to 30 can be exemplified. As the entire thicknesses of the light reflecting layers, about 0.6 μm to 1.7 μm can be exemplified. Further, the light reflectance of the light reflecting layers are desirably 95% or more.

The light reflecting layers constituted by the dielectric material multilayer films can be formed on the basis of a known method. Specifically, examples of the method can include: a PVD method such as a vacuum vapor deposition method, a sputtering method, a reactive sputtering method, an ECR plasma sputtering method, a magnetron sputtering method, an ion beam assist vapor deposition method, an ion plating method, and a laser ablation method; various CVD methods; a coating method such as a spray method, a spin coat method, and a dip method; a method in which two or more of the above methods are combined together; and a method in which the above methods and any one of entire or partial pretreatment, irradiation of an inert gas (such as Ar, He, and Xe) or plasma, irradiation of an oxygen gas, an ozon gas, and plasma, oxidation treatment (heat treatment), and exposure treatment are combined together. The light reflecting layers constituted by the compound semiconductor material multilayer films can also be formed on the basis of a known method. Specifically, examples of the method can include a method for forming various compound semiconductor layers that will be described later.

The sizes and shapes of the light reflecting layers are not particularly limited so long as the light reflecting layers cover an element region (current injecting region). Specifically, examples of the shape of the boundary between the current injecting region and a current non-injecting inside region, the shape of the boundary between the current non-injecting inside region and a current non-injecting outside region, the plane shape of an opening part provided in the element region or a current constricting region, and the plane shape of an opening provided in the first light reflecting layer, the second light reflecting layer, and the current constricting region can include a circular shape, an elliptical shape, a rectangular shape, and a polygonal shape (such as a triangular shape, a square shape, and a hexagonal shape). Further, examples of the plane shape of a first electrode can include an annular shape. The shape of the boundary between the current injecting region and the current non-injecting inside region, the shape of the boundary between the current non-injecting inside region and the current non-injecting outside region, the plane shape of the opening provided in the element region, the first light reflecting layer, the second light reflecting layer, and the current constricting layer, and the plane shape of the inside annular part of the annular first electrode are desirably similar to each other. When the plane shapes are circular shapes, the plane shapes preferably have a diameter of about 5 μm to 100 μm. Note that the "element region (current injecting region)" represents a region in which a constricted current is injected, a region in which light is confined due to a difference in refractive index or the like, a region in which laser oscillation occurs inside a region held between the first light reflecting layer and the second light reflecting layer, or a region actually contributing to laser oscillation inside the region held between the first light reflecting layer and the second light reflecting layer. The element region (current injecting region) is surrounded by the current non-injecting region, and the current constricting region is defined by the element region (current injecting region) and the current non-injecting region.

In order to obtain the current constricting region, an insulating layer (current constricting layer) made of an insulating material (for example, $SiO_x$, $SiN_x$, or $AlO_x$) may be formed between the second electrode and the second compound semiconductor layer, the second compound semiconductor layer may be etched by a RIE method or the like to form a mesa structure, a part of the laminated second compound semiconductor layer may be partially oxidized from a lateral direction to form the current constricting region, impurities may be ion-implanted into the second compound semiconductor layer to form a region having reduced conductivity, or the above methods may be appropriately combined together. However, the second electrode is required to be electrically connected to the portion of the second compound semiconductor layer through which a current flows with current constriction.

In the light emitting element of the present disclosure, the laminated structure can specifically include an AlInGaN-based compound semiconductor. Here, more specifically, examples of the AlInGaN-based compound semiconductor can include GaN, AlGaN, InGaN, and AlInGaN. In addition, these compound semiconductors may contain a boron (B) atom, a thallium (Tl) atom, an arsenic (As) atom, a phosphorous (P) atom, and a stibium (Sb) atom as required. The light emitting layer desirably has a quantum well structure. Specifically, the light emitting layer may have a single quantum well structure (SQW structure) or a multiple quantum well structure (MQW structure). The light emitting layer having the quantum well structure has a structure in which at least one layer of a well layer and a barrier layer is laminated. As the combinations of (compound semiconductors constituting the well layer and compound semiconductors constituting the barrier layer), $(In_yGa_{(1-y)}N, GaN)$, $(In_yGa_{(1-y)}N, In_yGa_{(1-z)}N)$ [where $y>z$], $(In_yGa_{(1-y)}N, Al_xGa_{1-x}N)$, and $(GaN, Al_xGa_{1-x}N)$ can be exemplified. The first compound semiconductor layer can be constituted by a compound semiconductor having a first conductivity type (for example, an n-type), and the second compound semiconductor layer can be constituted by a compound semiconductor having a second conductivity type (for example, a p-type) different from the first conductivity type. The first compound semiconductor layer and the second compound semiconductor layer are also called a first clad layer and a second clad layer, respectively. The first compound semiconductor layer and the second compound semiconductor layer may be layers having a single structure, layers having a multilayer structure, or layers having a super-lattice structure. In addition, the first compound semiconductor layer and the second compound semiconductor layer can also be layers including a composition gradient layer and a concentration gradient layer.

Examples of a method for forming various compound semiconductor layers constituting the light emitting element can include, but are not limited to, a MOCVD method (Metal Organic-Chemical Vapor Deposition method), a MOVPE method (Metal Organic-Vapor Phase Epitaxy method), a MBE method (Molecular Beam Epitaxy method), a HVPE method (Hydride Vapor Phase Epitaxy method) in which halogen contributes to transportation or reaction, an ALD method (Atomic Layer Deposition method), a MEE method (Migration-Enhanced Epitaxy method), and a PPD method (Plasma Assisted Physical Vapor Deposition method).

Here, examples of an organic gallium source gas in the MOCVD method can include a trimethyl gallium (TMG) gas and a triethyl gallium (TEG) gas, and examples of a nitrogen source gas can include an ammonia gas and a hydrazine gas. In the formation of a GaN-based compound semiconductor layer having n-type conductivity, silicon (Si) may only be, for example, added as an n-type impurity (n-type dopant). In the formation of a GaN-based compound semiconductor layer having p-type conductivity, magnesium (Mg) may only be, for example, added as a p-type impurity (p-type dopant). When aluminum (Al) or indium (In) is contained as a constituent atom of the GaN-based compound semiconductor layer, a trimethyl aluminum (TMA) gas may only be used as an Al source and a trimethyl indium (TMI) gas may only be used as an In source. In addition, a mono-silane gas ($SiH_4$ gas) may only be used as a Si source, and a bis-cyclopentadienyl magnesium gas, methylcyclopentadienyl magnesium, and bis-cyclopentadienyl magnesium ($Cp_2Mg$) may only be used as Mg sources. Note that examples of the n-type impurity (n-type dopant) can include Ge, Se, Sn, C, Te, S, O, Pd, and Po besides Si, and examples of the p-type impurity (p-type dopant) can include Zn, Cd, Be, Ca, Ba, C, Hg, Sr besides Mg.

The second semiconductor layer (the second surface of the second compound semiconductor layer) preferably has a surface roughness Ra of 1.0 nm or less. Surface roughness Ra or surface roughness Rq is stipulated in JIS B-610: 2001, and can be specifically measured on the basis of observation by an AFM or a cross-sectional TEM.

The light emitting element of the present disclosure includes the first electrode and the second electrode. The first electrode is electrically connected to the first compound semiconductor layer. Further, the second electrode is electrically connected to the second compound semiconductor layer. Specifically, the second electrode is formed on, for example, the second surface of the second compound semiconductor layer.

When the light emitting element manufacturing substrate is left, the first electrode may only be formed on the first surface of the light emitting element manufacturing substrate. Further, when the light emitting element manufacturing substrate is not left, the first electrode may only be formed on the first surface of the first compound semiconductor layer constituting the laminated structure. For example, when the first electrode is formed on the first surface of the first compound semiconductor layer, the first electrode may only be formed so as to surround the first light reflecting layer. The first electrode desirably has a single layer configuration or a multilayer configuration containing at least one type of metal (containing an alloy) selected from a group including, for example, gold (Au), silver (Ag), palladium (Pd), platinum (Pt), nickel (Ni), titanium (Ti), vanadium (V), tungsten (W), chrome (Cr), aluminum (Al), copper (Cu), zinc (Zn), tin (Sn), and indium (In). Specifically, Ti/Au, Ti/Al, Ti/Al/Au, Ti/Pt/Au, Ni/Au, Ni/Au/Pt, Ni/Pt, Pd/Pt, and Ag/Pd can be exemplified. Note that layers farther away from "/" in the multilayer configurations are positioned on a side closer to the light emitting layer. The same applies to the following description. The first electrode can be deposited by, for example, a PVD method such as a vacuum vapor deposition method and a sputtering method.

When the first electrode is formed so as to surround the first light reflecting layer, the first light reflecting layer and the first electrode can contact each other. Alternatively, the first light reflecting layer and the first electrode can be separated from each other. That is, the first light reflecting layer and the first electrode are arranged with an offset placed therebetween. The separated distance between the first light reflecting layer and the first electrode can be within 1 mm. When the element region (current injecting region) positioned inside the first light reflecting layer and the first electrode are planarly separated from each other, a current flows in the first compound semiconductor layer for a long distance. Therefore, in order to reduce electric resistance generated in the current path to a lower level, the separated distance is preferably within 1 mm. Depending on the circumstances, the first electrode can be formed over the edge part of the first light reflecting layer, or the first light reflecting layer can be formed over the edge part of the first electrode. Here, when the first light reflecting layer is formed over the edge part of the first electrode, the first electrode is required to have an opening with a certain size so as not to absorb the basic mode light of laser oscillation as much as possible. The size of the opening changes with the wavelength of a basic mode or a light confinement structure in a lateral direction (in-plane direction of the first compound semiconductor layer) and thus is not limited. However, the size of the opening is preferably about several times or more as large as an oscillating wavelength (light emitting wavelength) $\lambda_0$.

The second electrode can be made of a transparent conductive material. As the transparent conductive material constituting the second electrode, an indium-based transparent conductive material [specifically, for example, an indium-tin oxide (ITO including Sn-doped $In_2O_3$, crystalline ITO, and amorphous ITO), an indium-zinc oxide (IZO), an indium-gallium oxide (IGO), an indium-doped gallium-zinc oxide (IGZO, In—$GaZnO_4$), IFO (F-doped $In_2O_3$), ITiO (Ti-doped $In_2O_3$), InSn, or InSnZnO], a tin-based transparent conductive material [specifically, for example, tin oxide ($SnO_2$), ATO (Sb-doped $SnO_2$), or FTO (F-doped $SnO_2$)], a zinc-based transparent conductive material [specifically, for example, zinc oxide (ZnO including Al-doped ZnO (AZO) or B-doped ZnO), gallium-doped zinc oxide (GZO), or AlMgZnO (aluminum oxide and magnesium oxide-doped zinc oxide)], and NiO can be exemplified. Alternatively, as the second electrode, a transparent conductive film having a gallium oxide, a titanium oxide, a niobium oxide, a stibium oxide, a nickel oxide, or the like as a mother layer or a transparent conductive material such as a spinel type oxide and an oxide having a $YbFe_2O_4$ structure can be exemplified. However, a material constituting the second electrode depends on the arrangement state between the second light reflecting layer and the second electrode but is not limited to the transparent conductive material. As such, metal such as palladium (Pd), platinum (Pt), nickel (Ni), gold (Au), cobalt (Co), and rhodium (Rh) can be used. The second electrode may only be made of at least one type of these materials. The second electrode can be deposited by, for example, a PVD method such as a vacuum vapor deposition method and a sputtering method. Alternatively, a semiconductor layer having low resistance can be used as a transparent electrode layer. In this case, specifically, an n-type GaN-based compound semiconductor layer can be used. In addition, when a layer adjacent to the n-type GaN-based compound semiconductor layer has a p-type, electric resistance at the interface between both layers can be reduced by bonding the layers together via a tunnel junction. Since the transparent conductive material and the tunnel junction function as light absorbing material layers, they are effective not only for controlling an oscillating wavelength (specifically, as will be described later, since the transparent conductive material and the tunnel junction are capable of suppressing the oscillation of laser light in an undesired longitudinal mode among the laser light of a plurality of types of longitudinal modes emitted from the surface emitting laser element, they are allowed to accurately control the oscillating wavelength of emitted laser light but also for serving as an electric path (current path).

When the second electrode is made of the transparent conductive material, a current can be spread in a lateral direction (in-plane direction of the second compound semiconductor layer) and efficiently supplied to the element region (current injecting region). The second electrode is formed on the second surface of the second compound semiconductor layer, and the second light reflecting layer is preferably formed on the second electrode.

A pad electrode may be provided on the first electrode or the second electrode for electrically connecting to an outside electrode or circuit. The pad electrode desirably has a single layer configuration or a multilayer configuration containing at least one type of metal selected from a group including titanium (Ti), aluminum (Al), platinum (Pt), gold (Au), nickel (Ni), and palladium (Pd). Alternatively, the pad electrode can have a multilayer configuration as exemplified by the multilayer configuration of Ti/Pt/Au, the multilayer configuration of Ti/Au, the multilayer configuration of Ti/Pd/Au, the multilayer configuration of Ti/Ni/Au, and the multilayer configuration of Ti/Ni/Au/Cr/Au. When the first electrode is constituted by an Ag layer or an Ag/Pd layer, it is preferable to form a cover metal layer made of, for example, Ni/TiW/Pd/TiW/Ni on the surface of the first electrode and form a pad electrode made of, for example, the multilayer configuration of Ti/Ni/Au or the multilayer configuration of Ti/Ni/Au/Cr/Au on the cover metal layer.

The laminated structure is formed on the second surface of the light emitting element manufacturing substrate. Examples of the light emitting element manufacturing substrate can include a GaN substrate, a GaAs substrate, a sapphire substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and substrates having a base layer or a buffer layer formed on the surfaces (principal surfaces) of the above substrates. However, the GaN substrate is preferably used since its defect density is small. Further, when the light emitting element manufacturing substrate is finally left, examples of the light emitting element manufacturing substrate can include a compound semiconductor substrate such as a GaN substrate and a GaAs substrate, a SiC substrate, and a Si substrate. It is known that the GaN substrate changes its characteristics between polarity, non-polarity, and semi-polarity with its growth surface, but any principal surface (second surface) of the GaN substrate can be used for forming the compound semiconductor layer. Further, regarding the principal surface of the GaN substrate, a crystal orientation surface so-called an A-surface, a B-surface, a C-surface, an R-surface, an M-surface, an N-surface, an S-surface, or the like, surfaces obtained when the above surfaces are caused to be off in a specific direction, or the like can be used depending on a crystal structure (such as, for example, a cubic crystal type and a hexagonal crystal type).

In the manufacturing of the light emitting element of the present disclosure, the light emitting element manufacturing substrate may be left, or the light emitting element manufacturing substrate may be removed after the light emitting layer, the second compound semiconductor layer, the second electrode, and the second light reflecting layer are sequentially formed on the first compound semiconductor layer. Specifically, after the light emitting layer, the second compound semiconductor layer, the second electrode, and the second light reflecting layer are sequentially formed on the first compound semiconductor layer and then the second light reflecting layer is fixed to the support substrate, the light emitting element manufacturing substrate may only be removed to expose the first compound semiconductor layer (the first surface of the first compound semiconductor layer). The removal of the light emitting element manufacturing substrate can be performed by a wet etching method using an alkali water solution such as a sodium hydrate water solution and a potassium hydroxide water solution, an ammonia solution and a hydrogen peroxide solution, a nitric acid solution and a hydrogen peroxide solution, a hydrochloric acid solution and a hydrogen peroxide solution, a phosphoric acid solution and a hydrogen peroxide solution, or the like, a chemical mechanical polishing method (CMP method), a machine polishing method, a dry etching method, a lift-off method or the like using laser, or the combination of the above methods. Then, the first compound semiconductor layer (the first surface of the first compound semiconductor layer) or the first light reflecting layer is exposed in the manner described above.

Alternatively, the removal of the light emitting element manufacturing substrate may only be performed, for example, in a manner in which the first light reflecting layer, the film thickness modulating layer, and the first compound semiconductor layer are formed on the light emitting element manufacturing substrate, the light emitting layer, the second compound semiconductor layer, the second electrode, and the second light reflecting layer are sequentially formed on the first compound semiconductor layer, and the light emitting element manufacturing substrate is removed using the first light reflecting layer as a stopper layer. Specifically, for example, the first compound semiconductor layer (the first surface of the first compound semiconductor layer) and the first light reflecting layer may only be exposed in a manner in which the first light reflecting layer, the film thickness modulating layer, and the first compound semiconductor layer are formed on the light emitting element manufacturing substrate, the light emitting layer, the second compound semiconductor layer, the second electrode, and the second light reflecting layer are sequentially formed on the first compound semiconductor layer, the second light reflecting layer is fixed to the support substrate, and the light emitting element manufacturing substrate is removed using the first light reflecting layer as the stopper layer. In addition, the first electrode may only be formed on the first compound semiconductor layer (the first surface of the first compound semiconductor layer). Alternatively, the stopper layer may not be used if a removing amount is controlled on the basis of the removing rate (polishing rate) of the light emitting element manufacturing substrate.

For example, the support substrate may only be constituted by any type of a substrate exemplified as the light emitting manufacturing substrate or can be constituted by an insulating substrate made of AlN or the like, a semiconductor substrate made of Si, SiC, Ge, or the like, a metal substrate, or an alloy substrate, but a substrate having conductivity is preferably used. Alternatively, a metal substrate or an alloy substrate is preferably used in terms of mechanical characteristics, elastic deformation, plastic deformation, heat releasing characteristics, or the like. As the thickness of the support substrate, 0.05 mm to 1 mm can be exemplified. As a method for fixing the second light reflecting layer to the support substrate, a known method such as a solder joining method, a room-temperature joining method, a joining method using an adhesive tape, a joining method using wax joining, and a method using an adhesive can be used. However, the solder joining method or the room-temperature joining method is desirably used in terms of ensuring conductivity. For example, when a silicon semiconductor substrate that is a conductive substrate is used as the base substrate, a method with which the substrate can be joined at a low temperature of 400° C. or lower is desirably employed to suppress warpage due to a difference in thermal expansion coefficient. When a GaN substrate is used as the support substrate, the joining temperature of the substrate may be 400° C. or higher.

The lateral surface or the exposed surface of the laminated structure may be coated with a coating layer (insulating film). The formation of the coating layer can be performed on the basis of a known method. A material constituting the coating layer preferably has a refractive index smaller than that of a material constituting the laminated structure. Examples of the insulating material constituting the coating layer can include a $SiO_x$-based material containing $SiO_2$, a $SiN_x$-based material, a $SiO_xN_z$-based material, $TaO_x$, $ZrO_x$, AlN$_x$, AlO$_x$, and GaO$_x$ or can include an organic material such as a polyimide resin. Examples of a method for forming the coating layer can include a PVD method such a vacuum vapor deposition method and a sputtering method and a CVD method. Alternatively, the coating layer can be formed on the basis of a coating method.

First Embodiment

A first embodiment relates to the light emitting element of the present disclosure. Although depending on its structure, the light emitting element of the first embodiment or the light emitting elements of second to eighteenth embodiments that will be described later more specifically include a surface emitting laser element (vertical cavity surface emitting laser, VCSEL) that emits laser light from the top surface of a second compound semiconductor layer via a second light reflecting layer or include a surface emitting laser element (vertical cavity surface emitting laser, VCSEL) that emits laser light from the top surface of a first compound semiconductor layer via a first light reflecting layer.

Figure 1A:
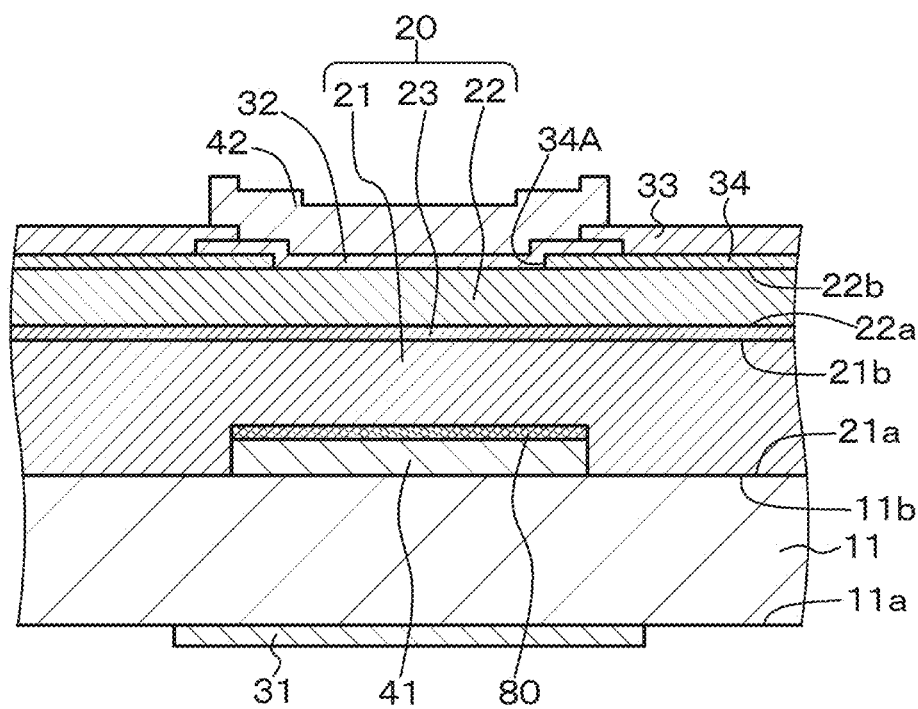
FIGS. 1A and 1B are a schematic partial end view of the light emitting element of a first embodiment and a schematic partial end view of a first light reflecting layer, a film thickness modulating layer, and a first compound semiconductor layer, respectively.
Figure 1B:
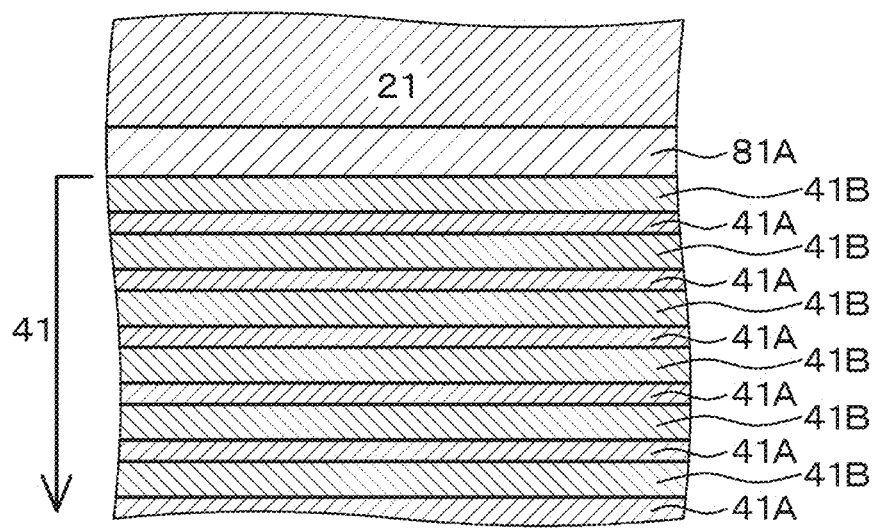
Figure 2A:
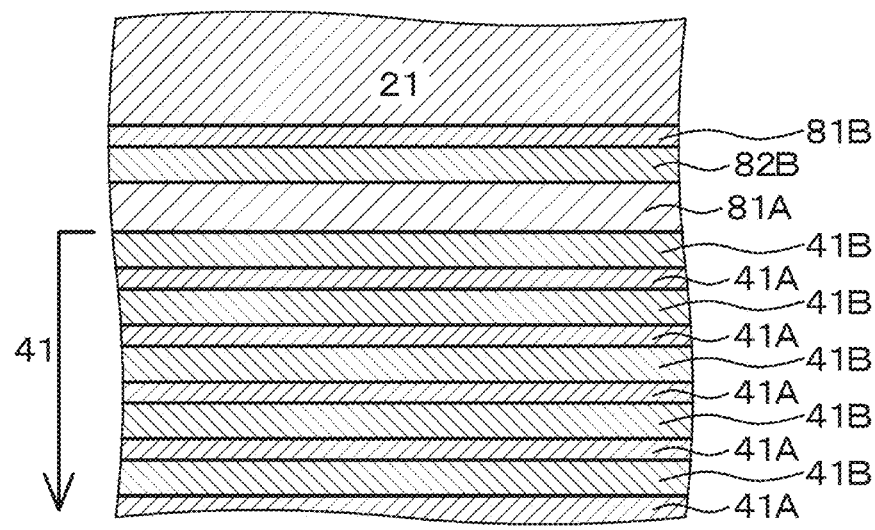
FIGS. 2A and 2B are schematic partial end views of the first light reflecting layer, the film thickness modulating layer, and the first compound semiconductor layer.
Figure 2B:
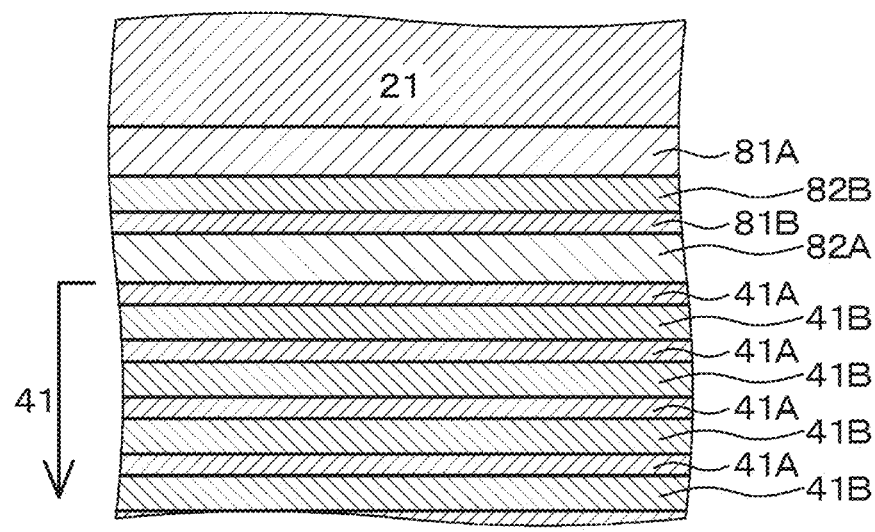

As its schematic partial end view is shown in FIG. 1A and the first light reflecting layer and its adjacent schematic partial end view are shown in FIGS. 1B, 2A, and 2B, the light emitting element of the first embodiment includes a first light reflecting layer 41, a laminated structure 20, and a second light reflecting layer 42 that are laminated to each other. Further, the laminated structure 20 includes a first compound semiconductor layer 21, a light emitting layer (active layer) 23, and a second compound semiconductor layer 22 that are laminated to each other from the side of the first light reflecting layer 41. In addition, light from the laminated structure 20 is emitted to an outside via the first light reflecting layer 41 or the second light reflecting layer 42 (via the second light reflecting layer in the first embodiment). Further, the first light reflecting layer 41 has a structure in which at least two types of thin films are alternately laminated to each other in plural numbers. Between the laminated structure 20 and the first light reflecting layer 41, a film thickness modulating layer 80 is provided.

More specifically, the light emitting element of the first embodiment or the light emitting elements of the second to eighteenth embodiments that will be described later include:

(A) the laminated structure 20 including a GaN-based compound semiconductor in which
  the first compound semiconductor layer 21 (4 μm in thickness) having a first surface 21a and a second surface 21b facing the first surface 21a and having a first conductive type (specifically, an n-type),
  the light emitting layer (active layer) 23 facing the second surface 21b of the first compound semiconductor layer 21, and
  the second compound semiconductor layer 22 (100 nm in thickness) having a first surface 22a facing the light emitting layer 23 and a second surface 22b facing the first surface 22a and having a second conductivity type (specifically, a p-type) are laminated to each other;

(B) the first light reflecting layer 41 disposed on the side of the first surface 21a of the first compound semiconductor layer 21; and (C) the second light reflecting layer 42 disposed on the side of the second surface 22b of the second compound semiconductor layer 22. The first compound semiconductor layer 21 has a thickness larger than that of the second compound semiconductor layer 22.

Further, a resonator is constituted by the region of the first light reflecting layer 41 from the first surface 21a of the first compound semiconductor layer 21 to a certain depth, the laminated structure 20 (the first compound semiconductor layer 21, the light emitting layer 23, and the second compound semiconductor layer 22), and the region of the second light reflecting layer 42 from the second surface 22b of the second compound semiconductor layer 22 to a certain depth.

Note that in the following description, an axial line passing through the center of the resonator formed by the two light reflecting layers may be assumed as a Z-axis, and a virtual plane orthogonal to the Z-axis may be called an XY plane for the sake of convenience.

A first surface 11a of a light emitting element manufacturing substrate 11 made of a compound semiconductor substrate such as a GaN substrate having conductivity has, for example, a {0001} surface as a principal surface. The first compound semiconductor layer 21 formed on a second surface 11b of the light emitting element manufacturing substrate 11 includes an n-GaN layer. The light emitting layer (active layer) 23 includes a fivefold multiquantum well structure in which an In$_{0.04}$Ga$_{0.96}$N layer (barrier layer) and an In$_{0.16}$Ga$_{0.84}$N layer (well layer) are laminated to each other. The second compound semiconductor layer 22 includes a p-GaN layer. A first electrode 31 is formed on the first surface 11a of the light emitting element manufacturing substrate 11. On the other hand, a second electrode 32 is formed on the second compound semiconductor layer 22, and the second light reflecting layer 42 is formed on the second electrode 32. The first light reflecting layer 41 and the second light reflecting layer 42 on the second electrode 32 have a flat shape. The first electrode 31 is made of Ti/Pt/Au, and the second electrode 32 is made of a transparent conductive material, specifically ITO. On the edge part of the first electrode 31, a pad electrode (not shown) made of, for example, Ti/Pd/Au for electrically connecting to an outside electrode or circuit is formed or connected. On the edge part of the second electrode 32, a pad electrode 33 made of, for example, Pd/Ti/Pt/Au, Ti/Pd/Au, or Ti/Ni/Au for electrically connecting to an outside electrode or circuit is formed or connected. Each plane shape (plane shape when normally projected onto the XY plane) of an opening part 34A provided in the first electrode 31, the first light reflecting layer 41, the second light reflecting layer 42, and an insulating layer (current constricting layer) 34 is circular. The second light reflecting layer 42 includes the laminated structure (the total number of laminated dielectric films: 20 layers) of an SiN layer and an SiO$_2$ layer. The first light reflecting layer 41 and the second light reflecting layer 42 have such a multilayer structure but are represented by one layer for the simplification of the drawings.

In the light emitting element of the first embodiment, the first light reflecting layer 41 has a structure in which first thin films 41A having an optical film thickness of $t_1$ and second thin films 41B having an optical film thickness of $t_2$ (where $t_2 \neq t_1$) are alternately laminated to each other in plural numbers. Further, the film thickness modulating layer 80 is constituted by at least one layer of a third thin film having an optical film thickness of $t_3$ (where $t_3 \neq t_1$). Here, the first thin films 41A are made of a first material, and the second thin films 41B are made of a second material different from the first material. Specifically, the first material is SiN, and the second material is SiO$_2$. That is, the first material is made of a dielectric material, and the second material is also made of a dielectric material. As described above, the material constituting the film thickness modulating layer may be different from the materials constituting the first compound semiconductor layer 21, the light emitting layer 23, and the second compound semiconductor layer 22. Further, $t_3/t_1 \geq 1.1$ or $t_3/t_1 \leq 0.9$ is satisfied as a film thickness modulating degree. For example, the number of the layers of the first thin films 41A is 14, and the number of the layers of the second thin films 41B is 14.

In some cases, the film thickness modulating layer 80 has a structure in which third thin films 81 and fourth thin films 82 having an optical film thickness of $t_4$ are laminated to each other. In addition, the film thickness modulating layer 80 has a structure in which the third thin films 81 and the fourth thin films 82 are alternately laminated to each other in plural numbers. The optical film thickness of at least one layer among the third thin films 81 satisfies $t_3 \neq t_1$. In addition, in some cases, the optical film thickness of at least one layer among the fourth thin films 82 satisfies $t_4 \neq t_2$. Note that the third thin film satisfying $t_3 \neq t_1$ will be denoted by reference numeral 81A and called a "third A thin film 81A" for the sake of convenience, and the other third film will be denoted by reference numeral 81B and called a "third B thin film 81B" for the sake of convenience. Further, the fourth thin film satisfying $t_4 \neq t_2$ will be denoted by reference numeral 82A and called a "fourth A thin film 82A" for the sake of convenience, and the other fourth film will be denoted by reference numeral 82B and called a "fourth B thin film 82B" for the sake of convenience. In addition, the third A thin film 81A satisfying $t_3 \neq t_1$ or the fourth A thin film 82A satisfying $t_4 \neq t_2$ contacts the first light reflecting layer 41. Further, the third B thin film 81B other than the third A thin film 81A satisfying $t_3 \neq t_1$ satisfies $t_3 = t_1$, and the fourth B thin film 82B other than the fourth A thin film 82A satisfying $t_4 \neq t_2$ satisfies $t_4 = t_2$. The total number of the layers of the third thin films 81 and the fourth thin films 82 is five or less. The third thin films 81 are made of the first material, and the fourth thin films 82 are made of the second material. Specifically, the film thicknesses or the like of the respective thin films are shown in, for example, the following table 1 in the first embodiment but are not limited to these values. $\lambda_0$ is 435 nm.

TABLE 1

|  | Physical thickness | Refractive Index | Optical film thickness |
|---|---|---|---|
| First thin film 41A | 54.4 nm | 2.00 | $t_1$ = 109 nm |
| Second thin film 41B | 77.7 nm | 1.40 | $t_2$ = 109 nm |
| Third A thin film 81A | 40.8 nm | 2.00 | $t_3$ = 81.6 nm |
| Third B thin film 81B | 77.7 nm | 1.40 | $t_1$ = 109 nm |
| Fourth A thin film 82A | 43.5 nm | 2.00 | $t_4$ = 87.0 nm |
| Fourth B thin film 82B | 77.7 nm | 1.40 | $t_2$ = 109 nm |

Here, in an example shown in FIG. 1B, the film thickness modulating layer 80 includes the one layer of the third A thin film 81A. Further, in an example shown in FIG. 2A, the film thickness modulating layer 80 includes the three layers of the third B thin film 81B, the fourth B thin film 82B, and the third A thin film 81A from the side of the first compound semiconductor layer 21. In addition, in an example shown in FIG. 2B, the film thickness modulating layer 80 includes the four layers of the third A thin film 81A, the fourth B thin film 82B, the third B thin film 81B, and the fourth A thin film 82A from the side of the first compound semiconductor layer 21. However, the configurations of the film thickness modulating layers 80 are given only for exemplification and can be appropriately changed. The following tables 2, 3, and 4 show the configurations of various film thickness modulating layers 80. Note that in the tables, "3A" represents the third A thin film 81A, "3B" represents the third B thin film 81B, "4A" represents the fourth A thin film 82A, "4B" represents the fourth B thin film 82B, and "1" and "2" in the column of the "first light reflecting layer" represent the first thin film 41A and the second thin film 41B, respectively.

TABLE 2

| Third layer | Fourth layer | Film thickness modulating layer | | | | First light reflecting layer | | | |
|---|---|---|---|---|---|---|---|---|---|
| 1 | 0 | 3A | | | | 2 | 1 | 2 | 1 |
| 1 | 1 | 4B | 3A | | | 2 | 1 | 2 | 1 |
|  |  | 4A | 3A | | | 2 | 1 | 2 | 1 |
| 2 | 1 | 3A | 4A | 3A | | 2 | 1 | 2 | 1 |
|  |  | 3A | 4B | 3A | | 2 | 1 | 2 | 1 |
|  |  | 3B | 4A | 3A | | 2 | 1 | 2 | 1 |
|  |  | 3B | 4B | 3A | | 2 | 1 | 2 | 1 |
| 1 | 2 | 4A | 3A | 4A | | 1 | 2 | 1 | 2 |
|  |  | 4B | 3A | 4A | | 1 | 2 | 1 | 2 |
| 2 | 2 | 4A | 3A | 4A | 3A | 2 | 1 | 2 | 1 |
|  |  | 4A | 3A | 4B | 3A | 2 | 1 | 2 | 1 |
|  |  | 4B | 3A | 4A | 3A | 2 | 1 | 2 | 1 |
|  |  | 4B | 3A | 4B | 3A | 2 | 1 | 2 | 1 |
|  |  | 4A | 3B | 4A | 3A | 2 | 1 | 2 | 1 |
|  |  | 4A | 3B | 4B | 3A | 2 | 1 | 2 | 1 |
|  |  | 4B | 3B | 4A | 3A | 2 | 1 | 2 | 1 |
|  |  | 4B | 3B | 4B | 3A | 2 | 1 | 2 | 1 |
|  |  | 3A | 4A | 3A | 4A | 1 | 2 | 1 | 2 |
|  |  | 3A | 4A | 3B | 4A | 1 | 2 | 1 | 2 |
|  |  | 3B | 4A | 3A | 4A | 1 | 2 | 1 | 2 |
|  |  | 3A | 4B | 3A | 4A | 1 | 2 | 1 | 2 |
|  |  | 3A | 4B | 3B | 4A | 1 | 2 | 1 | 2 |
|  |  | 3B | 4B | 3A | 4A | 1 | 2 | 1 | 2 |

TABLE 3

| Third layer | Fourth layer | Film thickness modulating layer | | | | | First light reflecting layer | | | |
|---|---|---|---|---|---|---|---|---|---|---|
| 3 | 2 | 3A | 4A | 3A | 4A | 3A | 2 | 1 | 2 | 1 |
|  |  | 3A | 4A | 3A | 4B | 3A | 2 | 1 | 2 | 1 |
|  |  | 3A | 4A | 3B | 4A | 3A | 2 | 1 | 2 | 1 |
|  |  | 3A | 4A | 3B | 4B | 3A | 2 | 1 | 2 | 1 |
|  |  | 3A | 4B | 3A | 4A | 3A | 2 | 1 | 2 | 1 |
|  |  | 3A | 4B | 3A | 4B | 3A | 2 | 1 | 2 | 1 |
|  |  | 3A | 4B | 3B | 4A | 3A | 2 | 1 | 2 | 1 |
|  |  | 3A | 4B | 3B | 4B | 3A | 2 | 1 | 2 | 1 |
|  |  | 3B | 4A | 3A | 4A | 3A | 2 | 1 | 2 | 1 |
|  |  | 3B | 4A | 3A | 4B | 3A | 2 | 1 | 2 | 1 |
|  |  | 3B | 4A | 3B | 4A | 3A | 2 | 1 | 2 | 1 |
|  |  | 3B | 4A | 3B | 4B | 3A | 2 | 1 | 2 | 1 |
|  |  | 3B | 4B | 3A | 4A | 3A | 2 | 1 | 2 | 1 |
|  |  | 3B | 4B | 3A | 4B | 3A | 2 | 1 | 2 | 1 |
|  |  | 3B | 4B | 3B | 4A | 3A | 2 | 1 | 2 | 1 |
|  |  | 3B | 4B | 3B | 4B | 3A | 2 | 1 | 2 | 1 |

TABLE 4

| Third layer | Fourth layer | Film thickness modulating layer | | | | | First light reflecting layer | | | |
|---|---|---|---|---|---|---|---|---|---|---|
| 2 | 3 | 4A | 3A | 4A | 3A | 4A | 1 | 2 | 1 | 2 |
|  |  | 4A | 3A | 4A | 3B | 4A | 1 | 2 | 1 | 2 |
|  |  | 4A | 3A | 4B | 3A | 4A | 1 | 2 | 1 | 2 |
|  |  | 4A | 3A | 4B | 3B | 4A | 1 | 2 | 1 | 2 |
|  |  | 4A | 3B | 4A | 3A | 4A | 1 | 2 | 1 | 2 |
|  |  | 4A | 3B | 4B | 3A | 4A | 1 | 2 | 1 | 2 |
|  |  | 4B | 3A | 4A | 3A | 4A | 1 | 2 | 1 | 2 |
|  |  | 4B | 3A | 4A | 3B | 4A | 1 | 2 | 1 | 2 |
|  |  | 4B | 3A | 4B | 3A | 4A | 1 | 2 | 1 | 2 |
|  |  | 4B | 3A | 4B | 3B | 4A | 1 | 2 | 1 | 2 |
|  |  | 4B | 3B | 4A | 3A | 4A | 1 | 2 | 1 | 2 |
|  |  | 4B | 3B | 4B | 3A | 4A | 1 | 2 | 1 | 2 |

In addition, in the light emitting element of the first embodiment, the first light reflecting layer 41 is formed on the substrate (light emitting element manufacturing substrate 11), and the laminated structure 20 is formed on the region of the substrate (light emitting element manufacturing substrate 11) where the first light reflecting layer 41 is not formed.

Figure 3A:
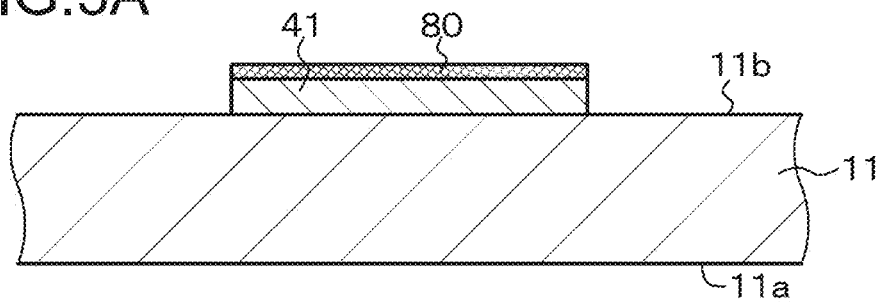
FIGS. 3A to 3C are schematic partial end views of a substrate or the like for describing a method for manufacturing the light emitting element of the first embodiment.
Figure 3B:
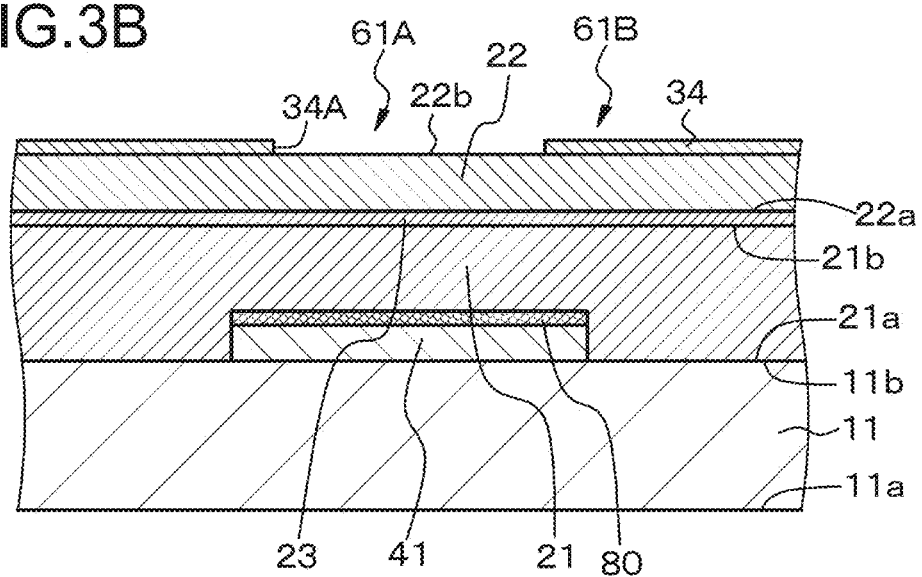
Figure 3C:
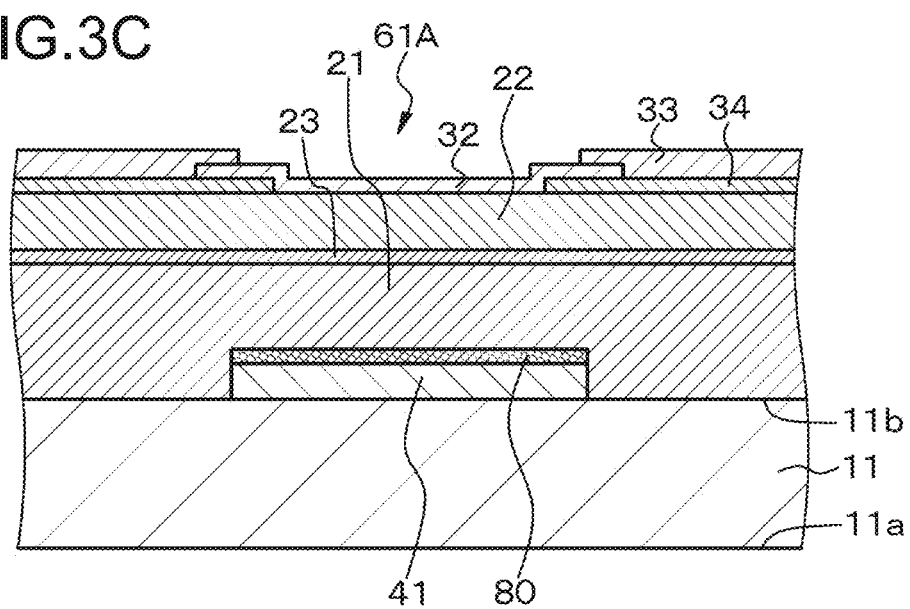

Hereinafter, a description will be given of a method for manufacturing the light emitting element of the first embodiment with reference to FIGS. 3A, 3B, and 3C showing a schematic partial end view of a laminated structure or the like.

[Step 100]

First, a first light reflecting layer 41 is formed on a second surface 11b of a light emitting element manufacturing substrate 11 on the basis of a known method such as a sputtering method and a vacuum vapor deposition method. In addition, a film thickness modulating layer 80 is formed on the basis of a known method such as a sputtering method, a vacuum vapor deposition method, and a plasma CVD method. Then, unnecessary portions of the film thickness modulating layer 80 and the first light reflecting layer 41 are removed on the basis of a patterning method such as a wet etching method and a dry etching method to obtain the first light reflecting layer 41 and the film thickness modulating layer 80 having a desired shape (see FIG. 3A). The first light reflecting layer 41 and the film thickness modulating layer 80 have a flat shape.

[Step 110]

Next, a laminated structure 20 is formed on the second surface 11b of the light emitting element manufacturing substrate 11 including the film thickness modulating layer 80 on the basis of lateral growth using a method such as an ELO method for achieving epitaxial growth in a lateral direction.

Specifically, the laminated structure 20 including a GaN-based compound semiconductor is formed in which
  a first compound semiconductor layer 21 having a first surface 21a and a second surface 21b facing the first surface 21a,
  a light emitting layer (active layer) 23 facing the second surface 21b of the first compound semiconductor layer 21, and
  a second compound semiconductor layer 22 having a first surface 22a facing the light emitting layer 23 and a second surface 22b facing the first surface 22a are laminated to each other.

[Step 120]

Next, an insulating layer (current constricting layer) 34 having an opening part 34A and made of $SiO_2$ is formed on the second surface 22b of the second compound semiconductor layer 22 on the basis of the combination of a film forming method such as a CVD method, a sputtering method, and a vacuum vapor deposition method and a wet etching method or a dry etching method (see FIG. 3B). By the insulating layer 34A having the opening part 34A, a current constricting region (an element region 61A and a current non-injecting region 61B) is defined. That is, the element region 61A is defined by the opening part 34A.

[Step 130]

Subsequently, a second electrode 32 and a second light reflecting layer 42 are formed on the second compound semiconductor layer 22. Specifically, the second electrode 32 is formed over the insulating layer 34 from the second surface 22b of the second compound semiconductor layer 22 exposed at the bottom surface of the opening part 34A (the element region 61A) on the basis of, for example, a lift-off method, and a pad electrode 33 is also formed on the basis of the combination of a film forming method such as a sputtering method and a vacuum vapor deposition method and a patterning method such as a wet etching method and a dry etching method (see FIG. 3C). Next, a second light reflecting layer 42 is formed over the pad electrode 33 from the upper side of the second electrode 32 on the basis of the combination of a film forming method such as a sputtering method and a vacuum vapor deposition method and a patterning method such as a wet etching method and a dry etching method. The second light reflecting layer 42 on the second electrode 32 has a flat shape.

[Step 140]

Subsequently, a first electrode 31 is formed on the first surface 11a of the light emitting element manufacturing substrate 11 on the basis of the combination of a film forming method such as a sputtering method and a vacuum vapor deposition method and a patterning method such as a wet etching method and a dry etching method, whereby the first electrode 31 electrically connected to the first compound semiconductor layer 21 can be obtained. Thus, the structure shown in FIG. 1A can be obtained.

[Step 150]

Subsequently, the light emitting element is separated by so-called element separation, and the lateral surface or the exposed surface of the laminated structure is coated with, for example, an insulating film made of $SiO_2$. Then, packaging or sealing is performed, whereby the light emitting element of the first embodiment can be completed.

Figure 4A:
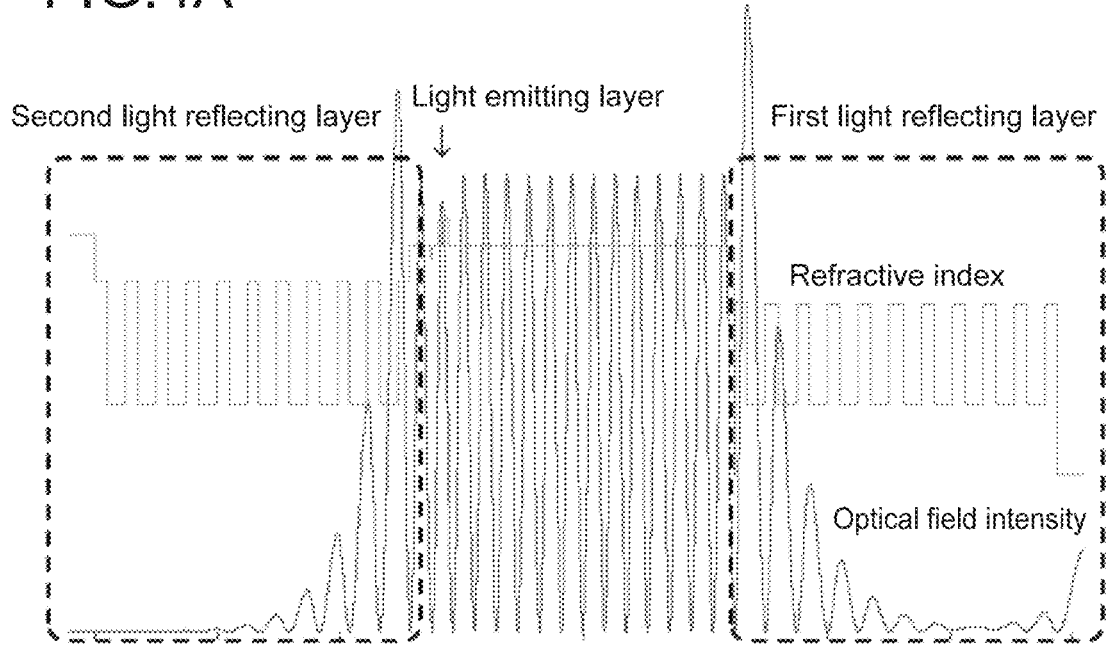
FIGS. 4A and 4B are a diagram showing the simulated results of the optical field of the light emitting element of the first embodiment and a diagram showing the simulated results of the optical field of the light emitting element of a first comparative example, respectively.
Figure 4B:
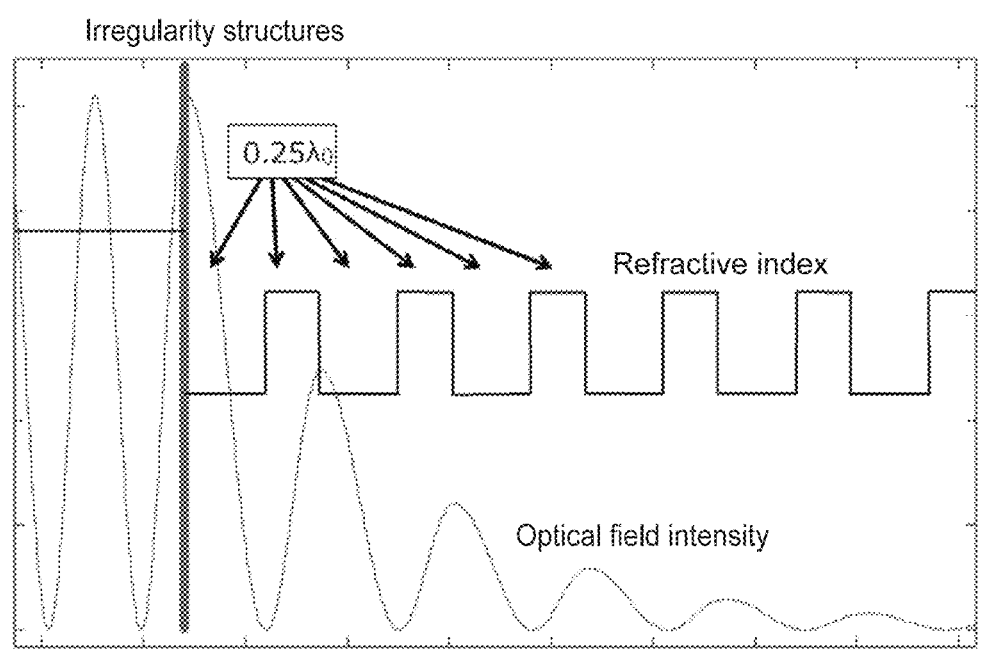
Figure 5A:
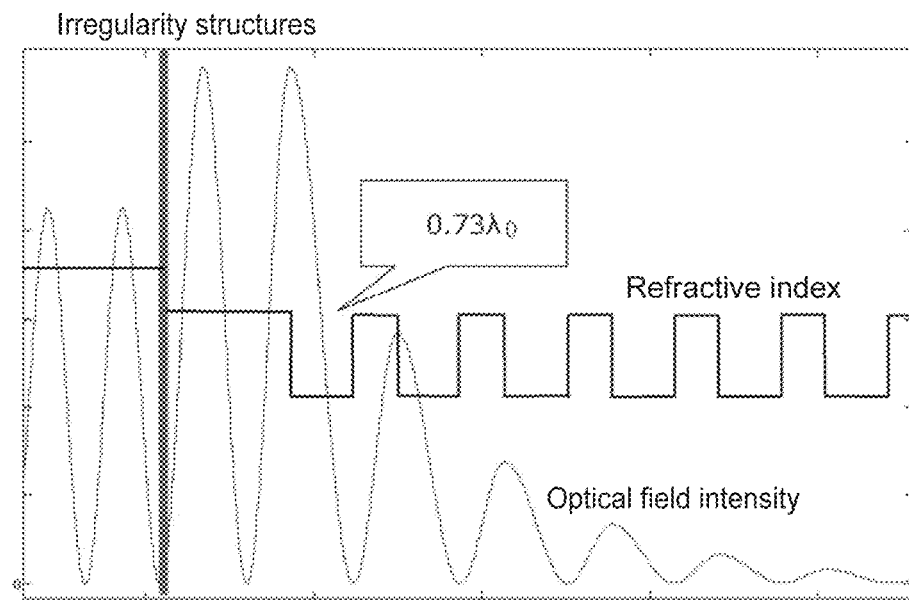
FIGS. 5A and 5B are diagrams showing the simulated results of the optical field of the light emitting element of the first embodiment.
Figure 5B:
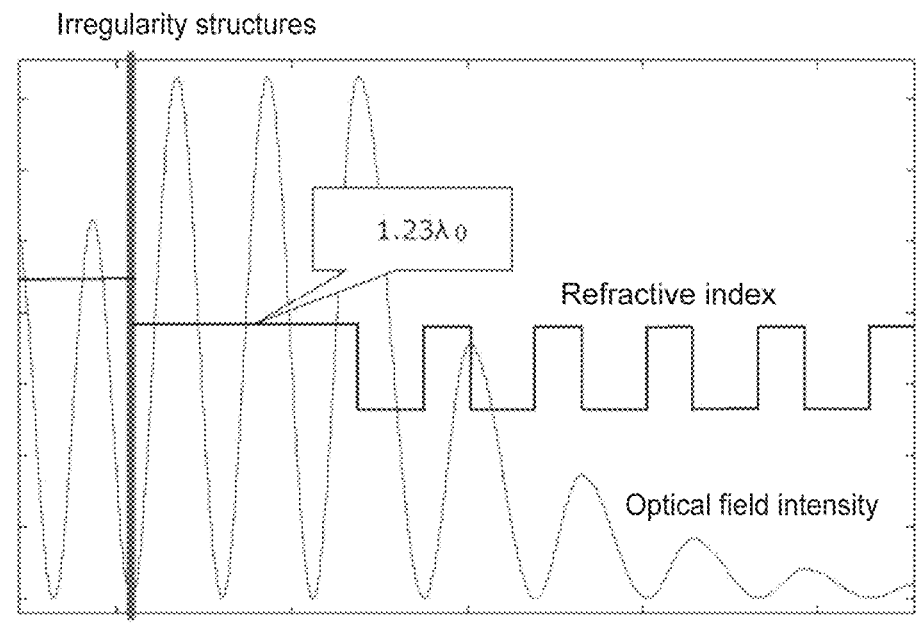

Results obtained by simulating the optical field of the light emitting element of the first embodiment are shown in FIGS. 4A, 5A, and 5B. On the other hand, assuming that a light emitting element in which the film thickness modulating layer 80 is not formed is the light emitting element of a first comparative example, results obtained by simulating the optical field of the light emitting element of the first comparative embodiment are shown in FIG. 4B. In FIGS. 4A, 4B, 5A, and 5B, a horizontal axis shows the position of the first compound semiconductor layer 21, the position of irregularity structures (such as, for example, fine irregularities, point defects or line defects, and pores), the position of the film thickness modulating layer 80, and the position of the first light reflecting layer 41, a vertical axis shows the intensity of the optical field, a rectangle line represents a refractive index, and a wave line represents the intensity of the optical field. The film thickness modulating layer 80 is constituted by the one layer of the third A thin film 81A. In an example shown in FIG. 5A, $t_3$ is $0.73\lambda_0$. In an example shown in FIG. 5B, $t_3$ is $1.23\lambda_0$. Further, in FIGS. 4B, 5A, and 5B, the film thickness $t_1$ of the first thin films 41A and the film thickness $t_2$ of the second thin films 41B are $0.25\lambda_0$ in the first light reflecting layer 41. $\lambda_0$ represents the wavelength (oscillating wavelength, light emitting wavelength) of light mainly emitted from the light emitting element.

In a surface emitting laser element, an optical field repeatedly has a strong region and a weak region in a resonator. When the film thickness modulating layer 80 is not formed as shown in the first comparative example of FIG. 4B, a region in which the optical field is strong occurs at the interface between the first light reflecting layer 41 and the laminated structure 20 and optical loss occurs due to non-irregularity structures existing in the vicinity of the region where the optical field is strong. On the other hand, in the light emitting element of the first embodiment in which the film thickness modulating layer 80 is formed as shown in FIGS. 4A, 5A, and 5B, a region in which the optical field is strong is not formed at the interface between the laminated structure 20 and the film thickness modulating layer 80 or the region in which the optical field is strong is not formed in the vicinity of the interface. Therefore, even if irregularity structures exist at the interface between the laminated structure 20 and the film thickness modulating layer 80 or even if the irregularity structures exist in the vicinity of the interface, optical loss hardly occurs. As a result, the occurrence of a problem such as an increase in the threshold of the light emitting element, a reduction in light emission efficiency, and a reduction in the quality of emitted light can be reliably avoided.

In the first comparative example, when the laminated structure 20 is formed on the second surface 11b of the light emitting element manufacturing substrate 11 including the first light reflecting layer 41 on the basis of lateral growth using a method such as an ELO method for achieving epitaxial growth in a lateral direction in the same step as the [Step 110] of the first embodiment, the above irregularity structures are likely to occur in the region of the laminated structure 20 formed on the first light reflecting layer 41 (specifically, in the first compound semiconductor layer 21 contacting the first light reflecting layer 41). As a result of the absorption or scattering of light by such irregularity structures, optical loss occurs. Root-mean-square roughness $Rq \geq 1$ nm can be exemplified as fine irregularities, $1 \times 10^{17}/\text{cm}^3$ or more can be exemplified as the density of point defects, and $1 \times 10^6/\text{cm}^3$ or more can be exemplified as the density of line defects. Further, pores exist at the interface between the laminated structure and the film thickness modulating layer, and 10 nm or less can be exemplified as the thickness of the pores (the separated distance between the laminated structure and the film thickness modulating layer). That is, as the irregularity structures, irregularities are formed at the interface between the laminated structure and the film thickness modulating layer, and may have a root-mean-square roughness Rq of 1 nm or more as surface roughness. Alternatively, point defects are formed at the interface between the laminated structure and the film thickness modulating layer, and may have a density of $1 \times 10^{17}/\text{cm}^3$ or more. Alternatively, line defects may have a density of $1 \times 10^6/\text{cm}^3$ or more. Alternatively, pores are formed at the interface between the laminated structure and the film thickness modulating layer, and may have a thickness of 10 nm or less.

On the other hand, in the light emitting element of the first embodiment, a region (antinode) in which the optical field is strong is not formed at the interface between the laminated structure 20 and the film thickness modulating layer 80 or the region (antinode) in which the optical field is strong is not formed in the vicinity of the interface due to the formation of the film thickness modulating layer 80 even if irregularity structures occur at the interface between the laminated structure 20 and the film thickness modulating layer 80 or even if the irregularity structures occur in the vicinity of the interface. Therefore, the occurrence of a problem such as an increase in the threshold of the light emitting element, a reduction in light emission efficiency, and a reduction in the quality of emitted light can be reliably avoided.

Second Embodiment

A second embodiment is a modification of the first embodiment. More specifically, the light emitting element of the second embodiment includes a surface emitting laser element (vertical cavity surface emitting laser, VCSEL) that emits laser light from the top surface of a first compound semiconductor layer 21 via a first light reflecting layer 41.

Figure 6A:
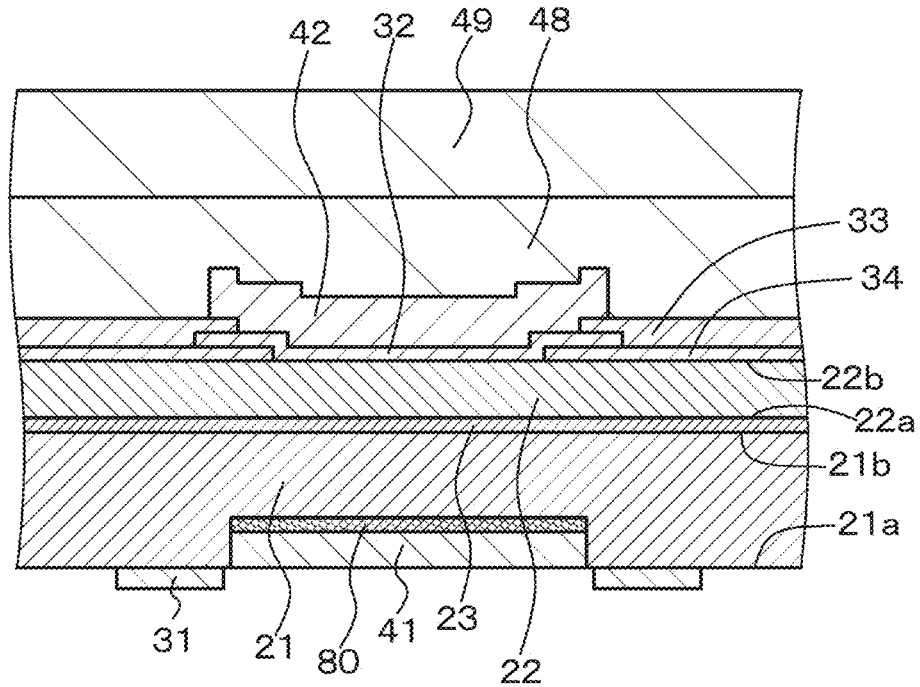
FIGS. 6A and 6B are a schematic partial end view of the light emitting element of a second embodiment and a schematic partial end view of the light emitting element of a modified example of the embodiment, respectively.

In the light emitting element of the second embodiment, a second light reflecting layer 42 is fixed to a support substrate 49 constituted by a silicon semiconductor substrate on the basis of a solder joint method via a joining layer 48 made of a solder layer containing a gold (Au) layer or tin (Sn) as shown in a schematic partial cross-sectional view of FIG. 6A. Further, the first light reflecting layer 41 is formed on the exposed surface of a laminated structure 20.

Hereinafter, a description will be given of a method for manufacturing the light emitting element of the second embodiment.

[Step 200]

First, for example, when the same steps as [Step 100] to [Step 130] of the first embodiment are performed, the state shown in FIG. 1 (however, a first electrode 31 is not formed) can be obtained.

[Step 210]

Subsequently, a second light reflecting layer 42 is fixed to a support substrate 49 via a joining layer 48.

[Step 220]

Next, a light emitting element manufacturing substrate 11 is removed to expose a first surface 21a of a first compound semiconductor layer 21 and a first light reflecting layer 41. Specifically, the light emitting element manufacturing substrate 11 is first thinned on the basis of a machine polishing method, and a residual part of the light emitting element manufacturing substrate 11 is next removed on the basis of a CMP method. Thus, the first surface 21a of the first compound semiconductor layer 21 and the first light reflecting layer 41 are exposed.

[Step 230]

Subsequently, the first electrode 31 is formed on the first surface 21a of the first compound semiconductor layer 21. Thus, the light emitting element of the second embodiment having a structure shown in FIG. 6A can be obtained.

In the manufacturing of the light emitting element of the second embodiment, the light emitting element manufacturing substrate is removed in a state in which the first light reflecting layer is formed. Therefore, the first light reflecting layer functions as a kind of a stopper (stopper layer) when the light emitting element manufacturing substrate is removed. As a result, the occurrence of a fluctuation in the removing amount of the light emitting element manufacturing substrate and a fluctuation in the thickness of the first compound semiconductor layer can be suppressed. As a result of the uniformization of the length of a resonator, the characteristics of the obtained light emitting element can be stabilized. Furthermore, since the surface (flat surface) of the first compound semiconductor layer at the interface between the first light reflecting layer and the first compound semiconductor layer is flat, the scattering of laser light on the flat surface can be minimized.

In the example of the light emitting element described above and shown in FIG. 6A, the end of the first electrode 31 is separated from the first light reflecting layer 41. That is, the first light reflecting layer 41 and the first electrode 31 are separated from each other. In other words, the first light reflecting layer 41 and the first electrode 31 have an offset therebetween, and their separated distance is within 1 mm, specifically, for example, 0.05 mm on average. However, without being limited to such a structure, the end of the first electrode 31 may contact the first light reflecting layer 41 or may be formed over the edge part of the first light reflecting layer 41.

Figure 6B:
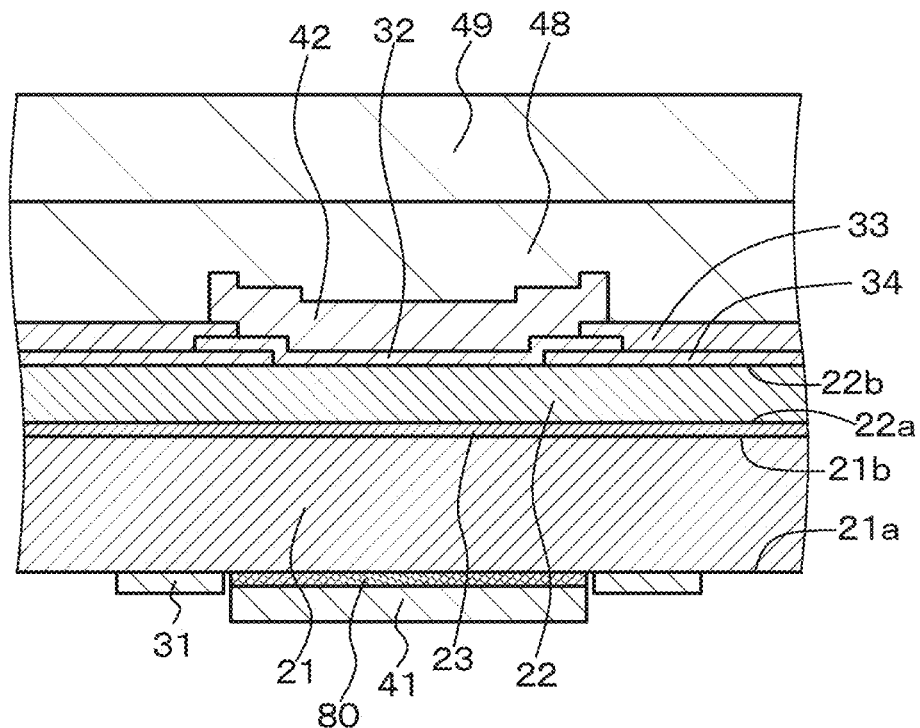

Alternatively, as shown in the schematic partial end view of FIG. 6B, the first light reflecting layer 41 may be formed on the exposed surface of the laminated structure 20 in the light emitting element of the second embodiment. That is, [Step 100] of the first embodiment is skipped, and the same steps as, for example, [Step 110] to [Step 130] of the first embodiment are first performed. Then, [Step 210] and [Step 220] are performed to expose the first surface 21a of the first compound semiconductor layer 21. Next, a film thickness modulating layer 80, the first light reflecting layer 41, and the first electrode 31 may be formed on the first surface 21a of the first compound semiconductor layer 21. For example, a first material is $SiO_2$, and a second material is $Ta_2O_5$. The film thicknesses or the like of respective thin films are shown in the following table 5 but are not limited to these values. $\lambda_0$ is 488 nm. Further, the number of the layers of first thin films 41A is seven, and the number of the layers of second thin films 41B is seven.

TABLE 5

|  | Physical thickness | Refractive Index | Optical film thickness |
| --- | --- | --- | --- |
| First thin film 41A | 87.1 nm | 1.40 | $t_1$ = 122 nm |
| Second thin film 41B | 55.5 nm | 2.20 | $t_2$ = 122 nm |
| Third A thin film 81A | 65.4 nm | 1.40 | $t_3$ = 91.6 nm |
| Third B thin film 81B | 55.5 nm | 2.20 | $t_1$ = 122 nm |
| Fourth A thin film 82A | 69.7 nm | 1.40 | $t_4$ = 97.6 nm |
| Fourth B thin film 82B | 55.5 nm | 2.20 | $t_2$ = 122 nm |

According to such a modified example of the light emitting element of the second embodiment, even if irregularity structures occur in the vicinity of the surface of an exposed part of the first surface 21a when a residual part of the light emitting element manufacturing substrate 11 is removed on the basis of a CMP method to expose the first surface 21a of the first compound semiconductor layer 21 in [Step 220], a region in which an optical field is strong is not formed at the interface of the first light reflecting layer 41 contacting the film thickness modulating layer 80 and is not formed a region in the vicinity of the interface since the film thickness modulating layer 80 is formed. Therefore, optical loss can be suppressed.

Figure 7A:
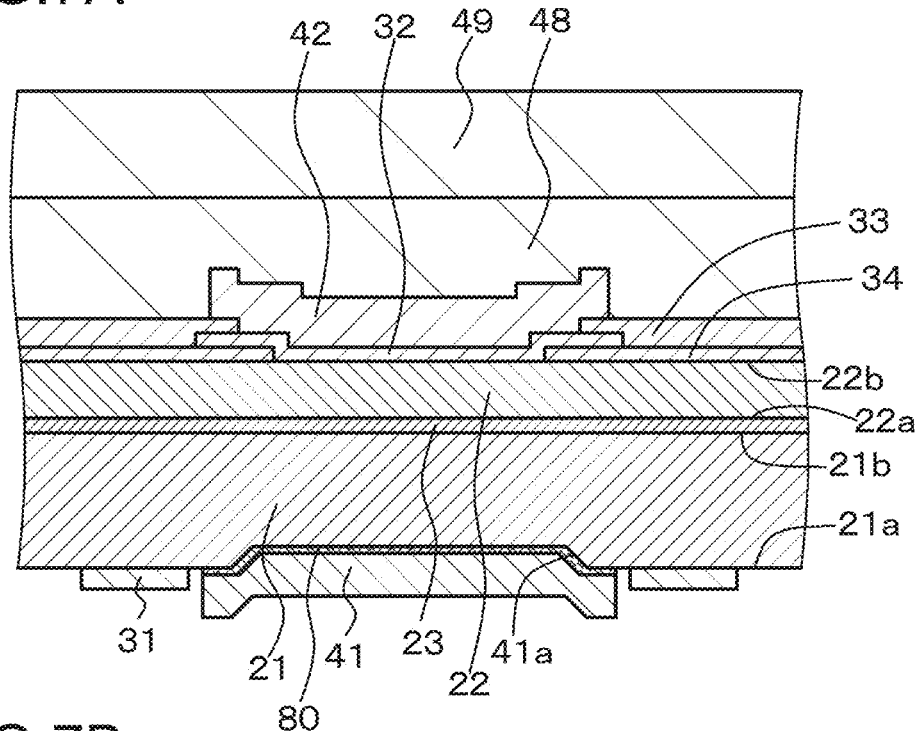
FIGS. 7A and 7B are a schematic partial end view of the light emitting element of the modified example of the second embodiment and a schematic partial end view of the light emitting element of a third embodiment, respectively.

Further, when the first light reflecting layer 41 is formed on the first surface 21a of the first compound semiconductor layer 21, the first compound semiconductor layer 21 may be etched to form a concave part on the first surface 21a of the first compound semiconductor layer 21 so that the first light reflecting layer 41 is formed on the concave part (see FIG. 7A). Note that an inclined part formed at the first compound semiconductor layer 21 is denoted by reference numeral 41a.

Third Embodiment

A third embodiment is also a modification of the first embodiment. As shown in the schematic partial end view of FIG. 7B, the light emitting element of the third embodiment can have a mode in which a first material constituting first and third thin films is a compound semiconductor material, specifically AlInN and a second material constituting second and fourth thin films is also a compound semiconductor material, specifically GaN. Further, like the first embodiment, $t_3/t_1 \geq 1.1$ or $t_3/t_1 \leq 0.9$ is satisfied as a film thickness modulating degree. Specifically, the film thicknesses or the like of the respective thin films are shown in the following table 6 in the third embodiment but are not limited to these values. $\lambda_0$ is 515 nm. Further, the number of the layers of the first thin films is 40, and the number of the layers of the second thin films is 40.

TABLE 6

|  | Physical thickness | Refractive Index | Optical film thickness |
| --- | --- | --- | --- |
| First thin film 41A | 49.3 nm | 2.61 | $t_1$ = 129 nm |
| Second thin film 41B | 52.8 nm | 2.44 | $t_2$ = 129 nm |
| Third A thin film 81A | 56.7 nm | 2.61 | $t_3$ = 148 nm |
| Third B thin film 81B | 52.8 nm | 2.44 | $t_1$ = 129 nm |
| Fourth A thin film 82A | 56.7 nm | 2.61 | $t_4$ = 148 nm |
| Fourth B thin film 82B | 52.8 nm | 2.44 | $t_2$ = 129 nm |

In the light emitting element of the third embodiment, a first light reflecting layer 41 made of the multilayer films of the first thin films 41A and the second thin films 41B and a film thickness modulating layer 80 may only be formed on a second surface 11b of a light emitting element manufacturing substrate 11 made of a GaN substrate having, for example, a {20-21} surface as a principal surface on the basis of an epitaxial growth method in the same step as [Step 100] of the first embodiment. Then, the same steps as [Step 110] to [Step 150] of the first embodiment may only be performed. Note that the patterning of the first light reflecting layer 41 and the film thickness modulating layer 80 is not required as a rule in the third embodiment. Thus, the light emitting element having a structure shown in FIG. 7B can be finally obtained.

Fourth Embodiment

A fourth embodiment is a modification of the first to third embodiments. In the light emitting element of the fourth embodiment, at least two light absorbing material layers are formed inside a laminated structure (or a laminated structure including a second electrode) in parallel with a virtual plane occupied by a light emitting layer. Note that the light emitting element of the fourth embodiment or the light emitting elements of fifth and sixth embodiments that will be described later will be called "light emitting elements including light absorbing material layers" for the sake of convenience.

As described above, a laminated structure 20 is formed between two DBR layers 41 and 42. A resonator length $L_{OR}$ inside a light emitting laminated body constituted by the two DBR layers 41 and 42 and the laminated structure 20 formed between the two DBR layers 41 and 42 is expressed by $$L_{OR}=(m\cdot\lambda_0)/(2\cdot n_{eq}) \quad (A)$$

when the equivalent refractive index of the entire light emitting laminated body is $n_{eq}$ and the wavelength of laser light to be emitted from a surface emitting laser element (light emitting element) is $\lambda_0$. Here, m is a positive integer. Meanwhile, in the surface emitting laser element (light emitting element), a wavelength capable of being oscillated is determined by the resonator length $L_{OR}$. Individual oscillating modes capable of being oscillated are called longitudinal modes. Further, any of the longitudinal modes matching a gain spectrum determined by a light emitting layer can be laser-oscillated. The interval $\Delta\lambda$ between the longitudinal modes is expressed by $$\lambda_0^2/(2n_{eff}L_{OR})$$

when an effective refractive index is $n_{eff}$. That is, the longer the resonator length $L_{OR}$, the narrower the interval $\Delta\lambda$ between the longitudinal modes becomes. Accordingly, when the resonator length $L_{OR}$ is long, a plurality of longitudinal modes can be oscillated since the plurality of longitudinal modes can exist in a gain spectrum. Note that the following relationship is established between the equivalent refractive index $n_{eq}$ and the effective refractive index $n_{eff}$ when an oscillating wavelength is $\lambda_0$.

$$n_{eff} = n_{eq} - \lambda_0 \cdot (dn_{eq}/d\lambda_0)$$

Figure 12A:
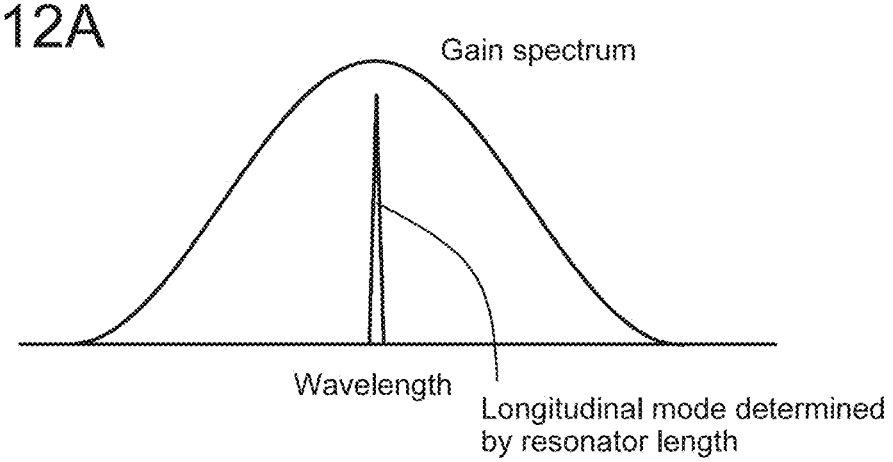
FIGS. 12A and 12B are conceptual diagrams each schematically showing a longitudinal mode existing in a gain spectrum determined by a light emitting layer.

Here, when the resonator length $L_{OR}$ is short, i.e., when the resonator length $L_{OR}$ is 1 μm or less, one type (one wavelength) of laser light in a longitudinal mode is emitted from the surface emitting laser element (see the conceptual diagram of FIG. 12A). Accordingly, it is possible to accurately control the oscillating wavelength of the laser light emitted from the surface emitting laser element.

Figure 12B:
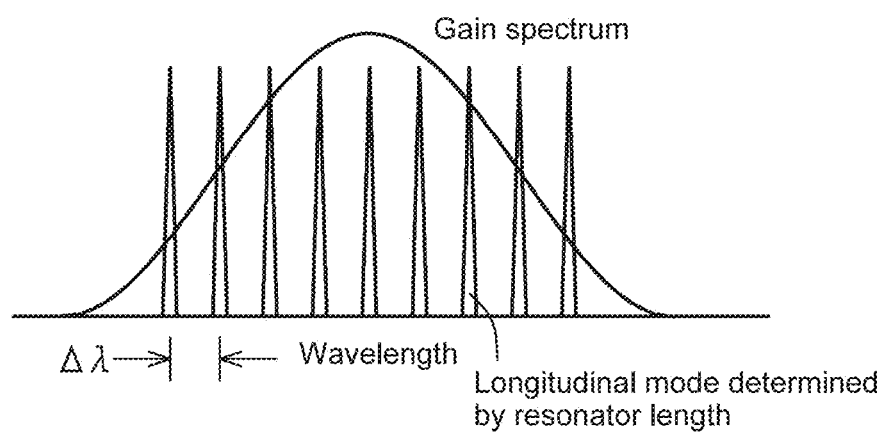

On the other hand, when the resonator length $L_{OR}$ is long, i.e., when the resonator length $L_{OR}$ is several times or more as large as the wavelength of the laser light emitted from the surface emitting laser element, a plurality of types of laser light in a longitudinal mode can be emitted from the surface emitting laser element (see the conceptual diagram of FIG. 12B). As a result, it can be difficult to accurately control the oscillating wavelength of the laser light emitted from the surface emitting laser element.

Specifically, when the laminated structure is constituted by a GaAs-based compound semiconductor layer, the resonator length $L_{OR}$ is generally short, i.e., the resonator length $L_{OR}$ is 1 μm or less and one type (one wavelength) of laser light in a longitudinal mode is emitted from the surface emitting laser element. Accordingly, it is possible to accurately control the oscillating wavelength of laser light in a longitudinal mode emitted from the surface emitting laser element. On the other hand, when the laminated structure is constituted by a GaN-based semiconductor layer, the resonator length $L_{OR}$ is generally several times as long as the wavelength of laser light emitted from the surface emitting laser element. Accordingly, a plurality of types of laser light in a longitudinal mode can be emitted from the surface emitting laser element. As a result, it can be difficult to accurately control the oscillating wavelength of the laser light emitted from the surface emitting laser element.

A light emitting element including light absorbing material layers in the present disclosure makes it possible to accurately control the oscillating wavelength of such emitted laser light. That is, in the light emitting element including the light absorbing material layers, at least two light absorbing material layers are formed inside a laminated structure. Therefore, since the oscillation of laser light in an undesired longitudinal mode among laser light in a plurality of types of longitudinal modes capable of being emitted from a surface emitting laser element can be suppressed, it is possible to accurately control the oscillating wavelength of the emitted laser light.

In such a light emitting element including the light absorbing material layers, at least four light absorbing material layers are preferably formed.

In the light emitting element including the light absorbing material layers having the above preferred mode, $$0.9 \times \{(m \cdot \lambda_0)/(2 \cdot n_{ep})\} \leq L_{Abs} \leq 1.1 \times \{(m \cdot \lambda_0)/(2 \cdot n_{ep})\} \quad \text{(B-1)}$$

is preferably satisfied when an oscillating wavelength (desired oscillating wavelength emitted from the light emitting element) is $\lambda_0$, the entire equivalent refractive index of the two light absorbing material layers and the portion of the laminated structure positioned between the light absorbing material layers is $n_{eq}$, and the distance between the light absorbing material layers is $L_{Abs}$. Here, m is one or any integer of two or more including one. The equivalent refractive index $n_{eq}$ is expressed by $$n_{eq} = \Sigma(t_i \times n_i)/\Sigma(t_i)$$

when the thicknesses and refractive indexes of the two light absorbing material layers and respective layers constituting the portion of the laminated structure positioned between the light absorbing material layers are $t_i$ and $n_i$, respectively. However, i is 1, 2, 3, . . . I, and "I" is the total number of the two light absorbing material layers and the layers constituting the portion of the laminated structure positioned between the light absorbing material layers, and "Σ" represents taking the total sum of i=1 to i=I. The equivalent refractive index $n_{eq}$ may be calculated on the basis of a known refractive index and a thickness obtained by observing respective constituting materials observed through the electron microscope observation or the like of the cross section of the light emitting element. When m is one, the distance between the adjacent light absorbing material layers satisfies $$0.9 \times \{\lambda_0/2 \cdot n_{eq}\} \leq L_{Abs} \leq 1.1 \times \{\lambda_0/2 \cdot n_{eq}\} \quad \text{(B-2)}$$

in all the plurality of light absorbing material layers. Further, if it is assumed that m is one or two as an example when m is any integer of two or more including one, the distance between the adjacent light absorbing material layers satisfies $$0.9 \times \{\lambda_0/2 \cdot n_{eq}\} \leq L_{Abs} \leq 1.1 \times \{\lambda_0/2 \cdot n_{eq}\} \quad \text{(B-2)}$$

in a part of the light absorbing material layers and the distance between the adjacent light absorbing material layers satisfies $$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\} \quad \text{(B-3)}$$

in the rest light absorbing material layers. In a broader sense, the distance between the adjacent light absorbing material layers satisfies $$0.9 \times \{\lambda_0/2 \cdot n_{eq}\} \leq L_{Abs} \leq 1.1 \times \{\lambda_0/2 \cdot n_{eq}\} \quad \text{(B-2)}$$

in a part of the light absorbing material layers and the distance between the adjacent light absorbing material layers satisfies $$0.9 \times \{(m' \cdot \lambda_0)/(2 \cdot n_{eq})\} \leq L_{Abs} \leq 1.1 \times \{(m' \cdot \lambda_0)/(2 \cdot n_{eq})\} \quad \text{(B-4)}$$

in the rest various light absorbing material layers.

Here, m' is any integer of two or more. Further, the distance between the adjacent light absorbing material layers is the distance between the gravities of the adjacent light absorbing material layers. That is, the distance between the adjacent light absorbing material layers is actually the distance between the centers of the respective light absorbing material layers when cut along a virtual plane in the thickness direction of the light emitting layer.

In addition, in the light emitting element including the light absorbing material layers having the above various preferred modes, the light absorbing material layers preferably have a thickness of $\lambda_0/(4 \cdot n_{eq})$ or less. As the lower limit value of the thickness of the light absorbing material layers, 1 nm can be exemplified.

In addition, in the light emitting element including the light absorbing material layers having the above various preferred modes, the light absorbing material layers can be positioned at a minimum amplitude portion occurring in the standing wave of light formed inside the laminated structure.

In addition, in the light emitting element including the light absorbing material layers having the above various preferred modes, the light emitting layer can be positioned at a maximum amplitude portion occurring in the standing wave of light formed inside the laminated structure.

In addition, in the light emitting element including the light absorbing material layers having the above various preferred modes, the light absorbing material layers can have a light absorbing coefficient twice or more as large as the light absorbing coefficient of a compound semiconductor constituting the laminated structure. Here, the light absorbing coefficient of the light absorbing material layers and the light absorbing coefficient of the compound semiconductor constituting the laminated structure can be calculated in such a manner as to observe constituting materials through the electron microscope observation or the like of the cross section of the light emitting element and make analogy from known evaluation results observed with respect to the respective constituting materials.

In addition, in the light emitting element including the light absorbing material layers having the above various preferred modes, the light absorbing material layers can be made of at least one type of a material selected from a group including a compound semiconductor material having a band gap narrower than that of the compound semiconductor constituting the laminated structure, a compound semiconductor material doped with impurities, a transparent conductive material, and a light reflecting layer constituting material having light absorbing characteristics. Here, examples of the compound semiconductor material having a band gap narrower than that of the compound semiconductor constituting the laminated structure can include InGaN when the compound semiconductor constituting the laminated structure is GaN, examples of the compound semiconductor material doped with impurities can include n-GaN doped with Si and n-GaN doped with B, examples of the transparent conductive material can include a transparent conductive material constituting an electrode described above, and examples of the light reflecting layer constituting material having light absorbing characteristics can include a material (such as, for example, $SiO_x$, $SiN_x$, and $TaO_x$) constituting a light reflecting layer described above. All the light absorbing material layers may be made of one type of a material among these materials. Alternatively, each of the light absorbing material layers may be made of various materials selected from these materials, but one light absorbing material layer is preferably made of one type of a material in terms of the simplification of the formation of the light absorbing material layers. The light absorbing material layers may be formed inside a first compound semiconductor layer, may be formed inside a second compound semiconductor layer, may be formed inside a first light reflecting layer, may be formed inside a second light reflecting layer, or may be formed inside any of these layers. Alternatively, the light absorbing material layers can also serve as an electrode made of a transparent conductive material described above.

Figure 8A:
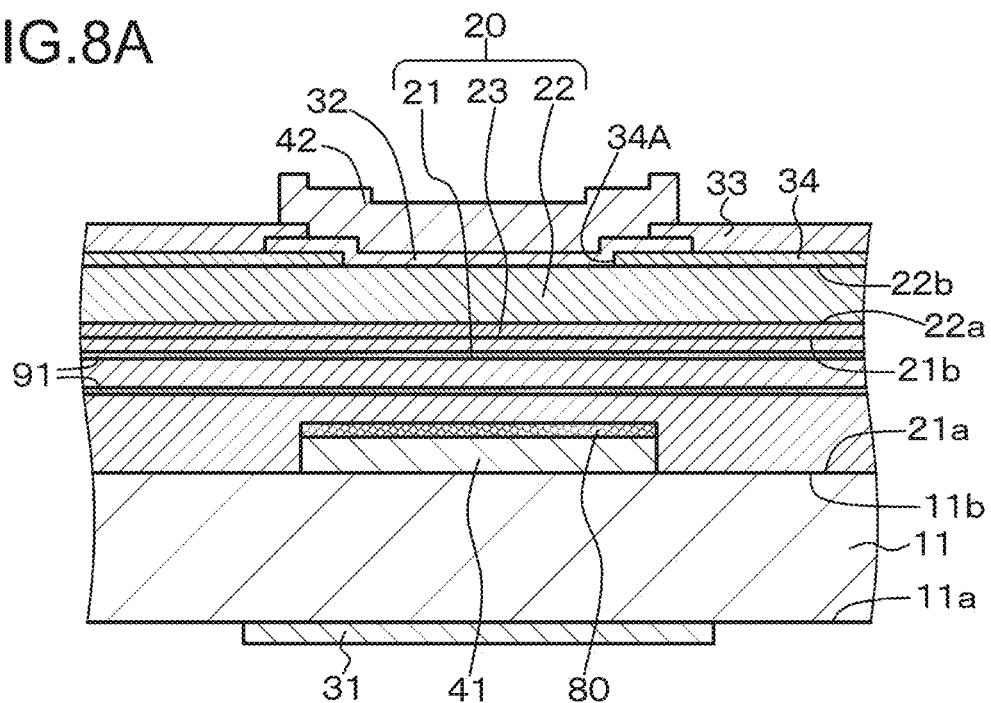
FIGS. 8A and 8B are a partial end view of the light emitting element of a fourth embodiment and a partial end view of an example in which the configuration and structure of the light emitting element of the second embodiment shown in FIG. 6A are applied to the light emitting element of the fourth embodiment, respectively.

As shown in the schematic partial cross-sectional view of FIG. 8A, the laminated structure 20 having a second electrode 32 has at least two light absorbing material layers 91, preferably at least four light absorbing material layers 91, and specifically 20 light absorbing material layers 91 in the fourth embodiment in parallel with a virtual plane occupied by a light emitting layer 23 in the light emitting element of the fourth embodiment or the light emitting elements of fifth and sixth embodiments that will be described later. Note that only the two light absorbing material layers 91 are shown for simplification in the drawing.

An oscillating wavelength (desired oscillating wavelength emitted from the light emitting element) $\lambda_0$ is 450 nm. The 20 light absorbing material layers 91 are made of a compound semiconductor material having a band gap narrower than that of a compound semiconductor constituting the laminated structure 20, specifically n-$In_{0.2}Ga_{0.8}N$, and formed inside the first compound semiconductor layer 21. The light absorbing material layers 91 have a thickness of $\lambda_0/(4 \cdot n_{eq})$ or less, specifically 3 mm. Further, the light absorbing material layers 91 have a light absorbing coefficient twice or more, specifically $1 \times 10^3$ times as large as the light absorbing coefficient of the first compound semiconductor layer 21 made of an n-GaN layer.

Further, the light absorbing material layers 91 are positioned at a minimum amplitude portion occurring in the standing wave of light formed inside the laminated structure, and the light emitting layer 23 is positioned at a maximum amplitude portion occurring in the standing wave of light formed inside the laminated structure. The distance between the center in the thickness direction of the light emitting layer 23 and the center in the thickness direction of the light absorbing material layers 91 adjacent to the light emitting layer 23 is 46.5 nm. In addition, $$0.9 \times \{(m \cdot \lambda_0)/(2 \cdot n_{ep})\} \leq L_{Abs} \leq 1.1 \times \{(m \cdot \lambda_0)/(2 \cdot n_{ep})\} \quad \text{(B-1)}$$

is satisfied when the entire equivalent refractive index of the two light absorbing material layers 91 and the portion of the laminated structure positioned between the light absorbing material layers 91 (specifically, the first compound semiconductor layer 21 in the fourth embodiment) is $n_{eq}$ and the distance between the light absorbing material layers 91 is $L_{Abs}$. Here, m is one or any integer of two or more including one. However, in the fourth embodiment, m is one. Accordingly, the distance between the adjacent light absorbing material layer 91 satisfies $$0.9 \times \{\lambda_0/2 \cdot n_{eq}\} \leq L_{Abs} \leq 1.1 \times \{\lambda_0/2 \cdot n_{eq}\} \quad \text{(B-2)}$$

in all the plurality of light absorbing material layers 91 (the 20 light absorbing material layers 91). The value of the equivalent refractive index $n_{eq}$ is specifically 2.41 and expressed by $$L_{Abs} = 1 \times 450/(2 \times 2.42) = 93.0 \text{ nm}$$

when m is one. Note that m can be any integer of two or more in a part of the light absorbing material layers 91 inside the 20 light absorbing material layers 91.

The light emitting element of the fourth embodiment can be obtained in such a manner that the 20 light absorbing material layers 91 are simultaneously formed inside the first compound semiconductor layer 21 when the first compound semiconductor layer 21 is formed.

Figure 11:
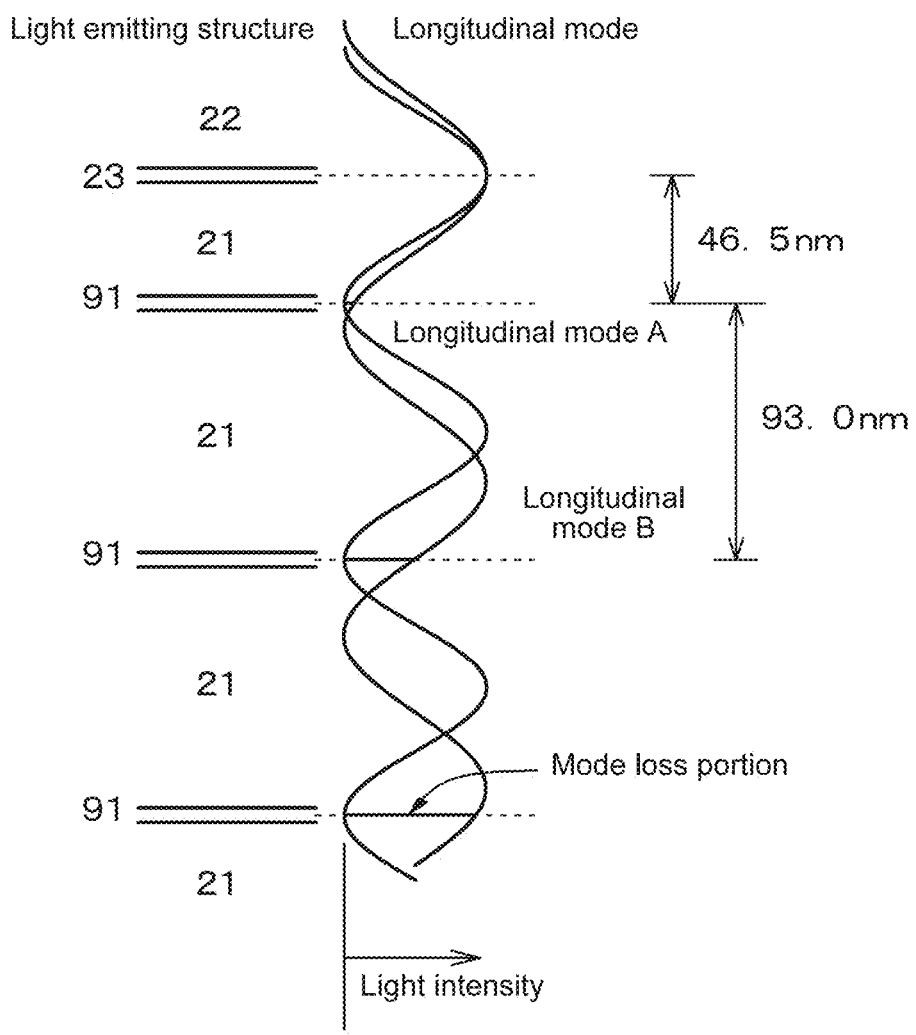
FIG. 11 is a diagram in which a schematic partial cross-sectional view of the light emitting element of the fourth embodiment and the two longitudinal modes of longitudinal modes A and B overlap each other.

A plurality of longitudinal modes occurring in a gain spectrum determined by the light emitting layer 23 are schematically expressed as shown in FIG. 11. Note that two longitudinal modes A and B are shown in FIG. 11. Further, it is assumed in this case that the light absorbing material layers 91 are positioned at the minimum amplitude portion of the longitudinal mode A and are not positioned at the minimum amplitude portion of the longitudinal mode B. As a result, the mode loss of the longitudinal mode A is minimized, but the mode loss of the longitudinal mode B is large. In FIG. 11, the mode loss portion of the longitudinal mode B is schematically shown by solid lines in FIG. 11. Accordingly, the longitudinal mode A facilitates oscillation compared with the longitudinal mode B. Therefore, the employment of such a structure, that is, the control of the position or the cycle of the light absorbing material layers 91 can stabilize a specific longitudinal mode and facilitate oscillation. On the other hand, since the mode loss of the other undesirable longitudinal mode can be increased, it is possible to suppress the oscillation of the other undesired longitudinal mode.

As described above, at least the two light absorbing material layers are formed inside the laminated structure in the light emitting element of the fourth embodiment. Therefore, the oscillation of laser light in an undesired longitudinal mode among laser light in a plurality of types of longitudinal modes capable of being emitted from the surface emitting laser element can be suppressed. As a result, it is possible to accurately control the oscillating wavelength of emitted laser light.

Figure 7B:
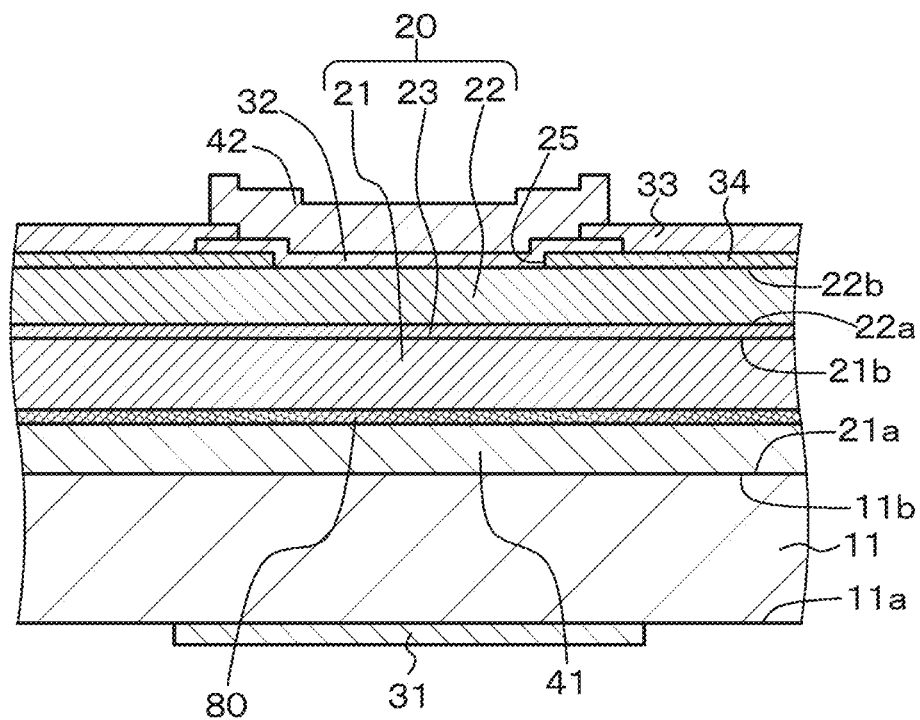
Figure 8B:
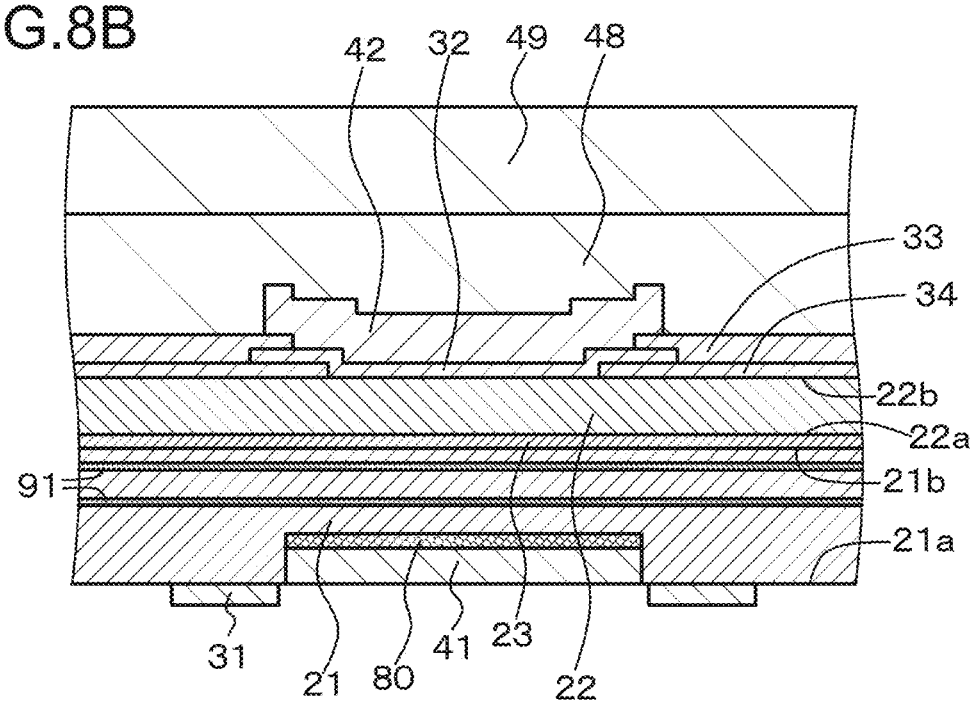
Figure 9A:
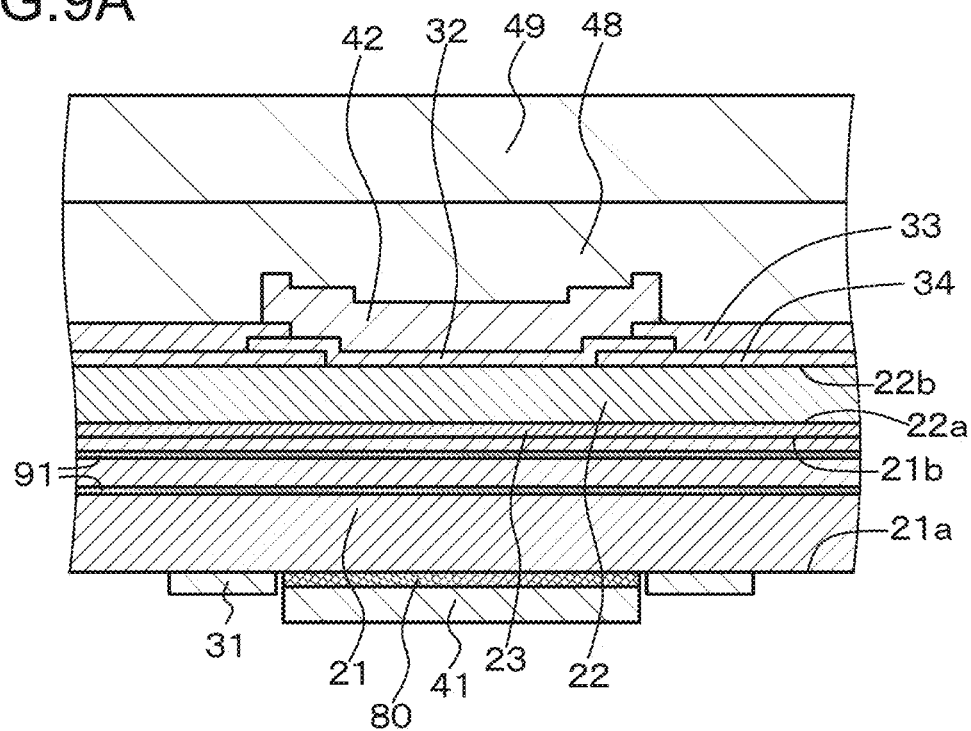
FIGS. 9A and 9B are a partial end view of an example in which the configuration and structure of the modified example of the light emitting element of the second embodiment shown in FIG. 6B are applied to the light emitting element of the fourth embodiment and a schematic partial end view of an example in which the configuration and structure of the modified example of the light emitting element of the second embodiment shown in FIG. 7A are applied to the light emitting element of the fourth embodiment, respectively.
Figure 9B:
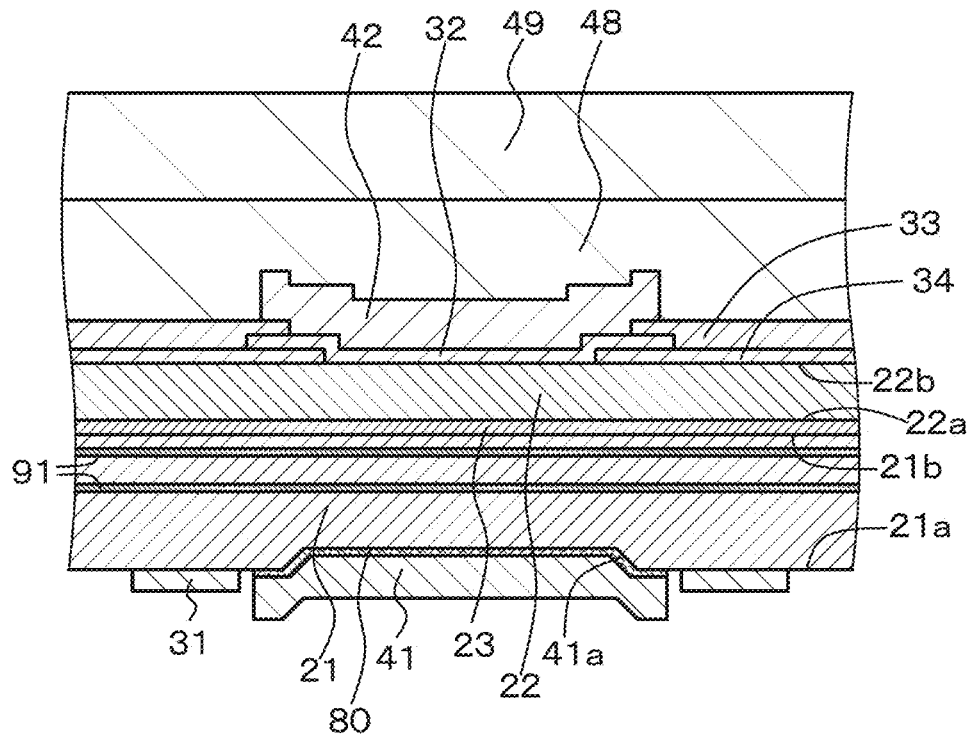
Figure 10:
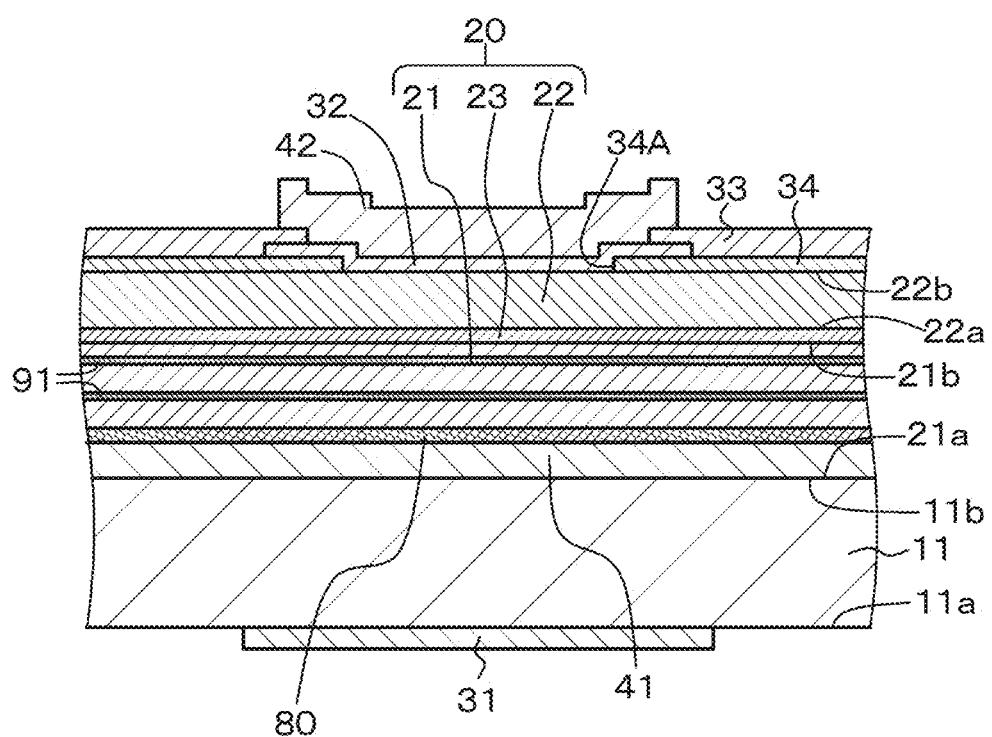
FIG. 10 is a schematic partial end view of an example in which the configuration and structure of the light emitting element of the third embodiment shown in FIG. 7B are applied to the light emitting element of the fourth embodiment.

An example in which the configuration and structure of the light emitting element of the second embodiment shown in FIG. 6A are applied to the light emitting element of the fourth embodiment is shown in the schematic partial end view of FIG. 8B. An example in which the configuration and structure of a modified example of the light emitting element of the second embodiment shown in FIG. 6B are applied to the light emitting element of the fourth embodiment is shown in the schematic partial end view of FIG. 9A. An example in which the configuration and structure of a modified example of the light emitting element of the second embodiment shown in FIG. 7A are applied to the light emitting element of the fourth embodiment is shown in the schematic partial end view of FIG. 9B. An example in which the configuration and structure of the light emitting element of the third embodiment shown in FIG. 7B are applied to the light emitting element of the fourth embodiment is shown in the schematic partial end view of FIG. 10.

Fifth Embodiment

A fifth embodiment is a modification of the fourth embodiment. In the fourth embodiment, the light absorbing material layers 91 are made of a compound semiconductor material having a band gap narrower than that of a compound semiconductor constituting the laminated structure 20. On the other hand, in the fifth embodiment, ten light absorbing material layers 91 are made of a compound semiconductor material doped with impurities, specifically a compound semiconductor material (specifically, n-GaN: Si) having an impurity concentration (impurities: Si) of $1\times10^{19}/\text{cm}^3$. Further, an oscillating wavelength $\lambda_0$ is 515 nm in the fifth embodiment. Note that the composition of a light emitting layer 23 is $In_{0.3}Ga_{0.7}N$. In the fifth embodiment, m is one, the value of $L_{Abs}$ is 107 nm, the distance between the center in the thickness direction of a light emitting layer 23 and the center in the thickness direction of the light absorbing material layers 91 adjacent to the light emitting layer 23 is 53.5 nm, and the thickness of the light absorbing material layers 91 is 3 nm. Since the configuration and structure of the light emitting element of the fifth embodiment are the same as those of the light emitting element of the fourth embodiment other than the above points, their detailed descriptions will be omitted. Note that m can be any integer of two or more in some of the ten light absorbing material layers 91.

Sixth Embodiment

A sixth embodiment is also a modification of the fourth embodiment. In the sixth embodiment, five light absorbing material layers (called "first light absorbing material layers" for the sake of convenience) have the same configuration as that of the light absorbing material layers 91 of the fourth embodiment, that is, the five light absorbing material layers are made of $n\text{-}In_{0.3}Ga_{0.7}N$. In addition, in the sixth embodiment, one light absorbing material layer (called a "second light absorbing material layer" for the sake of convenience) is made of a transparent conductive material. Specifically, the second light absorbing material layer also serves as a second electrode made 32 of ITO. In the sixth embodiment, an oscillating wavelength $\lambda_0$ is 450 nm. Further, m is one or two. When m is one, the value of $L_{Abs}$ is 93.0 nm, the distance between the center in the thickness direction of a light emitting layer 23 and the center in the thickness direction of the first light absorbing material layers adjacent to the light emitting layer 23 is 46.5 nm, and the thickness of the five light absorbing material layers is 3 nm. That is, $$0.9\times\{\lambda_0/2\cdot n_{eq}\}\leq L_{Abs}\leq 1.1\times\{\lambda_0/2\cdot n_{eq}\} \quad (B\text{-}2)$$

is satisfied in the five first light absorbing material layers. Further, in the first light absorbing material layers adjacent to the light emitting layer 23 and the second light absorbing layer, m is two. That is, $$0.9\times\{(2\cdot\lambda_0)/(2\cdot n_{eq})\}\leq L_{Abs}\leq 1.1\times\{(2\cdot\lambda_0)/(2\cdot n_{eq})\} \quad (B\text{-}3)$$

is satisfied. The one second light absorbing material layer serving as the second electrode 32 has a light absorbing coefficient of 200 cm$^1$ and a thickness of 30 nm, and a distance from the light emitting layer 23 to the second light absorbing material layer is 139.5 nm. Since the configuration and structure of the light emitting element of the sixth embodiment can be the same as those of the light emitting element of the fourth embodiment other than the above point, their detailed descriptions will be omitted. Note that m can be any integer of two or more in some of the five first light absorbing material layers. Note that the number of the light absorbing material layers 91 can be one unlike the fourth embodiment. In this case as well, the positional relationship between the second light absorbing material layer serving as the second electrode 32 and the light absorbing material layers 91 is required to satisfy the following formula.

$$0.9\times\{(m\cdot\lambda_0)/(2\cdot n_{ep})\}\leq L_{Abs}\leq 1.1\times\{(m\cdot\lambda_0)/(2\cdot n_{ep})\} \quad (B\text{-}1)$$

Seventh Embodiment

A seventh embodiment is a modification of the first to sixth embodiments. In the light emitting element of the seventh embodiment or the light emitting elements of eighth to eighteenth embodiments that will be described later, a first light reflecting layer and a film thickness modulating layer (hereinafter collectively called "a first light reflecting layer and the like" for the sake of convenience) have a concave mirror part, and a second light reflecting layer has a flat shape. Note that the light emitting element of the seventh embodiment or the light emitting elements of the eighth to eighteenth embodiments described above will be called "light emitting elements having a concave mirror part according to the present disclosure" for the sake of convenience.

Meanwhile, when a laminated structure is constituted by a GaAs-based compound semiconductor, a resonator length $L_{OR}$ is about 1 µm. On the other hand, when the laminated structure is constituted by a GaN-based compound semiconductor, the resonator length $L_{OR}$ is generally several times as long as the wavelength of laser light emitted from a surface emitting laser element. That is, the resonator length $L_{OR}$ is considerably longer than 1 µm. Further, when the resonator length $L_{OR}$ becomes long as described above, laser oscillation may become difficult due to an increase in diffraction loss unlike a conventional GaAs-based surface emitting laser element having a resonator length $L_{OR}$ of about 1 µm. That is, the laminated structure may not function as a surface emitting laser element but may function as an LED. Here, the "diffraction loss" represents a phenomenon in which laser light going to a resonator and back gradually deviates to the outside of the resonator since the light generally tends to be scattered and lost due to its diffraction effect. Further, when the laminated structure is constituted by the GaN-based compound semiconductor, the problem of heat saturation is caused. Here, the "heat saturation" represents a phenomenon in which a light output is saturated due to self-heating when a surface emitting laser element is driven. A material (such as, for example, $SiO_2$ and $Ta_2O_5$) used in a light reflecting layer has a heat conductivity value lower than that of the GaN-based compound semiconductor. Accordingly, an increase in the thickness of a GaN-based compound semiconductor layer leads to the suppression of the heat saturation. However, since the increase in the thickness of the GaN-based compound semiconductor layer results in an increase in the resonator length $L_{OR}$, the above problem is caused. A technology to impart a function as a concave mirror to a light reflecting layer is publicly known from, for example, Japanese Patent Application Laid-open No. 2006-114753 or Japanese Patent Application Laid-open No. 2000-022277. However, such unexamined patent publications do not mention the problem of an increase in diffraction loss due to an increase in the resonator length $L_{OR}$ and the problem of heat saturation at all.

In a light emitting element having a concave mirror part according to the present disclosure, a first light reflecting layer and the like have a concave mirror part. Therefore, light diffracting and spreading with a light emitting layer as a start and then incident on the first light reflecting layer can be reliably reflected toward the light emitting layer and condensed into the light emitting layer. Accordingly, an increase in diffraction loss can be avoided, and laser oscillation can be reliably performed. Besides, it is possible to avoid the problem of heat saturation with a long resonator.

Further, in the light emitting element having the concave mirror part according to the present disclosure described above, $1 \times 10^5$ m $\leq L_{OR}$ is preferably satisfied when a resonator length is $L_{OR}$.

In the light emitting element having the concave mirror part according to the present disclosure including the above preferred mode, a graphic drawn by an interface (specifically, the interface between a film thickness modulating layer and a laminated structure) at which a part of the concave mirror part constituted by a first light reflecting layer and the like faces the laminated structure when the first light reflecting layer and the like are cut along a virtual plane including the laminating direction of the laminated structure can be a part of a circle or a part of a parabola. In some cases, the graphic is not strictly a part of a circle or a part of a parabola. That is, a case in which the graphic is substantially a part of a circle and a case in which the graphic is substantially a part of a parabola are also included in the mode in which "the graphic is a part of a circle or a part of a parabola." In some cases, the portion (region) of the first light reflecting layer and the like that is a part of a circle or a part of a parabola is called an "effective region in the concave mirror part of the first light reflecting layer and the like." Note that the graphic drawn by the interface at which a part of the concave mirror part faces the laminated structure can be calculated in such a manner that the shape of the interface is measured with a measuring device and obtained data is analyzed on the basis of a least square method.

In the light emitting element having the concave mirror part according to the present disclosure including the above preferred mode, a second compound semiconductor layer is provided with a current injecting region and a current non-injecting region surrounding the current injecting region, and a shortest distance $D_{CI}$ from the area gravity point of the current injecting region to the boundary between the current injecting region and the current non-injecting region can satisfy the following formula. Here, the light emitting element thus configured will be called a "light emitting element having a first configuration" for the sake of convenience. Note that reference is made to, for example, H. Kogelnik and T. Li, "Laser Beams and Resonators", Applied Optics/Vol. 5, No. 10/October 1966 to derive the following formula. Further, $\omega_0$ is also called a beam waist radius.

$$D_{CI} \geq \omega_0/2 \qquad (C\text{-}1)$$

However, $$\omega_0^2 \equiv (\lambda_0/\pi)\{L_{OR}(R_{DBR}-L_{OR})\}^{1/2} \qquad (C\text{-}2)$$

where $\lambda_0$: the wavelength of light mainly emitted from the light emitting element (oscillating wavelength)

$L_{OR}$: an oscillator length $R_{DBR}$: the curvature radius of the concave mirror part constituted by the first light reflecting layer and the like Here, the light emitting element having the concave mirror part according to the present disclosure has the concave mirror part only in the first light reflecting layer and the like. However, in consideration of a symmetric property with respect to the flat mirror of a second light reflecting layer, the resonator can be extended to a Fabry-Perot type resonator held by two concave mirror parts having the same curvature radius (see the schematic view of FIG. 37). Here, the resonator length of the virtual Fabry-Perot type resonator is twice the resonator length $L_{OR}$. The graphs of the relationships between the value of $\omega_0$, the value of the resonator length $L_{OR}$, and the value of the curvature radius $R_{DBR}$ of the concave mirror part constituted by the first light reflecting layer and the like are shown in FIGS. 38 and 39. Note that when the value of $\omega_0$ is "negative," that is, when the value of the curvature radius $R_{DBR}$ is smaller than that of the resonator length $L_{OR}$, an optical field is excessively confined to cause diffraction loss. Therefore, the value of the curvature radius $R_{DBR}$ is preferably larger than that of the resonator length $L_{OR}$. Note that when a light emitting layer is arranged close to a flat light reflecting layer, specifically the second light reflecting layer among the two light reflecting layers, the optical field is further condensed into the light emitting layer. That is, the optical field is strongly confined in the light emitting layer, and laser oscillation is facilitated. The position of the light emitting layer, that is, a distance from the surface of the second light reflecting layer facing the second compound semiconductor layer to the light emitting layer is not limited, but $\lambda_0/2$ to $10\lambda_0$ can be exemplified as such.

Meanwhile, when a region into which light reflected by the first light reflecting layer is condensed is not included in the current injecting region corresponding to a region in which the light emitting layer is caused to have gain by the injection of a current, the stimulated emission of light from a carrier and also laser oscillation may be inhibited. By satisfying the above formulae (C-1) and (C-2), it is possible to assure the inclusion of the region into which light reflected by the first light reflecting layer is condensed in the current injecting region and reliably achieve laser oscillation.

The light emitting element having the first configuration further includes:
- a mode loss affecting portion provided on a second surface of a second compound semiconductor layer and constituting a mode loss affecting region affecting an increase and decrease in oscillation mode loss;
- a second electrode formed over the mode loss affecting portion from above the second surface of the second compound semiconductor layer; and
- a first electrode electrically connected to a first compound semiconductor layer.

A second light reflecting layer is formed on the second electrode,
- a laminated structure has a current injecting region, a current non-injecting inside region surrounding the current injecting region, and a current non-injecting outside region surrounding the current non-injecting inside region, and
- an orthogonal projection image of the mode loss affecting region and an orthogonal projection image of the current non-injecting outside region can overlap each other.

Further, in the light emitting element having the first configuration including such a preferred configuration, a radius $r'_{DBR}$ of an effective region in a concave mirror part constituted by a first light reflecting layer and the like can satisfy $\omega_0 \leq r'_{DBR} \leq 20 \cdot \omega_0$ and preferably satisfy $\omega_0 r'_{DBR} \leq 10 \cdot \omega_0$. Alternatively, as the value of $r'_{DBR}$, $r'_{DBR} \leq 1 \times 10^{-4}$ m and preferably $r'_{DBR}$ $5 \times 10^{-5}$ m can be exemplified. Further, as a height $h_{DBR}$ of a base part, $h_{DBR} \leq 5 \times 10^{-5}$ m can be exemplified. In addition, in the light emitting element having the first configuration including such a preferred configuration, $D_{CI} \geq \omega_0$ can be satisfied. In addition, in the light emitting element having the first configuration including such a preferred configuration, $R_{DBR} \leq 1 \times 10^{-3}$ m, preferably $1 \times 10^{-5}$ m $\leq R_{DBR} \leq 1 \times 10^{-3}$ m, and more preferably $1 \times 10^{-5}$ m $\leq R_{DBR} \leq 1 \times 10^{-4}$ m can be satisfied.

The light emitting element having the concave mirror part according to the present disclosure having the above preferred mode further includes:
- a mode loss affecting portion provided on a second surface of a second compound semiconductor layer and constituting a mode loss affecting region affecting an increase and decrease in oscillation mode loss;
- a second electrode formed over the mode loss affecting portion from above the second surface of the second compound semiconductor layer; and
- a first electrode electrically connected to a first compound semiconductor layer.

A second light reflecting layer is formed on the second electrode,
- a laminated structure has a current injecting region, a current non-injecting inside region surrounding the current injecting region, and a current non-injecting outside region surrounding the current non-injecting inside region, and
- an orthogonal projection image of the mode loss affecting region and an orthogonal projection image of the current non-injecting outside region can overlap each other. Here, the light emitting element thus configured will be called a "light emitting element having a second configuration" for the sake of convenience.

Alternatively, the light emitting element having the concave mirror part according to the present disclosure having the above preferred mode further includes:
- a second electrode formed on a second surface of a second compound semiconductor layer;
- a second light reflecting layer formed on the second electrode;
- a mode loss affecting portion provided on a first surface of a first compound semiconductor layer and constituting a mode loss affecting region affecting an increase and decrease in oscillation mode loss; and
- a first electrode electrically connected to the first compound semiconductor layer.

A first light reflecting layer and the like are formed over the mode loss affecting portion from above the first surface of the first compound semiconductor layer,
- a laminated structure has a current injecting region, a current non-injecting inside region surrounding the current injecting region, and a current non-injecting outside region surrounding the current non-injecting inside region, and
- an orthogonal projection image of the mode loss affecting region and an orthogonal projection image of the current non-injecting outside region can overlap each other. Here, the light emitting element thus configured will be called a "light emitting element having a third configuration" for the sake of convenience. Note that the provisions of the light emitting element having the third configuration can be applied to the light emitting element having the first configuration.

In the light emitting element having the second configuration or the light emitting element having the third configuration, the laminated structure has a current non-injecting region (a generic name for the current non-injecting inside region and the current non-injecting outside region). However, in a thickness direction, the current non-injecting region may be specifically formed in a region on the side of the second electrode of the second compound semiconductor layer, may be formed at the entire second compound semiconductor layer, may be formed at the second compound semiconductor layer and the light emitting layer, or may be formed over a part of the first compound semiconductor layer from the second compound semiconductor layer. An orthogonal projection image of the mode loss affecting region and an orthogonal projection image of the current non-injecting outside region overlap each other, but may not overlap each other in a region substantially away from the current injecting region.

In the light emitting element having the second configuration, the current non-injecting outside region can be positioned below the mode loss affecting region.

In the light emitting element having the second configuration including the above preferred configuration, $$0.01 \leq S_1/(S_1+S_2) \leq 0.7 \tag{D-1}$$

can be satisfied when the area of an orthogonal projection image of the current injecting region is $S_1$ and the area of an orthogonal projection image of the current non-injecting inside region is $S_2$. Further, in the light emitting element having the third configuration, $$0.01 \leq S_{1'}/(S_{1'}+S_{2'}) \leq 0.7 \tag{D-2}$$

can be satisfied when the area of an orthogonal projection image of the current injecting region is $S_{1'}$ and the area of an orthogonal projection image of the current non-injecting inside region is $S_{2'}$. However, the range of $S_1/(S_1+S_2)$ and the range of $S_{1'}/(S_{1'}+S_{2'})$ are not limited to the above ranges.

In the light emitting element having the second configuration or the light emitting element having the third configuration including the above preferred configuration, the current non-injecting inside region and the current non-injecting outside region can be formed by ion implantation into the laminated structure. The light emitting elements thus configured will be called a "light emitting element having a second-A configuration" and a "light emitting element having a third-A configuration" for the sake of convenience. In this case, an ion type can be at least one type of ion selected from a group including boron, proton, phosphor, arsenic, carbon, nitrogen, fluorine, oxygen, germanium, and silicon (that is, one type of ion or two types of ion).

Alternatively, in the light emitting element having the second configuration or the light emitting element having the third configuration including the above preferred configuration, the current non-injecting inside region and the current non-injecting outside region can be formed by irradiation of plasma onto the second surface of the second compound semiconductor layer, ashing of the second surface of the second compound semiconductor layer, or reactive ion etching of the second surface of the second compound semiconductor layer. The light emitting elements thus configured will be called a "light emitting element having a second-B configuration" and a "light emitting element having a third-B configuration" for the sake of convenience. Since the current non-injecting inside region and the current non-injecting outside region are exposed to plasma particles in these processing, the conductivity of the second compound semiconductor layer is degraded, whereby the current non-injecting inside region and the current non-injecting outside region become highly resistant. That is, the current non-injecting inside region and the current non-injecting outside region can be formed by making the second surface of the second compound semiconductor layer exposed to the plasma particles. Specifically, examples of the plasma particles can include argon, oxygen, and nitrogen.

Alternatively, in the light emitting element having the second configuration or the light emitting element having the third configuration including the above preferred configuration, the second light reflecting layer can have a region that reflects or scatters light from the first light reflecting layer toward the outside of a resonator structure constituted by the first light reflecting layer and the second light reflecting layer. The light emitting elements thus configured will be called a "light emitting element having a second-C configuration" and a "light emitting element having a third-C configuration" for the sake of convenience. Specifically, the region of the second light reflecting layer positioned above the lateral wall of the mode loss affecting portion (the lateral wall of an opening part provided in the mode loss affecting portion) has a forward tapered inclination or a region curved in a convex shape toward the first light reflecting layer and the like. Alternatively, in the light emitting element having the second configuration or the light emitting element having the third configuration including the above preferred mode, the first light reflecting layer can have a region that reflects or scatters light from the second light reflecting layer toward the outside of a resonator structure constituted by the first light reflecting layer and the second light reflecting layer. Specifically, a partial region of the first light reflecting layer and the like may only have a forward tapered inclination or a convex-shaped curved part toward the second light reflecting layer, or the region of the first light reflecting layer and the like positioned above the lateral wall of the mode loss affecting portion (the lateral wall of an opening part provided in the mode loss affecting portion) may only have a forward tapered inclination or a region curved in a convex shape toward the second light reflecting layer. Further, by the scattering of light at the boundary (lateral wall edge part) between the top surface of the mode loss affecting portion and the lateral wall of the opening part provided in the mode loss affecting portion, light can be scattered toward the outside of the resonator structure constituted by the first light reflecting layer and the second light reflecting layer.

In the light emitting element having the second-A configuration, the light emitting element having the second-B configuration, or the light emitting element having the second-C configuration described above, $$L_0 > L_2$$

can be satisfied when an optical distance from the light emitting layer to the second surface of the second compound semiconductor layer in the current injecting region is $L_2$ and an optical distance from the light emitting layer to the top surface of the mode loss affecting portion in the mode loss affecting region is $L_0$.

Further, in the light emitting element having the third-A configuration, the light emitting element having the third-B configuration, or the light emitting element having the third-C configuration described above, $$L_{0'} > L_{1'}$$

can be satisfied when an optical distance from the light emitting layer to the first surface of the first compound semiconductor layer in the current injecting region is $L_{1'}$ and an optical distance from the light emitting layer to the top surface of the mode loss affecting portion in the mode loss affecting region is $L_{0'}$. In addition, in the light emitting element having the second-A configuration, the light emitting element having the third-A configuration, the light emitting element having the second-B configuration, the light emitting element having the third-B configuration, the light emitting element having the second-C configuration, or the light emitting element having the third-C configuration described above including these configurations, generated light having a higher order mode is scattered and lost by the mode loss affecting region toward the outside of the resonator structure constituted by the first light reflecting layer and the second light reflecting layer, whereby oscillating mode loss can be increased. That is, the generated optical field intensity of a basic mode and a higher order mode decreases in proportion to a distance from the Z-axis in an orthogonal projection image of the mode loss affecting region due to the existence of the mode loss affecting region affecting an increase and decrease in oscillating mode loss. However, the basic mode can be further stabilized since the mode loss of the higher order mode is larger than the decrease in the optical field intensity of the basic mode, and a threshold current can be reduced since the mode loss can be further suppressed compared with a case in which the current non-injecting inside region does not exist.

Further, in the light emitting element having the second-A configuration, the light emitting element having the third-A configuration, the light emitting element having the second-B configuration, the light emitting element having the third-B configuration, the light emitting element having the second-C configuration, or the light emitting element having the third-C configuration described above, the mode loss affecting portion can be made of a dielectric material, a metal material, or an alloy material. As the dielectric material, $SiO_x$, $SiN_x$, $AlN_x$, $AlO_x$, $TaO_x$, and $ZrO_x$ can be exemplified. As the metal material or the alloy material, titanium, gold, platinum, or the alloy of titanium, gold, and platinum can be exemplified. However, the dielectric material, the metal material, and the alloy material are not limited to these materials. By causing the mode loss affecting portion made of these materials to absorb light, the mode loss can be increased. Alternatively, the mode loss can be controlled by dephasing light without directly absorbing the light. In this case, the mode loss affecting portion can be made of a dielectric material, and the value of an optical film thickness to of the mode loss affecting portion can be a value other than an integral multiple of ¼ of a wavelength $\lambda_0$ of light generated by the light emitting element. That is, light orbiting inside the resonator and forming a standing wave is dephased in the mode loss affecting portion to break the standing wave, and corresponding mode loss can be given. Alternatively, the mode loss affecting portion can be made of a dielectric material, and the value of the optical film thickness to of the mode loss affecting portion (having a refractive index no) can be an integral multiple of ¼ of the wavelength $\lambda_0$ of the light generated by the light emitting element. That is, the optical film thickness to of the mode loss affecting portion can be thickness with which light generated by the light emitting element is not dephased and the standing wave is not broken. However, the value of the optical film thickness to is not necessarily strictly an integral multiple of ¼ but may only satisfy $$(\lambda_0/4n_0) \times m - (\lambda_0/8n_0) \leq t_0 \leq (\lambda_0/4n_0) \times 2m + (\lambda_0/8n_0) \qquad (E).$$

Alternatively, the mode loss affecting portion is made of a dielectric material, a metal material, or an alloy material, whereby light passing through the mode loss affecting portion can be dephased or absorbed by the mode loss affecting region. Further, by the employment of these configurations, the control of the oscillating mode loss can be performed with a higher degree of freedom and the degree of freedom in designing the light emitting element can be further enhanced.

Alternatively, in the light emitting element having the second configuration including the above preferred configuration, a convex part can be formed on the side of the second surface of the second compound semiconductor layer, and the mode loss affecting portion can be formed on the region of the second surface of the second compound semiconductor layer surrounding the convex part. The light emitting element thus configured will be called a "light emitting element having a second-D configuration" for the sake of convenience. The convex part occupies the current injecting region and the current non-injecting inside region.

In this case, $L_0 < L_2$ can be satisfied when an optical distance from the light emitting layer to the second surface of the second compound semiconductor layer in the current injecting region is $L_2$ and an optical distance from the light emitting layer to the top surface of the mode loss affecting portion in the mode loss affecting region is $L_0$. In addition, in these cases, generated light having a higher order mode is confined in the current injecting region and the current non-injecting inside region by the mode loss affecting region, whereby oscillating mode loss can be decreased. That is, the generated optical field intensity of a basic mode and a higher order mode increases in an orthogonal projection image of the current injecting region and the current non-injecting inside region due to the existence of the mode loss affecting region affecting an increase and decrease in oscillating mode loss. In addition, in these cases, the mode loss affecting portion can be made of a dielectric material, a metal material, or an alloy material. Here, examples of the dielectric material, the metal material, or the alloy material can include various materials described above.

Alternatively, in the light emitting element having the third configuration including the above preferred configuration, a convex part can be formed on the side of the first surface of the first compound semiconductor layer, and the mode loss affecting portion can be formed on the region of the first surface of the first compound semiconductor layer surrounding the convex part or can be constituted by the region of the first compound semiconductor layer surrounding the convex part. The light emitting element thus configured will be called a "light emitting element having a third-D configuration" for the sake of convenience. The convex part matches orthogonal projection images of the current injecting region and the current non-injecting inside region.

In this case, $L_0 < L_1$ can be satisfied when an optical distance from the light emitting layer to the first surface of the first compound semiconductor layer in the current injecting region is $L_1$ and an optical distance from the light emitting layer to the top surface of the mode loss affecting portion in the mode loss affecting region is $L_0$. In addition, in these cases, a convex part can be formed on the side of the first surface of the first compound semiconductor layer, and the mode loss affecting portion can be constituted by the region of the first surface of the first compound semiconductor layer surrounding the convex part. In addition, in these cases, generated light having a higher order mode is confined in the current injecting region and the current non-injecting inside region by the mode loss affecting region, whereby oscillating mode loss can be decreased. In addition, in these cases, the mode loss affecting portion can be made of a dielectric material, a metal material, or an alloy material. Here, examples of the dielectric material, the metal material, or the alloy material can include various materials described above.

In addition, in the light emitting element having the concave mirror part according to the present disclosure including the preferred modes and configurations (including the light emitting element having the first configuration to the light emitting element having the third configuration) described above, the laminated structure including the second electrode can have at least two light absorbing material layers in parallel with a virtual plane occupied by the light emitting layer like the fourth embodiment. Here, the light emitting element thus configured will be called a "light emitting element having a fourth configuration" for the sake of convenience.

In the light emitting element having the fourth configuration, at least four light absorbing material layers are preferably formed like the fourth embodiment.

In the light emitting element having the fourth configuration including the above preferred configuration, the above formulae (B-1), (B-2), (B-3), and (B-4) are preferably satisfied when an oscillating wavelength (the wavelength of light mainly emitted from the light emitting element, a desired oscillating wavelength) is Xo, the entire equivalent refractive index of two light absorbing material layers and the portion of the laminated structure positioned between the light absorbing material layers is $n_{eq}$, and the distance between the light absorbing material layers is $L_{Abs}$ like the fourth embodiment.

In addition, in the light emitting element having the fourth configuration including the above various preferred configurations, the light absorbing material layers preferably have a thickness of $\lambda_0/(4 \cdot n_{eq})$ or less like the fourth embodiment. As the lower limit value of the thickness of the light absorbing material layers, 1 nm can be exemplified.

In addition, in the light emitting element having the fourth configuration including the above various preferred configurations, the light absorbing material layers can be positioned at a minimum amplitude portion occurring in the standing wave of light formed inside the laminated structure like the fourth embodiment.

In addition, in the light emitting element having the fourth configuration including the above various preferred configurations, the light emitting layer can be positioned at a maximum amplitude portion occurring in the standing wave of light formed inside the laminated structure like the fourth embodiment.

In addition, in the light emitting element having the fourth configuration including the above various preferred configurations, the light absorbing material layers can have a light absorbing coefficient twice or more as large as the light absorbing coefficient of a compound semiconductor constituting the laminated structure like the fourth embodiment.

In addition, in the light emitting element having the fourth configuration including the above various preferred configurations, the light absorbing material layers can be made of at least one type of a material selected from a group including a compound semiconductor material having a band gap narrower than that of a compound semiconductor constituting the laminated structure, a compound semiconductor material doped with impurities, a transparent conductive material, and a light reflecting layer constituting material having light absorbing characteristics.

In addition, in the light emitting element having the concave mirror part according to the present disclosure including the preferred modes and configurations (including the light emitting element having the first configuration to the light emitting element having the fourth configuration) described above, a light emitting element manufacturing substrate (specifically, a compound semiconductor substrate) can be disposed between the first surface of the first compound semiconductor layer and the first light reflecting layer and the like. Here, the light emitting element thus configured will be called a "light emitting element having a fifth configuration" for the sake of convenience. In this case, the light emitting element manufacturing substrate can be made of a GaN substrate. Note that although $5 \times 10^{-5}$ m to $1 \times 10^{-4}$ m can be exemplified as the thickness of the light emitting element manufacturing substrate, the thickness is not limited to such a value. Further, in the light emitting element having the fifth configuration including such a configuration, the concave mirror part constituted by the first light reflecting layer and the like can be constituted by a base part including a protruding part of the light emitting element manufacturing substrate and a film thickness modulating layer and a multilayer light reflecting film formed on at least a part of the surface of the base part. Here, the light emitting element thus configured will be called a "light emitting element having a fifth-A configuration" for the sake of convenience. Alternatively, the concave mirror part constituted by the first light reflecting layer and the like can be constituted by a base part formed on the light emitting element manufacturing substrate and a film thickness modulating layer and a multilayer light reflecting film formed on at least a part of the surface of the base part. Here, the light emitting element thus configured will be called a "light emitting element having a fifth-B configuration" for the sake of convenience. A material constituting the base part in the light emitting element having the fifth-A configuration is, for example, a GaN substrate. As the GaN substrate, any of a polar substrate, an antipolar substrate, and a nonpolar substrate may be used. On the other hand, as a material constituting the base part in the light emitting element having the fifth-B configuration, a transparent dielectric material such as $TiO_2$, $Ta_2O_5$, and $SiO_2$, a silicon-based resin, and an epoxy-based resin can be exemplified.

Alternatively, in the light emitting element having the concave mirror part according to the present disclosure including the preferred modes and configurations (including the light emitting element having the first configuration to the light emitting element having the fourth configuration) described above, the first light reflecting layer and the like can be formed on the first surface of the first compound semiconductor layer. Here, the light emitting element thus configured will be called a "light emitting element having a sixth configuration" for the sake of convenience.

In addition, in the light emitting element having the concave mirror part according to the present disclosure including the preferred modes and configurations (including the light emitting element having the first configuration to the light emitting element having the sixth configuration) described above, the laminated structure can have a heat conductivity value higher than that of the first light reflecting layer and the like. Generally, a dielectric material constituting the first light reflecting layer and the like has a heat conductivity value of about 10 W/(m·K) or less. On the other hand, a GaN-based compound semiconductor constituting the laminated structure has a heat conductivity value of about 50 W/(m·K) to about 100 W/(m·K).

In addition, in the light emitting element having the concave mirror part according to the present disclosure including the preferred modes and configurations (including the light emitting element having the first configuration to the light emitting element having the sixth configuration) described above, $R_{DBR} \leq 1 \times 10^{-3}$ m, preferably $1 \times 10^{-5}$ m $\leq R_{DBR} \leq 1 \times 10^{-3}$ m, and more preferably $1 \times 10^{-5}$ m $\leq R_{DBR} \leq 1 \times 10^{-4}$ m can be satisfied when the curvature radius of the concave mirror part (specifically, the effective region of a radius $r'_{DBR}$ in the concave mirror part constituted by the first light reflecting layer and the like) of the light emitting element is $R_{DBR}$. Further, $1 \times 10^{-5}$ m $\leq L_{OR}$ is satisfied, but preferably $1 \times 10^{-5}$ m $\leq L_{OR} \leq 5 \times 10^{-4}$ m and more preferably $1 \times 10^{-5}$ m $\leq L_{OR} \leq 1 \times 10^{-4}$ m are desirably satisfied.

In addition, in the light emitting element having the concave mirror part according to the present disclosure including the preferred modes and configurations (including the light emitting element having the first configuration to the light emitting element having the sixth configuration) described above, a convex-shaped part is formed around the first light reflecting layer and the like, so that the first light reflecting layer cannot protrude from the convex-shaped part. Thus, the first light reflecting layer can be protected. That is, the first light reflecting layer is provided to be withdrawn from the convex-shaped part. Therefore, for example, even if any object contacts the convex-shaped part, the object does not contact the first light reflecting layer. As a result, the first light reflecting layer can be reliably protected.

Further, in the light emitting element having the concave mirror part according to the present disclosure including the preferred modes and configurations (including the light emitting element having the first configuration to the light emitting element having the sixth configuration) described above, a material constituting various compound semiconductor layers (including a light emitting element manufacturing substrate including a compound semiconductor substrate) positioned between the light emitting layer and the first light reflecting layer and the like does not preferably have a refractive index modulation of 10% or more (with the average refractive index of the laminated structure as a reference). Thus, the occurrence of disruptions in an optical field inside a resonator can be suppressed.

Hereinafter, a description will be given of the light emitting element having the concave mirror part of the seventh embodiment. The seventh embodiment relates to the light emitting element having the fifth-A configuration. Although depending on its configuration, the light emitting element of the seventh embodiment or the light emitting elements of the eighth to eighteenth embodiments that will be described later more specifically include a surface emitting laser element (vertical cavity surface emitting laser, VCSEL) that emits laser light from the top surface of a second compound semiconductor layer via a second light reflecting layer, or more specifically include a surface emitting laser element (vertical cavity surface emitting laser, VCSEL) that emits laser light from the top surface of a first compound semiconductor layer via a first light reflecting layer. A schematic partial end view of the light emitting element of the seventh embodiment is shown in FIG. 13.

In the light emitting element of the seventh embodiment or the light emitting elements of the eighth to eighteenth embodiments that will be described later, a first light reflecting layer 41 and a film thickness modulating layer 80 have a concave mirror part 43, and a second light reflecting layer 42 has a flat shape. Further, $1\times10^5$ m≤$L_{OR}$ is satisfied when a resonator length is $L_{OR}$.

Figure 13:
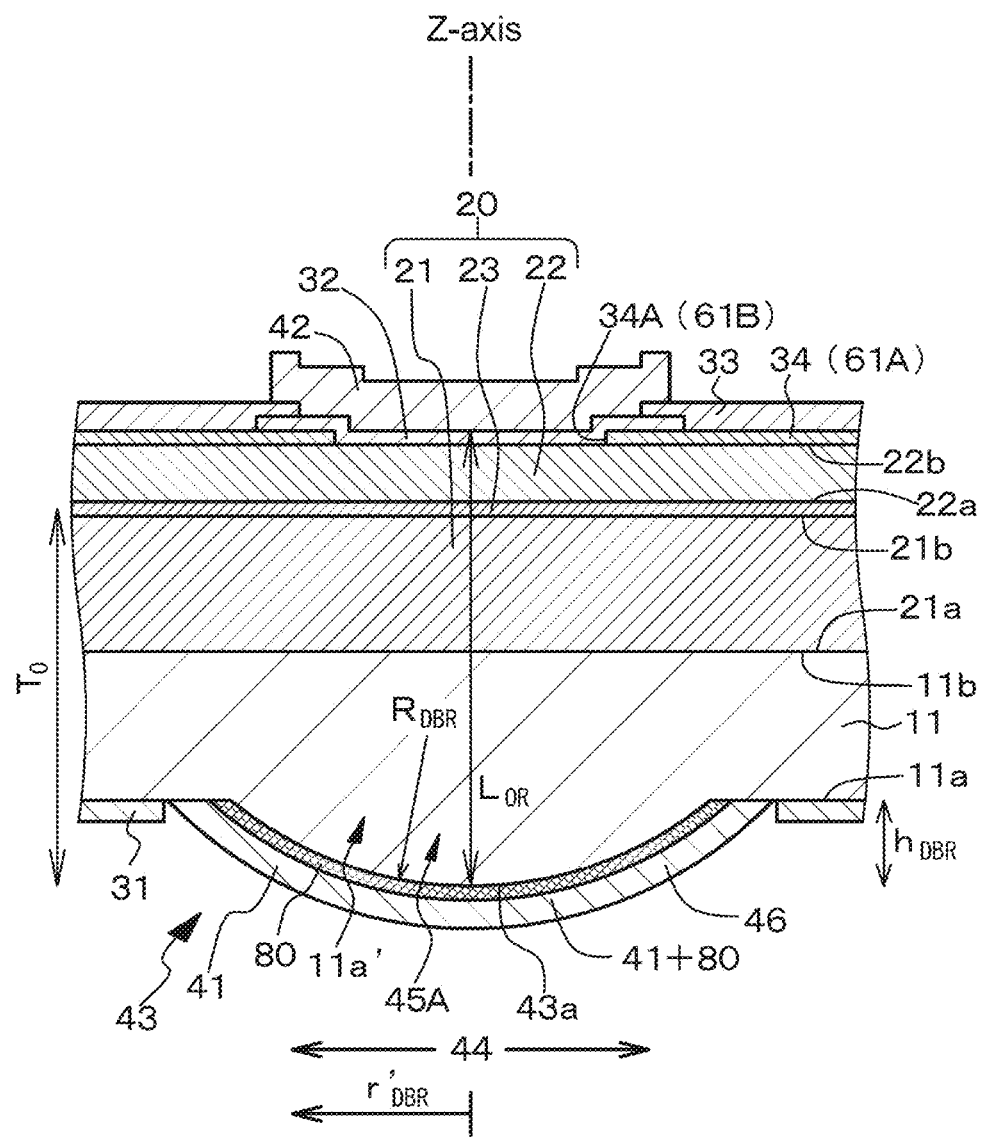
FIG. 13 is a schematic partial end view of the light emitting element of a seventh embodiment.

Note that in drawings associated with the seventh to eighteenth embodiments, the laminated structure of the first light reflecting layer 41 and the film thickness modulating layer 80 is shown by one layer denoted by reference numerals "41 and 80", and the laminated structure of a multilayer light reflecting film 46 and the film thickness modulating layer 80 is shown by one layer in drawings other than FIG. 13 to simplify the drawings.

Further, in the light emitting element of the seventh embodiment, a graphic drawn by an interface 43a (specifically, the interface 43a between a laminated structure 20 and the film thickness modulating layer 80) at which a part of the concave mirror part 43 constituted by the first light reflecting layer 41 and the film thickness modulating layer 80 faces the laminated structure 20 when the first light reflecting layer 41 and the film thickness modulating layer 80 are cut along a virtual plane including the laminating direction of the laminated structure 20 can be a part of a circle or a part of a parabola. Note that the shape (the graphic of the cross-sectional shape) of the portion of the concave mirror part 43 positioned outside an effective region 44 may not be a part of a circle or a part of a parabola.

Further, the concave mirror part 43 constituted by the first light reflecting layer 41 and the film thickness modulating layer 80 is constituted by a base part 45A including a protruding part 11a' of a first surface 11a of a light emitting element manufacturing substrate 11 including a compound semiconductor substrate and the film thickness modulating layer 80 and the multilayer light reflecting film 46 formed on at least a part of the surface of the base part 45A (specifically, the surface of the base part 45A).

In addition,
$R_{DBR} \leq 1\times10^{-3}$ m is satisfied
when the curvature radius of the concave mirror part 43 (specifically, an effective region 44 of a radius $r'_{DBR}$ in the concave mirror part 43 constituted by the first light reflecting layer 41 and the film thickness modulating layer 80) is $R_{DBR}$.

Specifically, although not particularly limited, $L_{OR}$=50 μm,
$R_{DBR}$=70 μm, and
$r'_{DBR}$=20 μm
can be exemplified.

Further, as a wavelength (oscillating wavelength) $\lambda_0$ of desired light mainly emitted from the light emitting element,
$\lambda_0$=450 nm
can be exemplified.

Here, when a distance from a light emitting layer 23 to the interface between the base part 45A and the multilayer light reflecting film 46 is $T_0$, the function x=f(z) of an ideal parabola can be expressed by $$x=z^2/t_0 \text{ and}$$

$$h_{DBR}=r'_{DBR2}/2T_0.$$

However, it is needless to say that when the graphic drawn by the interface 43a is a part of a parabola, the parabola may deviate from such an ideal parabola.

Further, the laminated structure 20 has a heat conductivity value higher than that of the first light reflecting layer 41 and the film thickness modulating layer 80. A dielectric material constituting the first light reflecting layer 41 and the thin film modulating layer 80 has a heat conductivity value of about 10 W/(m·K) or less. On the other hand, a GaN-based compound semiconductor constituting the laminated structure 20 has a heat conductivity value of about 50 W/(m·K) to about 100 W/(m·K).

Hereinafter, a description will be given of a method for manufacturing the light emitting element of the seventh embodiment with reference to FIGS. 14A, 14B, 15, 16, 17, 18, and 19 each showing a schematic partial end view of a laminated structure or the like.

[Step 700]

First, on a second surface 11b of a light emitting element manufacturing substrate 11 including a compound semiconductor substrate having a thickness of about 0.4 mm,
a laminated structure 20 including a GaN-based compound semiconductor is formed in which
a first compound semiconductor layer 21 having a first surface 21a and a second surface 21b facing the first surface 21a,
a light emitting layer (active layer) 23 facing the second surface 21b of the first compound semiconductor layer 21, and
a second compound semiconductor layer 22 having a first surface 22a facing the light emitting layer 23 and a second surface 22b facing the first surface 22a are laminated to each other. Specifically, the first compound semiconductor layer 21, the light emitting layer 23, and the second compound semiconductor layer 22 are sequentially formed on the second surface 11b of the light emitting element manufacturing substrate 11 on the basis of an epitaxial growth method by a known MOCVD method, whereby a laminated structure 20 can be obtained (see FIG. 14A).

[Step 710]

Figure 14A:
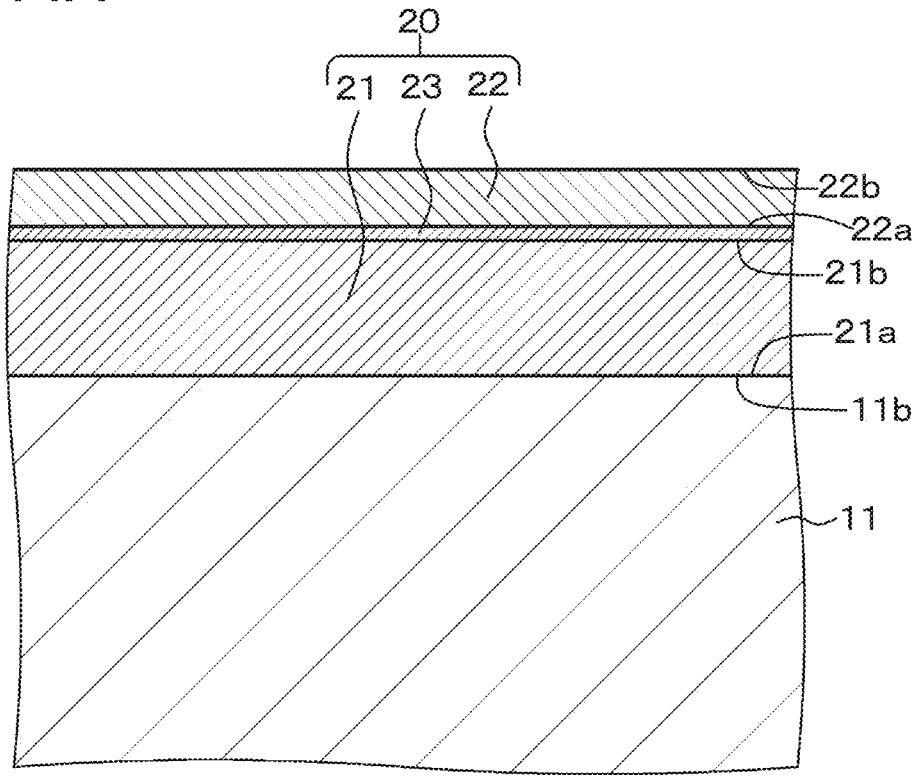
FIGS. 14A and 14B are schematic partial end views of a laminated structure or the like for describing a method for manufacturing the light emitting element of the seventh embodiment.
Figure 14B:
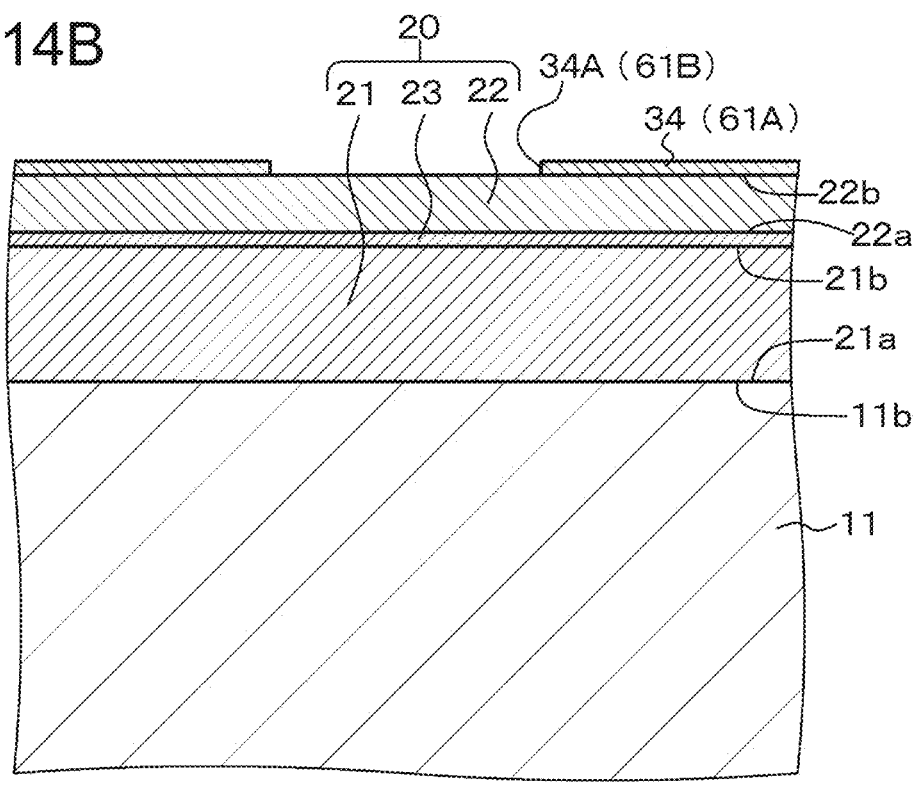
Figure 15:
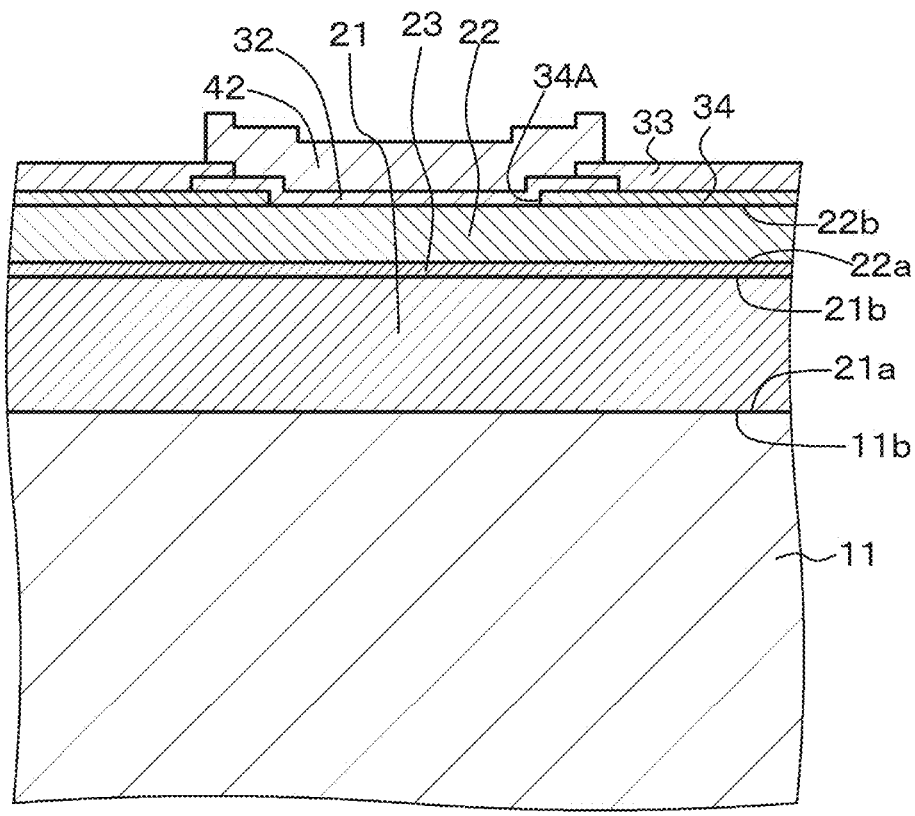
FIG. 15 is a schematic partial end view of the laminated structure or the like for describing the method for manufacturing the light emitting element of the seventh embodiment in succession to FIG. 14B.

Next, an insulating layer (current constricting layer) 34 having an opening part 34A and made of $SiO_2$ is formed on the second surface 22b of the second compound semiconductor layer 22 on the basis of the combination of a film forming method such as a CVD method, a sputtering method, and a vacuum vapor deposition method and a wet etching method or a dry etching method (see FIG. 14B). By the insulating layer 34A having the opening part 34A, a current constricting region (a current injecting region 61A and a current non-injecting region 61B) is defined. That is, the current injecting region 61A is defined by the opening part 34A.

In order to obtain the current constricting region, an insulating layer (current constricting layer) made of an insulating material (for example, $SiO_x$, $SiN_x$, or $AlO_x$) may be formed between a second electrode 32 and the second compound semiconductor layer 22 as described above, the second compound semiconductor layer 22 may be etched by a RIE method or the like to form a mesa structure, a part of the laminated second compound semiconductor layer 22 may be partially oxidized from its lateral direction to form a current constricting region, impurities may be ion-implanted into the second compound semiconductor layer 22 to form a region having lower conductivity, or the above methods may be appropriately combined together. However, the second electrode 32 is required to be electrically connected to the portion of the second compound semiconductor layer 22 where a current flows with current constriction.

[Step 720]

Subsequently, the second electrode 32 and a second light reflecting layer 42 are formed on the second compound semiconductor layer 22. Specifically, the second electrode 32 is formed over the insulating layer 34 from the second surface 22b of the second compound semiconductor layer 22 exposed at the bottom surface of the opening part 34A (the current injecting region 61A) on the basis of, for example, a lift-off method, and a pad electrode 33 is also formed on the basis of the combination of a film forming method such as a sputtering method and a vacuum vapor deposition method and a patterning method such as a wet etching method and a dry etching method. Next, the second light reflecting layer 42 is formed over the pad electrode 33 from the upper side of the second electrode 32 on the basis of the combination of a film forming method such as a sputtering method and a vacuum vapor deposition method and a patterning method such as a wet etching method and a dry etching method. The second light reflecting layer 42 on the second electrode 32 has a flat shape. Thus, a structure shown in FIG. 15 can be obtained.

[Step 730]

Figure 16:
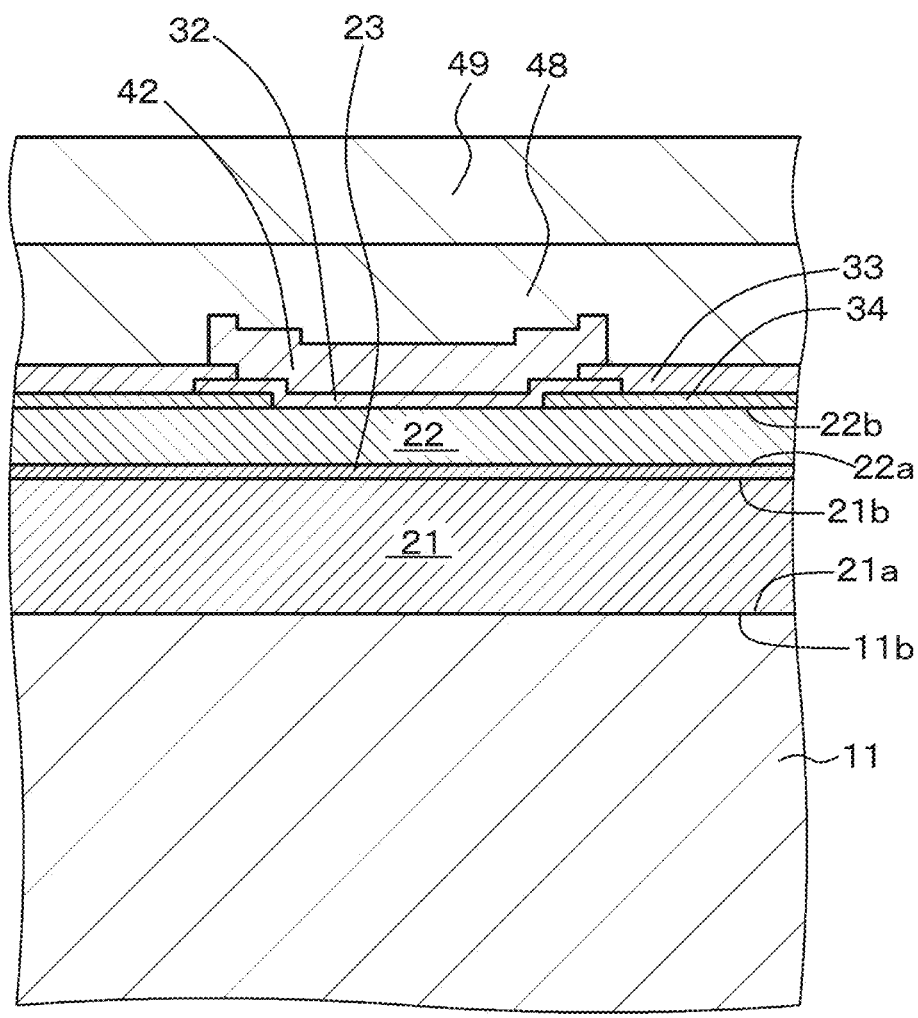
FIG. 16 is a schematic partial end view of the laminated structure or the like for describing the method for manufacturing the light emitting element of the seventh embodiment in succession to FIG. 15.

Subsequently, the second light reflecting layer 42 is fixed to a support substrate 49 via a joining layer 48 (see FIG. 16). Specifically, the second light reflecting layer 42 is fixed to the support substrate 49 constituted by a sapphire substrate using the joining layer 48 made of an adhesive.

[Step 740]

Figure 17:
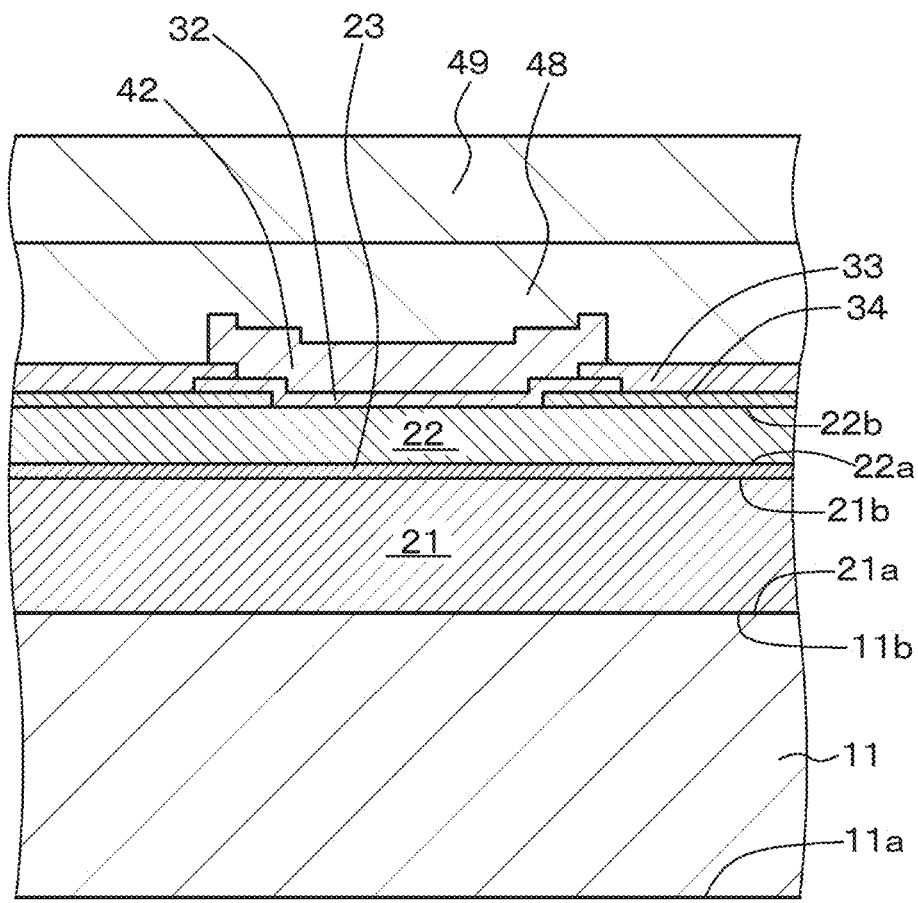
FIG. 17 is a schematic partial end view of the laminated structure or the like for describing the method for manufacturing the light emitting element of the seventh embodiment in succession to FIG. 16.
Figure 18:
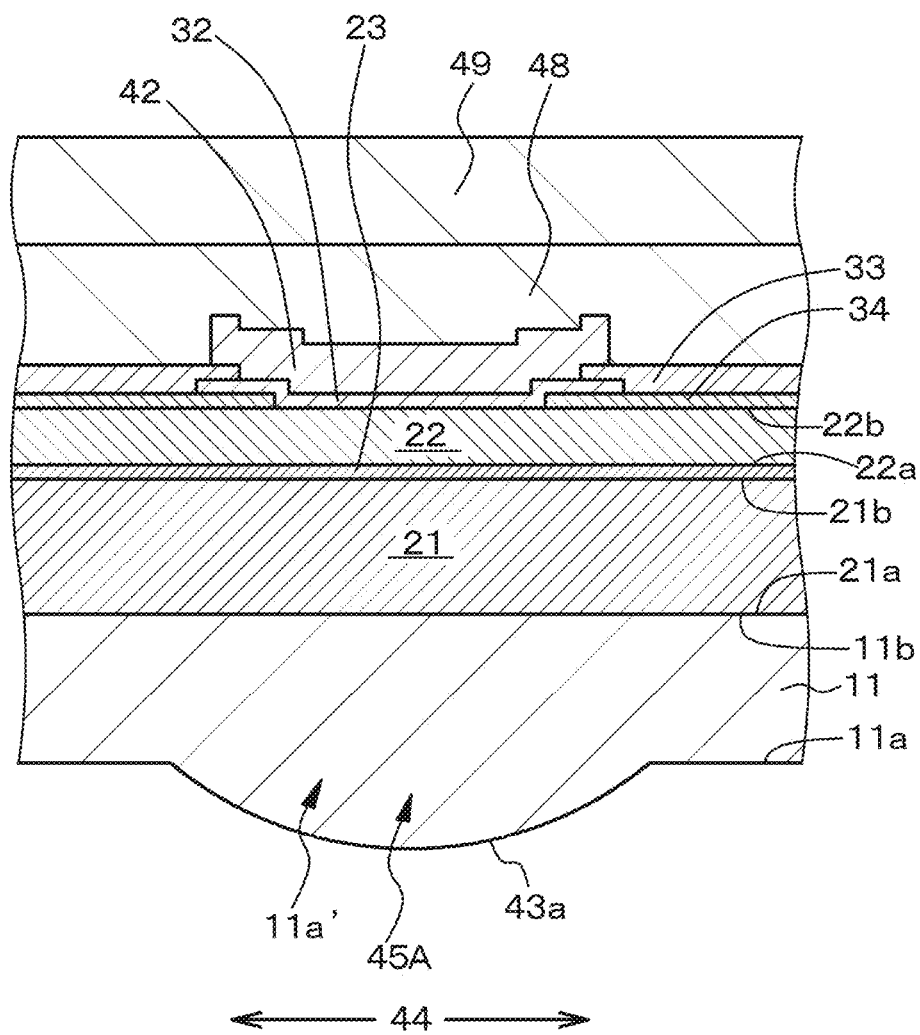
FIG. 18 is a schematic partial end view of the laminated structure or the like for describing the method for manufacturing the light emitting element of the seventh embodiment in succession to FIG. 17.
Figure 19:
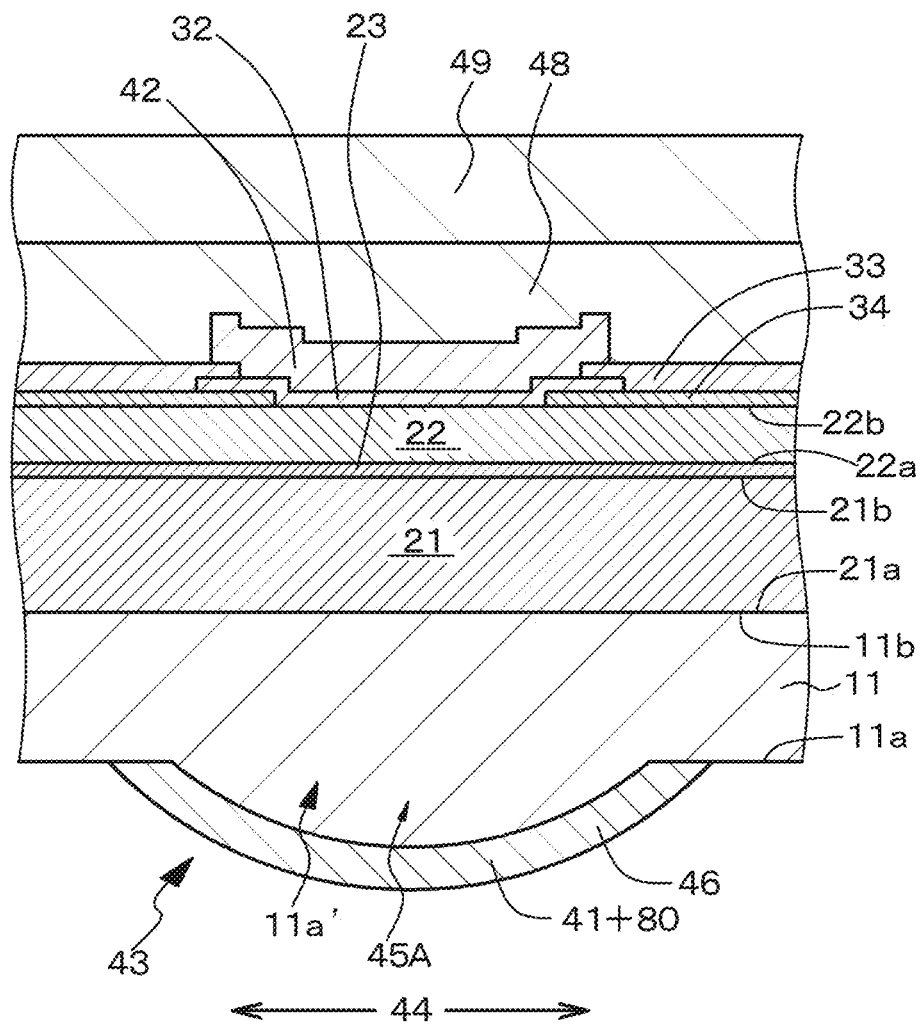
FIG. 19 is a schematic partial end view of the laminated structure or the like for describing the method for manufacturing the light emitting element of the seventh embodiment in succession to FIG. 18.

Next, the light emitting element manufacturing substrate 11 is thinned on the basis of a machine polishing method or a CMP method, and a first surface 11a of the light emitting element manufacturing substrate 11 is further polished to a mirror-smooth state (see FIG. 17). The first surface 11a of the light emitting element manufacturing substrate 11 preferably has a surface roughness Ra of 10 nm or less. Then, a base part 45A including a protruding part 11a' is formed on the exposed surface (the first surface 11a) of the light emitting element manufacturing substrate 11. Specifically, a patterned resist layer is formed on the first surface 11a of the light emitting element manufacturing substrate 11 on which the base part 45A is to be formed, and then heated to reflow to obtain a resist pattern. The resist pattern is given the same shape (or a shape similar to) as that of the protruding part 11a'. Then, the resist pattern and the first surface 11a of the light emitting element manufacturing substrate 11 are etched back by a RIE method or the like, whereby the base part 45A including the protruding part 11a' can be formed on the exposed surface (the first surface 11a) of the light emitting element manufacturing substrate 11 (see FIG. 18).

[Step 750]

Subsequently, a film thickness modulating layer 80 and a multilayer light reflecting film 46 are formed on at least a part of the base part 45A. Specifically, the film thickness modulating layer 80 and the multilayer light reflecting film 46 are formed over the base part 45A from the exposed surface (the first surface 11a) of the light emitting element manufacturing substrate 11 on the basis of a known method such as a sputtering method and a vacuum vapor deposition method. Then, after unnecessary portions of the multilayer light reflecting film 46 and the film thickness modulating layer 80 are removed by a patterning method such as a wet etching method and a dry etching method to obtain the film thickness modulating layer 80 and the first light reflecting layer 41 (see FIG. 19), a first electrode 31 is formed on the first surface 11a of the light emitting element manufacturing substrate 11 on the basis of the combination of a film forming method such as a sputtering method and a vacuum vapor deposition method and a patterning method such as a wet etching method and a dry etching method, whereby the first electrode 31 electrically connected to the first compound semiconductor layer 21 can be obtained.

[Step 760]

Then, the support substrate 49 is peeled off. Thus, a structure shown in FIG. 13 can be obtained. Subsequently, the light emitting element is separated by so-called element separation, and the lateral surface or the exposed surface of the laminated structure is coated with, for example, an insulating film made of $SiO_2$. Then, packaging or sealing is performed, whereby the light emitting element of the seventh embodiment is completed.

Note that the support substrate 49 may be peeled off after the light emitting element manufacturing substrate 11 is thinned and further polished to a mirror-smooth state in [Step 740].

Figure 20:
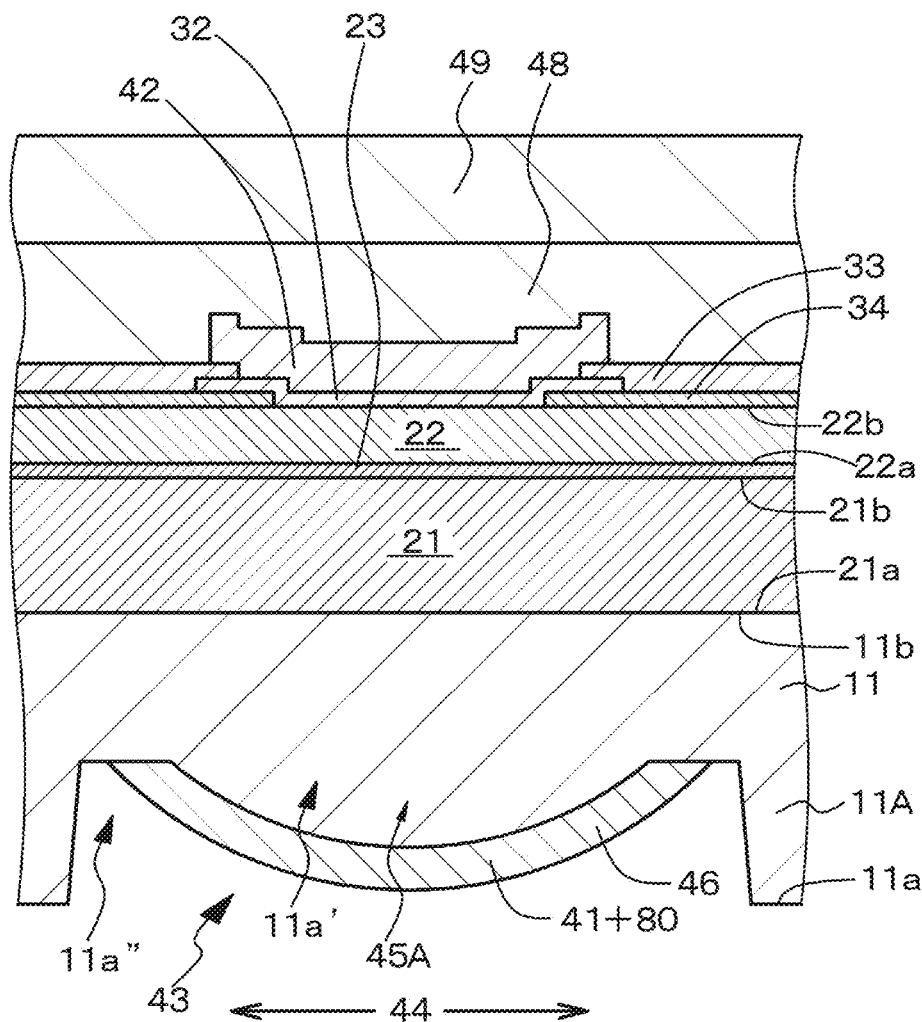
FIG. 20 is a schematic partial end view of the laminated structure or the like of a modified example of the light emitting element of the seventh embodiment.

Further, as a modified example of the light emitting element of the seventh embodiment, a concave part 11a" is formed in the region of the exposed surface (the first surface 11a) of the light emitting element manufacturing substrate 11 on which the base part 45A is to be formed before the base part 45A including the protruding part 11a' is formed on the exposed surface (the first surface 11a) of the light emitting element manufacturing substrate 11 after the light emitting element manufacturing substrate 11 is thinned and polished to a mirror-smooth state in [Step 740], and a patterned resist layer is formed inside the concave part 11a" and heated to reflow to obtain a resist pattern. The resist pattern is given the same shape (or a shape similar to) as that of the protruding part 11a". Then, the portions of the resist pattern and the concave part 11a" may be etched back by a RIE method or the like to form the base part 45A including the protruding part 11a' inside the concave part 11a" of the exposed surface (the first surface 11a) of the light emitting element manufacturing substrate 11 (see FIG. 20). Next, the film thickness modulating layer 80 and the multilayer light reflecting film 46 are formed on an entire surface including the upper side of the base part 45A on the basis of a known method such as a sputtering method and a vacuum vapor deposition method. Then, unnecessary portions of the multilayer light reflecting film 46 and the film thickness modulating layer 80 are removed on the basis of a patterning method such as a wet etching method and dry etching method, whereby the film thickness modulating layer 80 and the first light reflecting layer 41 can be obtained. That is, a convex-shaped part 11A is formed around the film thickness modulating layer 80 and the first light reflecting layer 41, and the first light reflecting layer 41 does not protrude from the convex-shaped part 11A (constituted by the exposed surface (the first surface 11*a*) of the light emitting element manufacturing substrate 11). Thus, the first light reflecting layer 41 can be protected.

Alternatively, in [Step 740], simultaneously when the base part 45A including the protruding part 11*a*' is formed on the exposed surface (the first surface 11*a*) of the light emitting element manufacturing substrate 11 including a compound semiconductor substrate, a protruding part may be formed on the exposed surface (the first surface 11*a*) of the light emitting element manufacturing substrate 11 so as to surround the base part 45A at a place distant from the base part 45A. Specifically, a patterned resist layer is formed on the first surface 11*a* of the light emitting element manufacturing substrate 11 on which the base part 45A is to be formed and heated to reflow to obtain a resist pattern. The resist pattern is given the same shape (or a shape similar to) as that of the protruding part 11*a*'. Besides, a resist layer is formed on the portion of the first surface 11*a* of the light emitting element manufacturing substrate 11 on which a protruding part is to be formed so as to surround the resist pattern at a place distant from the resist pattern. Then, the resist pattern, the resist layer, and the first surface 11*a* of the light emitting element manufacturing substrate 11 are etched back by a RIE method or the like, whereby the base part 45A including the protruding part 11*a*' can be formed on the exposed surface (the first surface 11*a*) of the light emitting element manufacturing substrate 11 and the protruding part can also be formed. The protruding part is formed around the film thickness modulating layer 80 and the first light reflecting layer 41, and the first light reflecting layer 41 does not protrude from the protruding part (the exposed surface (the first surface 11*a*) of the light emitting element manufacturing substrate 11). Thus, the first light reflecting layer 41 can be protected.

Figure 21:
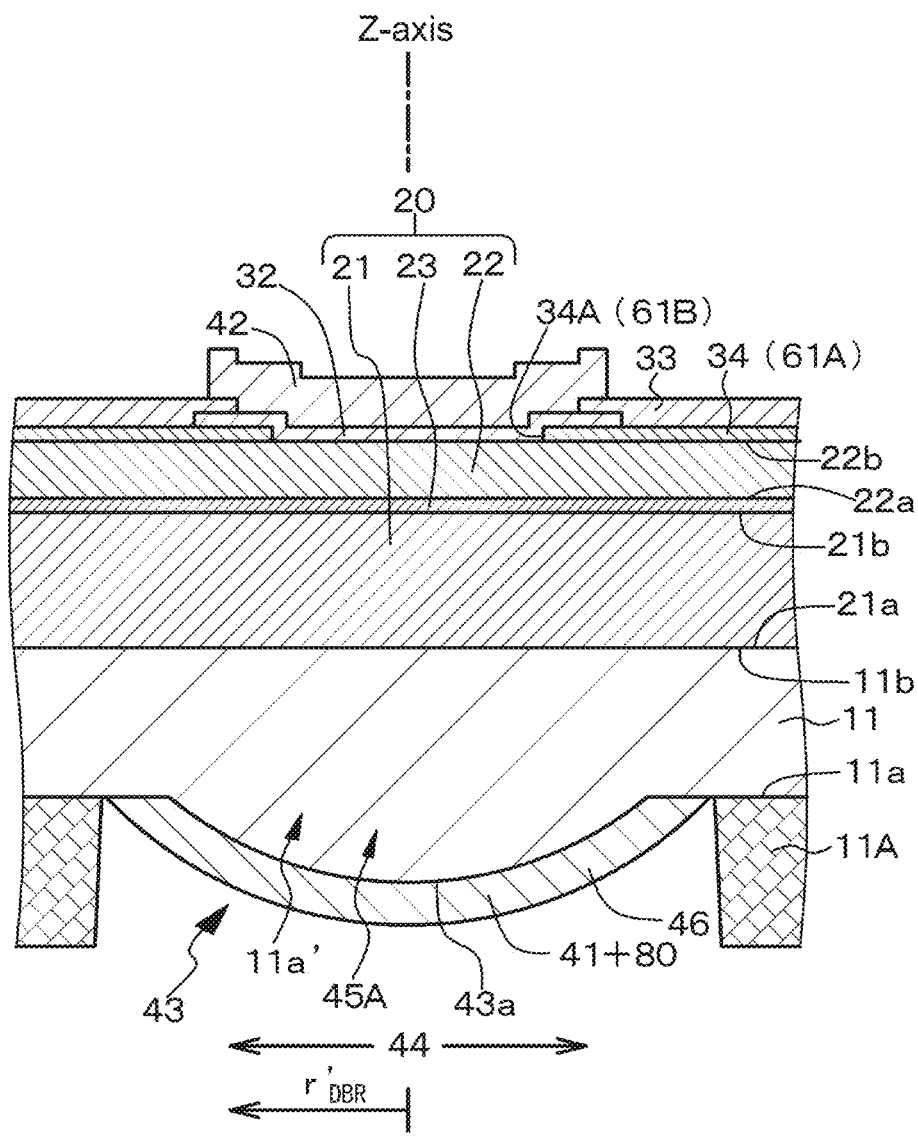
FIG. 21 is a schematic partial end view of the laminated structure or the like of the modified example of the light emitting element of the seventh embodiment.

Alternatively, in the above [Step 750], a convex-shaped part 11A surrounding the film thickness modulating layer 80 and the first light reflecting layer 41 may be formed on the first surface 11*a* of the light emitting element manufacturing substrate 11 after the film thickness modulating layer 80 and the multilayer light reflecting film 46 are formed on at least a part of the base part 45A and patterned to obtain the film thickness modulating layer 80 and the first light reflecting layer 41 (see FIG. 21). The concave-shaped part 11A may be made of, for example, an insulating material or a metal material. As described above, the convex-shaped part 11A is formed around the film thickness modulating layer 80 and the first light reflecting layer 41, and the first light reflecting layer 41 does not protrude from the convex-shaped part 11A. Thus, the first light reflecting layer 41 can be protected.

In the light emitting element of the seventh embodiment, the first light reflecting layer and the film thickness modulating layer have the concave mirror part. Accordingly, even if a resonator length $L_{OR}$ is $1×10^{-5}$ m or more, an increase in diffraction loss can be avoided. As a result, laser oscillation can be reliably performed. In addition, since the resonator length $L_{OR}$ can be $1×10^{-5}$ m or more, the problem of heat saturation can be alleviated. Further, since the resonator length $L_{OR}$ can be $1×10^{-5}$ m or more, the allowance of the process of manufacturing the light emitting element is increased. As a result, yields can be improved.

Further, although a GaN substrate is used in the process of manufacturing the light emitting element except for a tenth embodiment that will be described later, a GaN-based compound semiconductor must not be formed on the basis of a method such as an ELO method for achieving epitaxial growth in a lateral direction. Accordingly, not only a polar GaN substrate but also an antipolar GaN substrate or a nonpolar GaN substrate can be used as the GaN substrate. When the polar GaN substrate is used, the efficiency of emitting light is likely to reduce due to a Piezo electric field effect in the light emitting layer. However, the use of the nonpolar GaN substrate or the antipolar GaN substrate makes it possible to solve or alleviate such a problem.

Further, when a transparent material is applied onto the exposed surface (the first surface 11*a*) of the light emitting element manufacturing substrate 11 on which the base part 45A including the protruding part 11*a*' has been formed and then cured between [Step 740] and [Step 750], a smooth surface can be obtained. By the formation of the transparent material, the occurrence of optical loss, for example, the occurrence of scattering loss resulting from the exposed surface (the first surface 11*a*) of the light emitting element manufacturing substrate 11 can be suppressed. Examples of the transparent material can include an epoxy-based resin, a silicon-based resin, an acryl-based resin, and silica. Examples of the thickness of the transparent material can include 100 nm or less, and about 10 nm can be exemplified as such.

Eighth Embodiment

Figure 22:
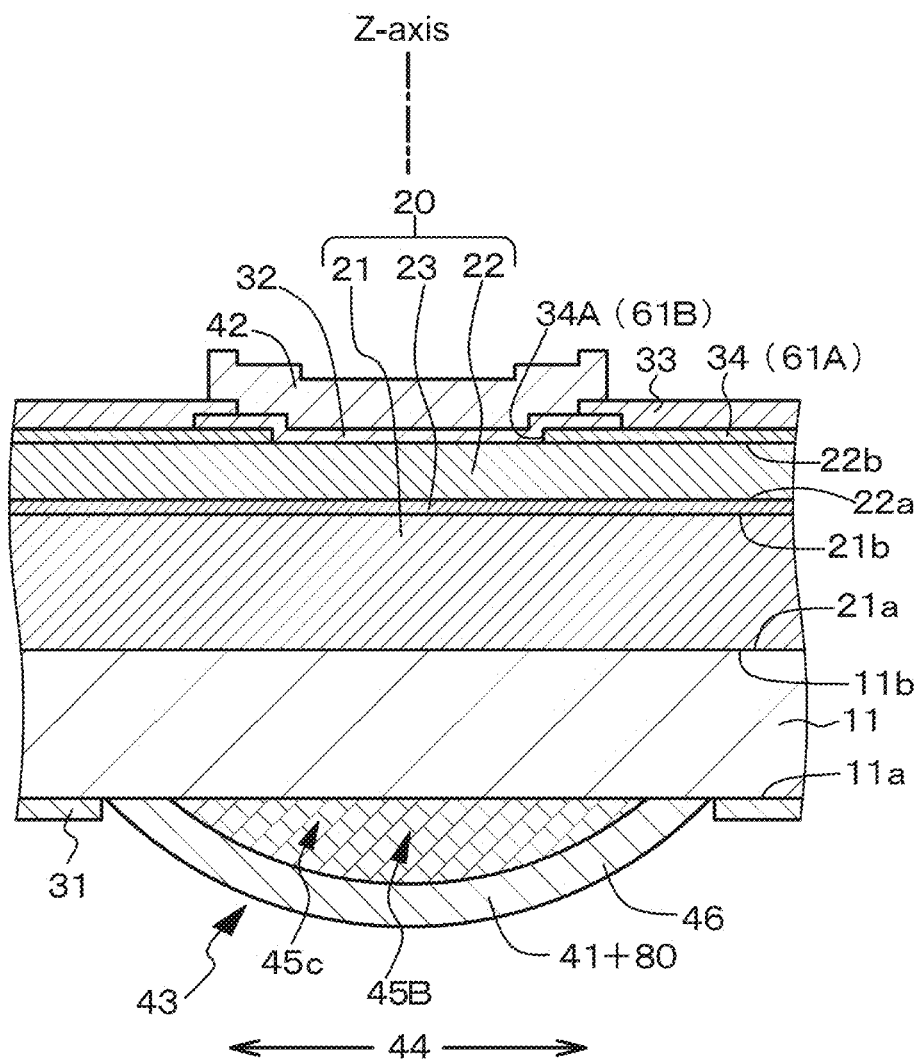
FIG. 22 is a schematic partial end view of the light emitting element of an eighth embodiment.

The eighth embodiment is a modification of the seventh embodiment and relates to the light emitting element having the fifth-B configuration. In the light emitting element of the eighth embodiment shown in the schematic partial end view of FIG. 22, a concave mirror part 43 constituted by a first light reflecting layer 41 and a film thickness modulating layer 80 is constituted by a base part 45B including a protruding part 45*c* formed on a light emitting element manufacturing substrate 11 (specifically, formed on a first surface 11*a* of the light emitting element manufacturing substrate 11 including a compound semiconductor substrate) and the film thickness modulating layer 80 and a multilayer light reflecting film 46 formed on at least a part of the base part 45B (specifically, formed on the surface of the base part 45B). Examples of a material constituting the base part 45B (the protruding part 45*c*) can include a transparent dielectric material such as $TiO_2$, $Ta_2O_5$, and $SiO_2$, a silicon-based resin, and an epoxy-based resin.

In the light emitting element of the eighth embodiment, the base part 45B including the protruding part 45*c* is formed on the exposed surface (the first surface 11*a*) of the light emitting element manufacturing substrate 11 after the light emitting element manufacturing substrate 11 is thinned and polished to a mirror-smooth state in the same step as [Step 740] of the seventh embodiment. Specifically, a $TiO_2$ layer or a $Ta_2O_5$ layer is, for example, formed on the exposed surface (the first surface 11*a*) of the light emitting element manufacturing substrate 11, and then a patterned resist layer is formed on the $TiO_2$ layer or the $Ta_2O_5$ layer on which the base part 45B is to be formed and heated to reflow to obtain a resist pattern. The resist pattern is given the same shape (or a shape similar to) as that of the protruding part 45c. Then, the resist pattern and the TiO$_2$ layer or the Ta$_2$O$_5$ layer are etched back, whereby the base part 45B including the protruding part 45c can be formed on the exposed surface (the first surface 11a) of the light emitting element manufacturing substrate 11. Next, the film thickness modulating layer 80 and the multilayer light reflecting film 46 are formed over the base part 45B from the exposed surface (the first surface 11a) of the light emitting element manufacturing substrate 11 on the basis of a known method. Subsequently, after unnecessary portions of the multilayer light reflecting film 46 and the film thickness modulating layer 80 are removed to obtain the film thickness modulating layer 80 and the first light reflecting layer 41, a first electrode 31 is formed on the first surface 11a of the light emitting element manufacturing substrate 11, whereby the first electrode 31 electrically connected to a first compound semiconductor layer 21 can be obtained.

Since the configuration and structure of the light emitting element of the eighth embodiment are the same as those of the light emitting element of the seventh embodiment other than the above point, their detailed descriptions will be omitted. Note that the modified example of the light emitting element of the seventh embodiment can also be applied to the eighth embodiment.

Ninth Embodiment

Figure 23:
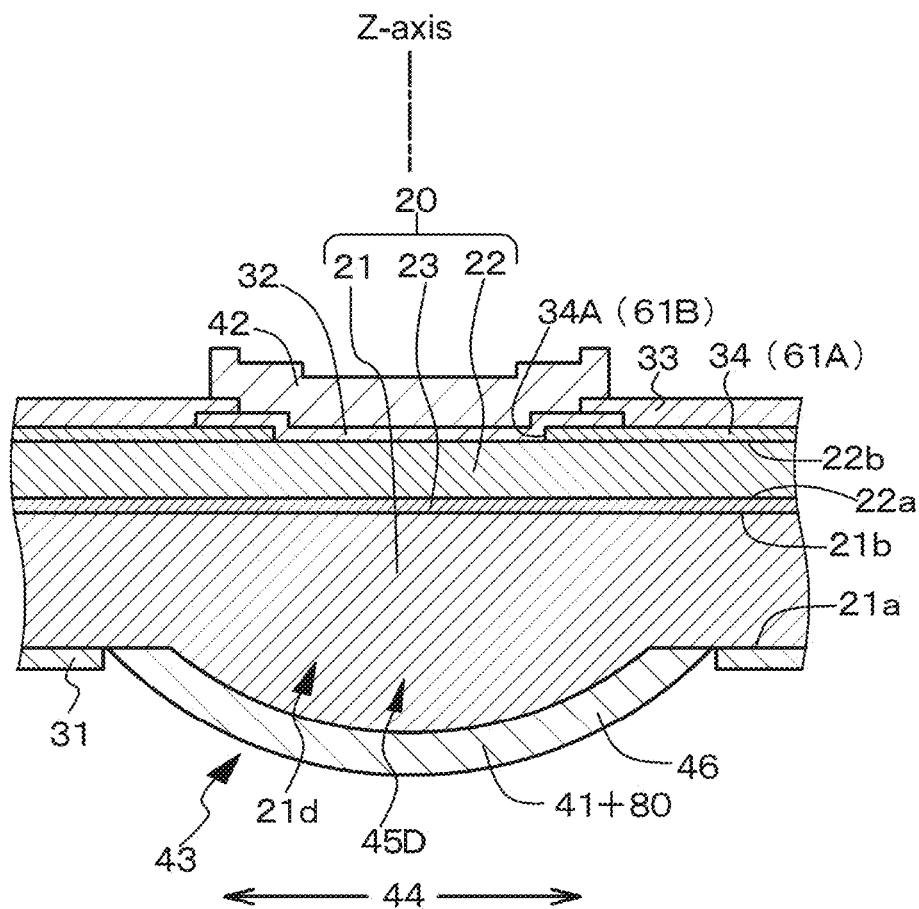
FIG. 23 is a schematic partial end view of the light emitting element of a ninth embodiment.
Figure 24:
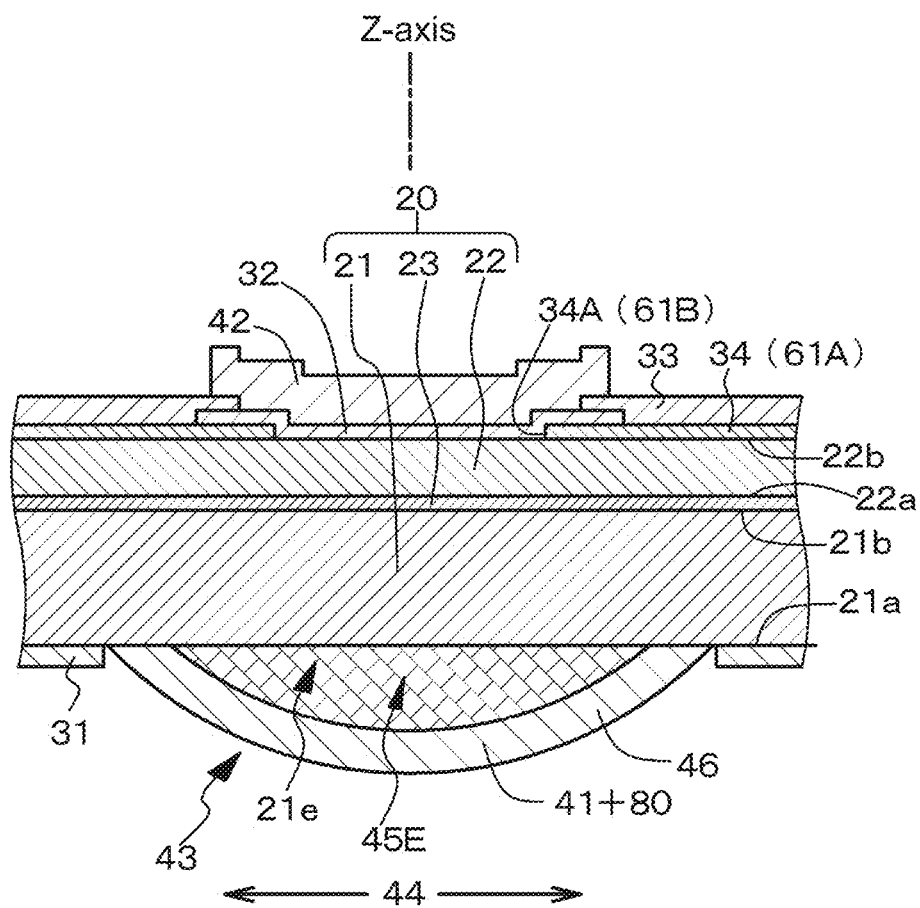
FIG. 24 is a schematic partial end view of a modified example of the light emitting element of the ninth embodiment.

A ninth embodiment is also a modification of the seventh embodiment or the eighth embodiment and relates to the light emitting element having the sixth configuration. In the light emitting element of the ninth embodiment as shown in the schematic partial end view of FIG. 23, a film thickness modulating layer 80 and a first light reflecting layer 41 are formed on a first surface 21a of a first compound semiconductor layer 21. In the manufacturing of the light emitting element of the ninth embodiment, a light emitting element manufacturing substrate 11 is removed to expose the first surface 21a of the first compound semiconductor layer 21 in the same step as [Step 740] of the seventh embodiment. Then, like the seventh embodiment, a patterned resist layer is formed on the first surface 21a of the first compound semiconductor layer 21 on which a base part 45D is to be formed and heated to reflow to obtain a resist pattern. The resist pattern is given the same shape (or a shape similar to) as that of a protruding part 21d. Then, the resist pattern and the first surface 21a of the first compound semiconductor layer 21 are etched back, whereby the base part 45D including the protruding part 21d can be formed on the first surface 21a of the first compound semiconductor layer 21. Alternatively, in a modified example of the light emitting element of the ninth embodiment shown in the schematic partial end view of FIG. 24, a TiO$_2$ layer or a Ta$_2$O$_5$ layer is, for example, formed on the first surface 21a of the first compound semiconductor layer 21, and then a patterned resist layer is formed on the TiO$_2$ layer or the Ta$_2$O$_5$ layer on which the base part 45E is to be formed and heated to reflow to obtain a resist pattern. The resist pattern is given the same shape (or a shape similar to) as that of the protruding part 21e. Then, the resist pattern and the TiO$_2$ layer or the Ta$_2$O$_5$ layer are etched back, whereby the base part 45E including the protruding part 21e can be formed on the first surface 21a of the first compound semiconductor layer 21.

Since the configurations and structures of the light emitting element of the ninth embodiment and the modified example thereof are the same as those of the light emitting element of the seventh embodiment or the eighth embodiment other than the above point, their detailed descriptions will be omitted. Note that a support substrate 49 or a joining layer 48 may be left without being removed.

Tenth Embodiment

A tenth embodiment is a modification of the ninth embodiment. Since the schematic partial end view of the light emitting element of the tenth embodiment is substantially the same as FIG. 24 and the configuration and structure of the light emitting element of the tenth embodiment can be substantially the same as those of the light emitting element of the ninth embodiment, their detailed descriptions will be omitted.

Figure 25A:
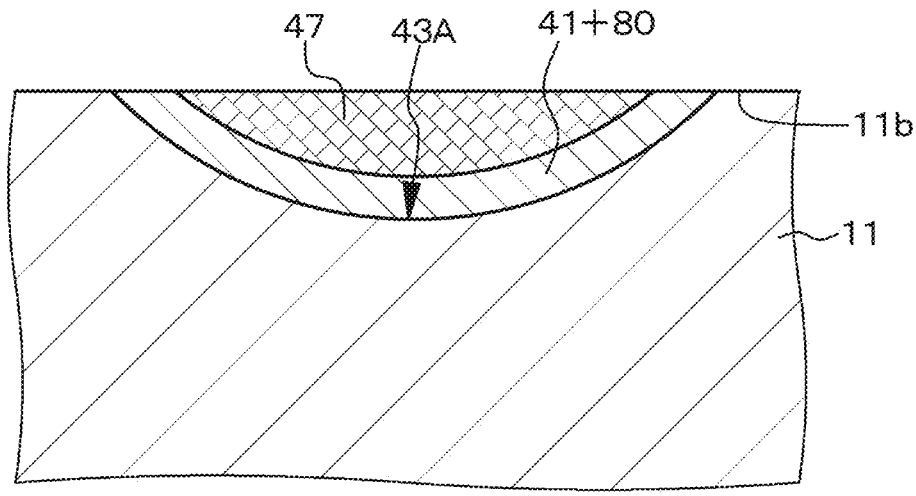
FIGS. 25A and 25B are schematic partial end views of a laminated structure or the like for describing a method for manufacturing the light emitting element of a tenth embodiment.

In the tenth embodiment, a concave part 43A for forming a concave mirror part 43 is first formed on a second surface 11b of a light emitting element manufacturing substrate 11. Then, after a first light reflecting layer 41 including a film thickness modulating layer 80 and a multilayer light reflecting film 46 is formed on the second surface 11b of the light emitting element manufacturing substrate 11, a flattening film 47 is formed on the first light reflecting layer 41, the flattening film 47, the film thickness modulating layer 80, and the first light reflecting layer 41 are subjected to flattening processing to expose a part of the second surface 11b of the light emitting element manufacturing substrate 11 while making the flattening film 47, the film thickness modulating layer 80, and the first light reflecting layer left (see FIG. 25A). The first light reflecting layer 41 and the film thickness modulating layer 80 have a circular plane shape. However, the shape of the first light reflecting layer 41 and the film thickness modulating layer 80 is not limited to this.

Figure 25B:
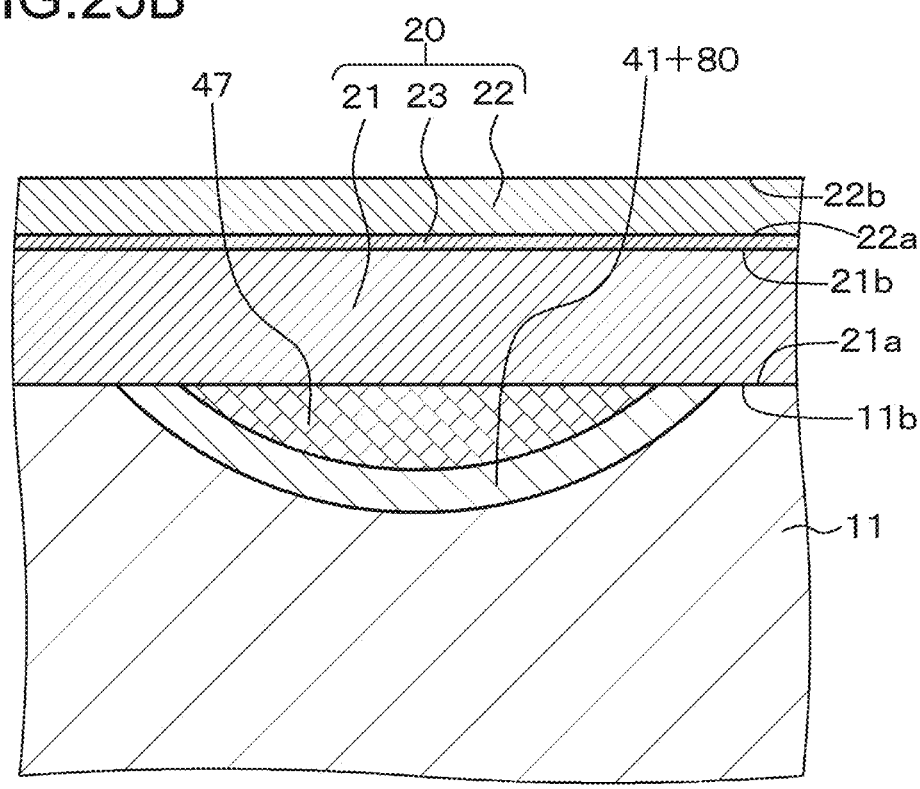

Next, a laminated structure 20 is formed on the light emitting element manufacturing substrate 11 including the first light reflecting layer 41 and the film thickness modulating layer 80 on the basis of lateral growth using a method such as an ELO method for achieving epitaxial growth in a lateral direction (see FIG. 25B). Subsequently, [Step 710] and [Step 720] of the seventh embodiment are performed. Then, the light emitting element manufacturing substrate 11 is removed, and a first electrode 31 is formed on an exposed first surface 21a of a first compound semiconductor layer 21. Alternatively, the first electrode 31 is formed on a first surface 11a of the light emitting element manufacturing substrate 11 without removing the light emitting element manufacturing substrate 11. Subsequently, the light emitting element is separated by so-called element separation, and the lateral surface or the exposed surface of the laminated structure is coated with, for example, an insulating film made of SiO$_2$. Then, packaging or sealing is performed, whereby the light emitting element of the tenth embodiment can be completed.

Eleventh Embodiment

An eleventh embodiment is a modification of the seventh to tenth embodiments and relates to the light emitting element having the first configuration. As described above, a current constricting region (a current injecting region 61A and a current non-injecting region 61B) is defined by an insulating layer 34 having an opening part 34A. That is, the current injecting region 61A is defined by the opening part 34A. That is, in the light emitting element of the eleventh embodiment, a second compound semiconductor layer 22 is provided with the current injecting region 61A and the current non-injecting region 61B surrounding the current injecting region 61A, and a shortest distance $D_{CI}$ from the area gravity point of the current injecting region 61A to a boundary 61C between the current injecting region 61A and the current non-injecting region 61B satisfies the above formulae (C-1) and (C-2).

In the light emitting element of the eleventh embodiment, a radius $r'_{DBR}$ of an effective region in a concave mirror part 43 constituted by a first light reflecting layer 41 and a film thickness modulating layer 80 satisfies $$\omega_0 \leq r'_{DBR} \leq 20 \cdot \omega_0.$$

Further, $D_{CI} \geq \omega_0$ is satisfied. In addition, $R_{DBR} \leq 1 \times 10^{-3}$ m is satisfied. Specifically, $D_{CI}$=4 μm,
$\omega_0$=1.5 μm,
$L_{OR}$=50 μm,
$R_{DBR}$=60 μm, and
$\lambda_0$=525 nm can be exemplified. Further, as the diameter of the opening part 34A, 8 μm can be exemplified. As a GaN substrate, a substrate having a surface in which a c-surface is inclined by about 75 degrees in an m-axis direction as a principal surface is used. That is, the GaN substrate has a {20-21} surface that is a semi-polar surface as a principal surface. Note that such a GaN substrate can also be used in other embodiments.

The deviation between the central axis (Z-axis) of the concave mirror part 43 and the current injecting region 61A in an XY plane direction causes degradation in the characteristics of the light emitting element. A lithography technology is often used in both patterning for forming the concave mirror part 43 and patterning for forming the opening part 34A. In this case, however, the positional relationship between the concave mirror part 43 and the opening part 34A is frequently deviated in an XY plane according to the performance of an exposure machine. Particularly, the opening part 34A (the current injecting region 61A) is aligned from the side of the second compound semiconductor layer 22 to be positioned. On the other hand, the concave mirror part 43 is aligned from the side of the light emitting element manufacturing substrate 11 to be positioned. Therefore, in the light emitting element of the eleventh embodiment, the opening part 34A (the current injecting region 61) is formed to be larger than a region in which light is narrowed by the concave mirror part 43, whereby a structure that does not affect oscillating characteristics even if a deviation occurs between the central axis (Z-axis) of the concave mirror part 43 and the current injecting region 61A in the XY plane direction is realized.

That is, when a region into which light reflected by the first light reflecting layer is condensed is not included in the current injecting region corresponding to a region in which a light emitting layer is caused to have gain by current injection, there is a likelihood that the induced emission of light from a carrier is inhibited and thus laser oscillation is inhibited. Accordingly, when the above formulae (C-1) and (C-2) are satisfied, it can be guaranteed that the region into which light reflected by the first light reflecting layer is condensed is included in the current injecting region, and that laser oscillation can be reliably achieved.

Twelfth Embodiment

Figure 26:
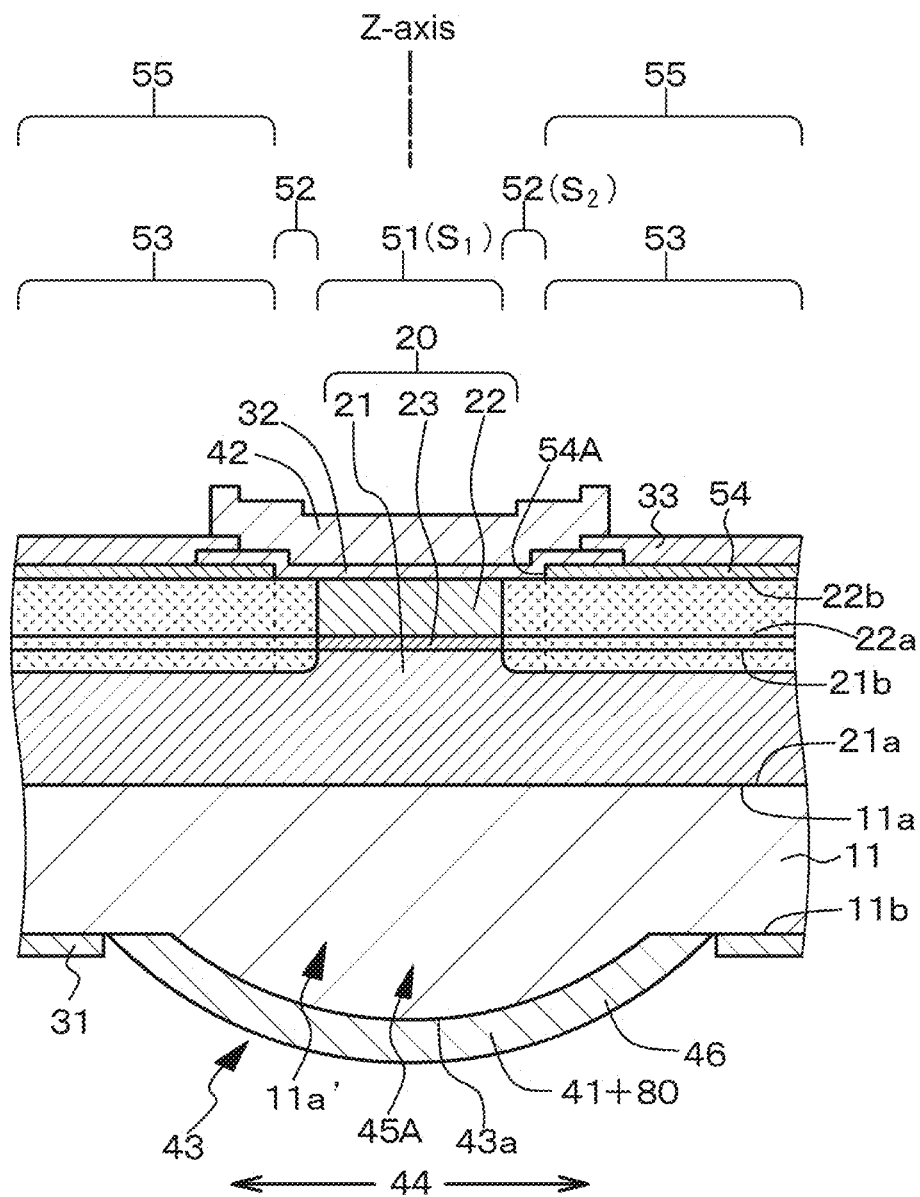
FIG. 26 is a schematic partial end view of the light emitting element of a twelfth embodiment.

A twelfth embodiment is a modification of the seventh to eleventh embodiments and relates to the light emitting element having the second configuration, specifically the light emitting element having the second-A configuration. A schematic partial end view of the light emitting element of the twelfth embodiment is shown in FIG. 26.

Meanwhile, in order to control the flow path (current injecting region) of a current flowing between a first electrode and a second electrode, a current non-injecting region is formed so as to surround the current injecting region. In a GaAs-based surface emitting laser element (surface emitting laser element constituted by a GaAs-based compound semiconductor), a current non-injecting region surrounding a current injecting region can be formed in such a manner that a light emitting layer is oxidized from an outside along an XY plane. The refractive index of the region (current non-injecting region) of an oxidized light emitting layer is lower than that of the non-oxidized region (current injecting region). As a result, the light path length (expressed by the product of a refractive index and a physical distance) of a resonator becomes shorter in the current non-injecting region than the current injecting region. This produces a kind of "lens effect" and brings about an operation in which laser light is confined at the central part of the surface emitting laser element. Generally, since light tends to spread due to a diffraction effect, laser light reciprocating in the resonator is gradually scattered and lost toward the outside of the resonator (diffraction loss), which causes an adverse affect such as an increase in threshold current. However, since the lens effect compensates for the diffraction loss, the increase in threshold current or the like can be suppressed.

On the other hand, in a light emitting element constituted by a GaN-based compound semiconductor, it is difficult to oxidize a light emitting layer from an outside (from a lateral direction) along an XY plane due to the characteristics of its material. Therefore, as described in the seventh to eleventh embodiments, an insulating layer 34 having an opening part and made of $SiO_2$ is formed on a second compound semiconductor layer 22, a second electrode 32 made of a transparent conductive material is formed over the insulating layer 34 from the second compound semiconductor layer 22 exposed at the bottom part of the opening part 34A, and a second light reflecting layer 42 including the laminated structure of an insulating material is formed on the second electrode 32. By the formation of the insulating layer 34 described above, a current non-injecting region 61B is formed. Then, the portion of the second compound semiconductor layer 22 positioned inside the opening part 34A provided on the insulating layer 34 becomes a current injecting region 61A.

When the insulating layer 34 is formed on the second compound semiconductor layer 22, a resonator length in the region (the current non-injecting region 61B) in which the insulating layer 34 is formed is longer by an amount corresponding to the optical film thickness of the insulating layer 34 than a resonator length in the region (the current injecting region 61A) in which the insulating layer 34 is not formed. Therefore, an operation occurs in which laser light reciprocating in a resonator formed by two light reflecting layers 41 and 42 of a surface emitting laser element (light emitting element) is diffused/scattered and lost toward the outside of the resonator. Such an operation will be called a "reverse lens effect" for the sake of convenience. As a result, oscillating mode loss occurs in the laser light, and there is a likelihood that a threshold current increases or slope efficiency degrades. Here, the "oscillating mode loss" represents a physical amount in which optical field intensity in a basic mode and a higher order mode in oscillating laser light increases or decrease, and different mode loss is defined for each mode. Note that the "optical field intensity" represents optical field intensity using a distance L from a Z-axis in an XY plane as a function. Generally, the optical field intensity monotonously decreases with an increase in the distance L in the basic mode, but comes to decrease with the increase in the distance L while repeatedly increasing or decreasing once or a plurality of times in the higher order mode (see the conceptual diagram of (A) of FIG. 28). Note that in FIG. 28, solid lines show the distribution of the optical field intensity in the basic mode, and broken lines show the distribution of the optical field intensity in the higher order mode. Further, although the first light reflecting layer 41 and the film thickness modulating layer 80 are shown in a flat state for the sake of convenience in FIG. 28, they actually have a concave mirror part.

The light emitting element of the twelfth embodiment or the light emitting elements of thirteenth to sixteenth embodiments that will be described later include:

(A) a laminated structure 20 including a GaN-based compound semiconductor in which a first compound semiconductor layer 21 having a first surface 21a and a second surface 21b facing the first surface 21a, a light emitting layer (active layer) 23 facing the second surface 21b of the first compound semiconductor layer 21, and a second compound semiconductor layer 22 having a first surface 22a facing the light emitting layer 23 and a second surface 22b facing the first surface 22a are laminated to each other;

(B) a mode loss affecting portion (mode loss affecting layer) 54 provided on the second surface 22b of the second compound semiconductor layer 22 and constituting a mode loss affecting region 55 affecting an increase and decrease in oscillating mode loss;

(C) a second electrode 32 formed over the mode loss affecting portion 54 from above the second surface 22b of the second compound semiconductor layer 22;

(D) a second light reflecting layer 42 formed on the second electrode 32;

(E) a first light reflecting layer 41 and a film thickness modulating layer 80 provided on the side of the first surface 21a of the first compound semiconductor layer 21; and (F) a first electrode 31 electrically connected to the first compound semiconductor layer 21.

Further, the laminated structure 20 has a current injecting region 51, a current non-injecting inside region 52 surrounding the current injecting region 51, and a current non-injecting outside region 53 surrounding the current non-injecting inside region 52, and an orthogonal projection image of the mode loss affecting region 55 and an orthogonal projection image of the current non-injecting outside region 53 overlap each other. That is, the current non-injecting outside region 53 is positioned below the mode loss affecting region 55. Note that the orthogonal projection image of the mode loss affecting region 55 and the orthogonal projection image of the current non-injecting outside region 53 may not overlap each other in a region substantially distant from the current injecting region 51 in which a current is injected. Here, the laminated structure 20 has the current non-injecting regions 52 and 53 in which a current is not injected. In the example shown in the figure, the current non-injecting regions 52 and 53 are formed over a part of the first compound semiconductor layer 21 from the second compound semiconductor layer 22 in a thickness direction. However, the current non-injecting regions 52 and 53 may be formed in a region on the side of the second electrode of the second compound semiconductor layer 22, may be formed over the entire second compound semiconductor layer 22, or may be formed over the second compound semiconductor layer 22 and the light emitting layer 23 in the thickness direction.

The mode loss affecting portion (mode loss affecting layer) 54 is made of a dielectric material such as $SiO_2$ and formed between the second electrode 32 and the second compound semiconductor layer 22 in the light emitting element of the twelfth embodiment or the light emitting elements of the thirteenth to sixteenth embodiments that will be described later. The value of the optical film thickness of the mode loss affecting portion 54 can be a value other than an integral multiple of ¼ of a wavelength $\lambda_0$ of light generated by the light emitting element. Alternatively, the value of the optical film thickness to of the mode loss affecting portion 54 can be an integral multiple of ¼ of the wavelength $\lambda_0$ of light generated by the light emitting element. That is, the optical film thickness to of the mode loss affecting portion 54 can be thickness with which light generated by the light emitting element is not dephased and a standing wave is not broken. However, the value of the optical film thickness to is not necessarily strictly an integral multiple of ¼ but may only satisfy $$(\lambda_0/4n_0) \times m - (\lambda_0/8n_0) \leq t_0 \leq (\lambda_0/4n_0) \times 2m + (\lambda_0/8n_0) \quad \text{(E)}.$$

Specifically, the optical film thickness to of the mode loss affecting portion 54 is preferably in the range of about 25 to 250 when the value of ¼ of the wavelength of light generated by the light emitting element is assumed to be "100." Further, by the employment of these configurations, the phase difference between laser light passing through the mode loss affecting portion 54 and laser light passing through the current injecting region 51 can be changed (the phase difference can be controlled), the control of oscillating mode loss can be performed with a higher degree of freedom, and the degree of freedom in designing the light emitting element can be further enhanced.

In the twelfth embodiment, the boundary between the current injecting region 51 and the current non-injecting inside region 52 has a circular shape (diameter: 8 μm), and the boundary between the current non-injecting inside region 52 and the current non-injecting outside region 53 has a circular shape (diameter: 12 μm). That is, $$0.01 \leq S_1/(S_1+S_2) \leq 0.7 \quad \text{(D-1)}$$

is satisfied when the area of an orthogonal projection image of the current injecting region 51 is $S_1$ and the area of an orthogonal projection image of the current non-injecting inside region 52 is $S_2$. Specifically, $$S_1/(S_1+S_2) = 8^2/12^2 = 0.44$$

is satisfied.

In the light emitting element of the twelfth embodiment or the light emitting elements of the thirteenth, fourteenth, and sixteenth embodiments that will be described later, $$L_0 > L_2$$

is satisfied when an optical distance from the light emitting layer 23 to the second surface of the second compound semiconductor layer 22 in the current injecting region 51 is $L_2$ and an optical distance from the light emitting layer 23 to the top surface (the surface facing the second electrode 32) of the mode loss affecting portion 54 in the mode loss affecting region 55 is $L_0$. Specifically, $$L_0/L_2 = 1.5$$

is satisfied. Then, generated laser light having a higher order mode is scattered and lost by the mode loss affecting region 55 toward the outside of a resonator structure constituted by the first light reflecting layer 41 and the second light reflecting layer 42, whereby oscillating mode loss is increased. That is, the generated optical field intensity of a basic mode and a higher order mode decreases in proportion to a distance from a Z-axis in an orthogonal projection image of the mode loss affecting region 55 due to the existence of the mode loss affecting region 55 affecting an increase and decrease in oscillating mode loss (see the conceptual diagram of (B) of FIG. 28). However, since the decrease in the optical field intensity of the higher order mode is larger than the decrease in the optical field intensity of the basic mode, the basic mode can be further stabilized, a threshold current can be reduced, and the relative optical field intensity of the basic mode can be increased. Furthermore, since the bottom part of the optical field intensity of the higher order mode is positioned at a place further distant from the current injecting region compared with the conventional light emitting element (see (A) of FIG. 28), the influence of a reverse lens effect can be reduced. Note that a mixed oscillating mode is caused when the mode loss affecting portion 54 made of $SiO_2$ is not provided.

The first compound semiconductor layer 21 includes an n-GaN layer, the light emitting layer 23 includes a fivefold multiquantum well structure in which an $In_{0.04}Ga_{0.96}N$ layer (barrier layer) and an $In_{0.16}Ga_{0.84}N$ layer (well layer) are laminated to each other, and the second compound semiconductor layer 22 includes a p-GaN layer. Further, the first electrode 31 is made of Ti/Pt/Au, and the second electrode 32 is made of a transparent conductive material, specifically ITO. The mode loss affecting portion 54 has a circular opening part 54A, and the second compound semiconductor layer 22 is exposed at the bottom part of the opening part 54A. On the edge part of the first electrode 31, a pad electrode (not shown) made of, for example, Ti/Pt/Au or V/Pt/Au for electrically connecting to an outside electrode or circuit is formed or connected. On the edge part of the second electrode 32, a pad electrode 33 made of, for example, Ti/Pd/Au or Ti/Ni/Au for electrically connecting to an outside electrode or circuit is formed or connected. The first light reflecting layer 41 and the second light reflecting layer 42 include the laminated structure (the total number of laminated dielectric films: 20 layers) of an SiN layer and an $SiO_2$ layer.

In the light emitting element of the twelfth embodiment, the current non-injecting inside region 52 and the current non-injecting outside region 53 are formed by ion implantation into the laminated structure 20. Boron is, for example, selected as an ion type, but the ion type is not limited to boron.

Hereinafter, a description will be given of the outline of a method for manufacturing the light emitting element of the twelfth embodiment.

[Step 1200]

In the manufacturing of the light emitting element of the twelfth embodiment, the same step as [Step 700] of the seventh embodiment is performed.

[Step 1210]

Next, a current non-injecting inside region 52 and a current non-injecting outside region 53 are formed in a laminated structure 20 on the basis of an ion implantation method using boron ion.

[Step 1220]

Figure 27A:
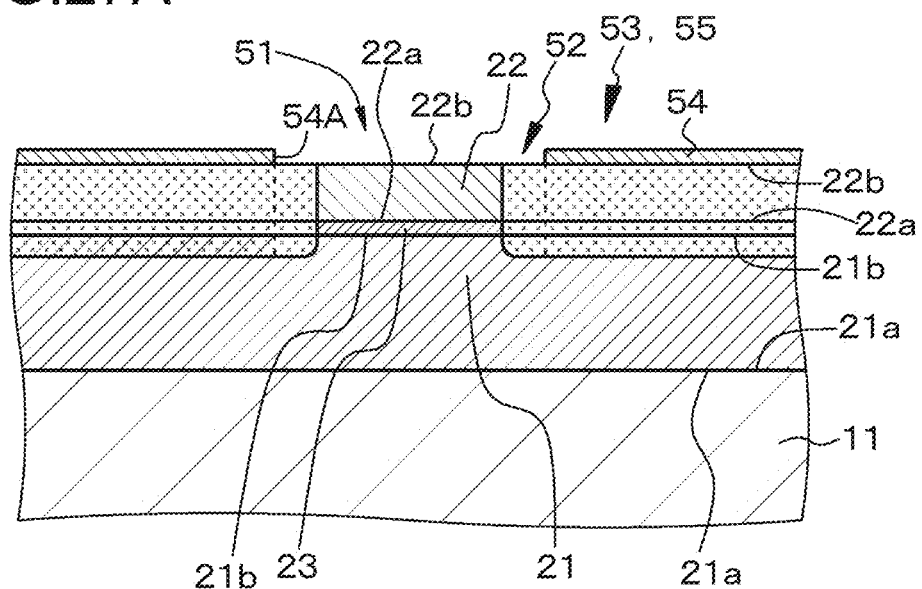
FIGS. 27A and 27B are schematic partial end views of a laminated structure or the like for describing a method for manufacturing the light emitting element of the twelfth embodiment.

Subsequently, in the same step as [Step 710] of the seventh embodiment, a mode loss affecting portion (mode loss affecting layer) 54 having an opening part 54A and made of $SiO_2$ is formed on a second surface 22b of a second compound semiconductor layer 22 on the basis of a known method (see FIG. 27A).

[Step 1230]

Figure 27B:
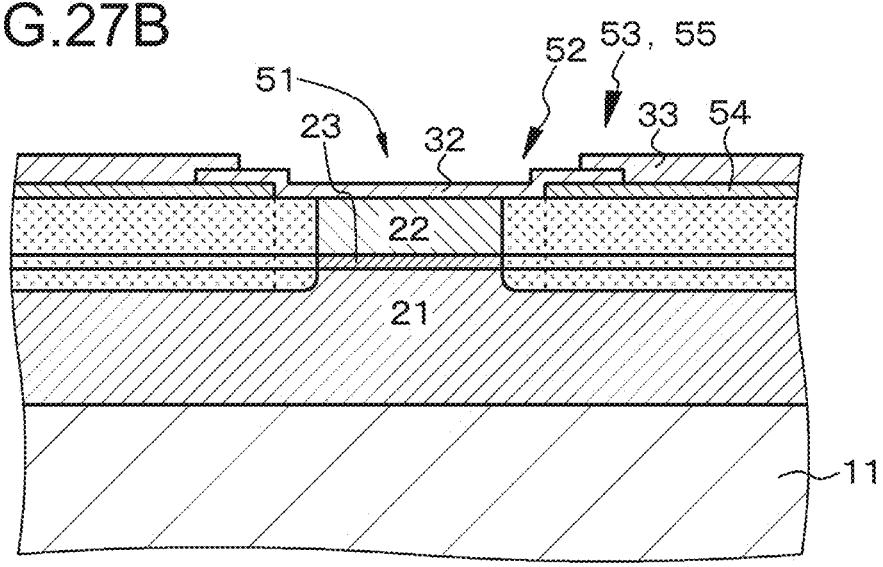

Subsequently, the light emitting element of the twelfth embodiment can be obtained in the same steps as [Step 720] to [Step 760] of the seventh embodiment. Note that a structure obtained in the middle of a step the same as [Step 720] is shown in FIG. 27B.

In the light emitting element of the twelfth embodiment, the laminated structure has the current injecting region, the current non-injecting inside region surrounding the current injecting region, and the current non-injecting outside region surrounding the current non-injecting inside region, and an orthogonal projection image of the mode loss affecting region and an orthogonal projection image of the current non-injecting outside region overlap each other. That is, the current injecting region and the mode loss affecting region are partitioned (separated) by the current non-injecting inside region. Therefore, as shown in the conceptual diagram of (B) of FIG. 28, it is possible to bring an increase and decrease (specifically, an increase in the twelfth embodiment) in oscillating mode loss into a desired state. Alternatively, by appropriately determining the positional relationship between the current injecting region and the mode loss affecting region, the thickness of the mode loss affecting portion constituting the mode loss affecting region, or the like, it is possible to bring an increase and decrease in oscillating mode loss into a desired state. As a result, problems in conventional light emitting elements such as, for example, an increase in threshold current and the degradation of slope efficiency can be solved. For example, a threshold current can be reduced by reducing oscillating mode loss in a basic mode. Furthermore, since a region in which the oscillating mode loss is given and a region in which a current is injected to contribute to light emission can be separately controlled, that is, since the control of the oscillating mode loss and the control of the light emitting state of the light emitting element can be separately performed, the degree of freedom in control and the degree of freedom in designing the light emitting element can be enhanced. Specifically, the magnitude of the oscillating mode loss given by the mode loss affecting region with respect to the basic mode and the higher order mode can be controlled by arranging the current injecting region, the current non-injecting region, and the mode loss affecting region in the above prescribed relationship. The basic mode can be further stabilized by making the oscillating mode loss given to the higher order mode relatively larger than the oscillating mode loss given to the basic mode. Furthermore, since the light emitting element of the twelfth embodiment has a concave mirror part 43, the occurrence of diffraction loss can be further reliably suppressed.

Thirteenth Embodiment

A thirteenth embodiment is a modification of the twelfth embodiment and relates to the light emitting element having the second-B configuration. As shown in the schematic partial cross-sectional view of FIG. 29, a current non-injecting inside region 52 and a current non-injecting outside region 53 are formed by irradiation of plasma onto the second surface of a second compound semiconductor layer 22, ashing of the second surface of the second compound semiconductor layer 22, or reactive ion etching (RIE) of the second surface of the second compound semiconductor layer 22 in the light emitting element of the thirteenth embodiment. Since the current non-injecting inside region 52 and the current non-injecting outside region 53 are exposed to plasma particles (specifically, argon, oxygen, nitrogen, or the like) like this, the conductivity of the second compound semiconductor layer 22 is degraded, whereby the current non-injecting inside region 52 and the current non-injecting outside region 53 become highly resistant. That is, the current non-injecting inside region 52 and the current non-injecting outside region 53 are formed by making the second surface 22b of the second compound semiconductor layer 22 exposed to the plasma particles. Note that the illustration of a first light reflecting layer 41 and a film thickness modulating layer 80 are omitted in FIGS. 29, 30, 31, and 32.

In the thirteenth embodiment as well, the boundary between a current injecting region 51 and the current non-injecting inside region 52 has a circular shape (diameter: 10 μm), and the boundary between the current non-injecting inside region 52 and the current non-injecting outside region 53 has a circular shape (diameter: 15 μm). That is, $$0.01 \leq S_1/(S_1+S_2) \leq 0.7 \quad (D-1)$$

is satisfied when the area of an orthogonal projection image of the current injecting region 51 is $S_1$ and the area of an orthogonal projection image of the current non-injecting inside region 52 is $S_2$. Specifically, $$S_1/(S_1+S_2) = 10^2/15^2 = 0.44$$

is satisfied.

In the thirteenth embodiment, the current non-injecting inside region 52 and the current non-injecting outside region 53 may only be formed in a laminated structure 20 on the basis of irradiation of plasma onto the second surface of the second compound semiconductor layer 22, ashing of the second surface of the second compound semiconductor layer 22, or reactive ion etching of the second surface of the second compound semiconductor layer 22 instead of [Step 1210] of the twelfth embodiment.

Since the configuration and structure of the light emitting element of the thirteenth embodiment are the same as those of the light emitting element of the twelfth embodiment other than the above point, their detailed descriptions will be omitted.

In the light emitting element of the thirteenth embodiment or the light emitting element of a fourteenth embodiment that will be described below, the magnitude of oscillating mode loss given by a mode loss affecting region with respect to a basic mode and a higher order mode can be controlled by arranging the current injecting region, the current non-injecting region, and the mode loss affecting region in the above prescribed relationship. The basic mode can be further stabilized by making the oscillating mode loss given to the higher order mode relatively larger than the oscillating mode loss given to the basic mode.

Fourteenth Embodiment

A fourteenth embodiment is a modification of the twelfth and thirteenth embodiments and relates to the light emitting element having the second-C configuration. As shown in the schematic partial cross-sectional view of FIG. 30, a second light reflecting layer 42 has a region that reflects or scatters light from a first light reflecting layer 41 toward the outside of a resonator structure constituted by the first light reflecting layer 41 and the second light reflecting layer 42 (that is, toward a mode loss affecting region 55) in the light emitting element of the fourteenth embodiment. Specifically, the portion of the second light reflecting layer 42 positioned above the lateral wall (the lateral wall of an opening part 54B) of a mode loss affecting portion (mode loss affecting layer) 54 has a forward tapered inclined part 42A, or has a region curved in a convex shape toward the first light reflecting layer 41.

In the fourteenth embodiment, the boundary between a current injecting region 51 and a current non-injecting inside region 52 has a circular shape (diameter: 8 μm), and the boundary between the current non-injecting inside region 52 and a current non-injecting outside region 53 has a circular shape (diameter: 10 μm to 20 μm).

In the fourteenth embodiment, the opening part 54B having a forward tapered lateral wall may only be formed when the mode loss affecting portion (mode loss affecting layer) 54 having the opening part 54B and made of $SiO_2$ is formed in the same step as [Step 1220] of the twelfth embodiment. Specifically, a resist layer is formed on the mode loss affecting layer formed on a second surface 22b of the second compound semiconductor layer 22, and an opening is provided in the portion of the resist layer in which the opening part 54B is to be formed on the basis of a photolithography technology. The lateral wall of the opening is formed into a forward tapered shape on the basis of a known method. Then, the opening part 54B having the forward tapered lateral wall can be formed in the mode loss affecting portion (mode loss affecting layer) 54 by etching back. In addition, the second light reflecting layer 42 can be given a forward tapered inclined part 42A by forming a second electrode 32 and the second light reflecting layer 42 on the mode loss affecting portion (mode loss affecting layer) 54.

Since the configuration and structure of the light emitting element of the fourteenth embodiment are the same as those of the configurations and structures of the light emitting elements of the twelfth and thirteenth embodiments other than the above point, their detailed descriptions will be omitted.

Fifteenth Embodiment

A fifteenth embodiment is a modification of the twelfth to fourteenth embodiments and relates to the light emitting element having the second-D configuration. As the schematic partial cross-sectional view of the light emitting element of the fifteenth embodiment is shown in FIG. 31 and the schematic partial cross-sectional view in which essential parts are cut out is shown in FIG. 32, a convex part 22A is formed on the side of a second surface 22b of a second compound semiconductor layer 22. Further, as shown in FIGS. 31 and 32, a mode loss affecting portion (mode loss affecting layer) 54 is formed above a region 22B of a second surface 22b of the second compound semiconductor layer 22 that surrounds the convex part 22A. The convex part 22A occupies a current injecting region 51, a current injecting region 51, and a current non-injecting inside region 52. The mode loss affecting portion (mode loss affecting layer) 54 is made of, for example, a dielectric material such as $SiO_2$ like the twelfth embodiment. The region 22B has a current non-injecting outside region 53.

$$L_0 < L_2$$

is satisfied when an optical distance from a light emitting layer 23 to the second surface of the second compound semiconductor layer 22 in the current injecting region 51 is $L_2$ and an optical distance from the light emitting layer 23 to the top surface (surface facing a second electrode 32) of the mode loss affecting portion 54 in a mode loss affecting region 55 is $L_0$. Specifically, $$L_2/L_0=1.5$$

is satisfied. Thus, a lens effect is produced in the light emitting element.

In the light emitting element of the fifteenth embodiment, generated laser light having a higher order mode is confined in the current injecting region 51 and the current non-injecting inside region 52 by the mode loss affecting region 55, whereby oscillating mode loss is decreased. That is, the generated optical field intensity of a basic mode and a higher order mode increases in orthogonal projection images of the current injecting region 51 and the current non-injecting inside region 52 due to the existence of the mode loss affecting region 55 affecting an increase and decrease in oscillating mode loss.

In the fifteenth embodiment, the boundary between the current injecting region 51 and the current non-injecting inside region 52 has a circular shape (diameter: 8 μm), and the boundary between the current non-injecting inside region 52 and the current non-injecting outside region 53 has a circular shape (diameter: 30 μm).

In the fifteenth embodiment, a part of the second compound semiconductor layer 22 may only be removed from the side of the second surface 22b to form the convex part 22A between [Step 1210] and [Step 1220] of the twelfth embodiment.

Since the configuration and structure of the light emitting element of the fifteenth embodiment are the same as those of the light emitting element of the twelfth embodiment other than the above point, their detailed descriptions will be omitted. In the light emitting element of the fifteenth embodiment, the threshold of laser oscillation can be reduced, besides suppressing oscillating mode loss given by the mode loss affecting region with respect to various modes and making a lateral mode undergo multimode oscillation. Further, as shown in the conceptual diagram of (C) of FIG. 28, the generated optical field intensity of a basic mode and a higher order mode can be increased in orthogonal projection images of the current injecting region and the current non-injecting inside region due to the existence of the mode loss affecting region affecting an increase and decrease (specifically, a decrease in the fifteenth embodiment) in oscillating mode loss.

Sixteenth Embodiment

A sixteenth embodiment is a modification of the twelfth to fifteenth embodiments. The light emitting element of the sixteenth embodiment or the light emitting element of a seventeenth embodiment that will be described later more specifically includes a surface emitting laser element (light emitting element) (vertical cavity surface emitting laser, VCSEL) that emits laser light from the top surface of a first compound semiconductor layer 21 via a film thickness modulating layer 80 and a first light reflecting layer 41.

In the light emitting element of the sixteenth embodiment, a second light reflecting layer 42 is fixed to a support substrate 49 constituted by a silicon semiconductor substrate via a joining layer 48 made of a gold (Au) layer or a soldier layer containing tin (Sn) on the basis of a soldier joining method as shown in the schematic partial cross-sectional view of FIG. 33. In the manufacturing of the light emitting element of the sixteenth embodiment, the same steps as [Step 1200] to [Step 1230] of the twelfth embodiment may only be, for example, performed other than the removal of the support substrate 49, that is, without removing the support substrate 49.

In the light emitting element of the sixteenth embodiment as well, the magnitude of oscillating mode loss given by a mode loss affecting region with respect to a basic mode and a higher order mode can be controlled by arranging a current injecting region, a current non-injecting region, and the mode loss affecting region in the above prescribed relationship. The basic mode can be further stabilized by making the oscillating mode loss given to the higher order mode relatively larger than the oscillating mode loss given to the basic mode.

In the example of the light emitting element described above and shown in FIG. 33, the edge part of a first electrode 31 is separated from the first light reflecting layer 41. That is, the first light reflecting layer 41 and the first electrode 31 are separated from each other. That is, the first light reflecting layer 41 and the first electrode 31 are arranged with an offset placed therebetween. The separated distance between the first light reflecting layer 41 and the first electrode 31 is within 1 mm, specifically 0.05 mm on average. However, without being limited to such a configuration, the end of the first electrode 31 may contact the first light reflecting layer 41, or may be formed over the edge part of the first light reflecting layer 41.

Further, for example, after the same steps as [Step 1200] to [Step 1230] of the twelfth embodiment, a light emitting element manufacturing substrate 11 may be removed to expose a first surface 21a of the first compound semiconductor layer 21, and then a film thickness modulating layer 80, the first light reflecting layer 41, and the first electrode 31 may be formed on the first surface 21a of the first compound semiconductor layer 21. Further, in the formation of the film thickness modulating layer 80 and the first light reflecting layer 41 on the first surface 21a of the first compound semiconductor layer 21, the first compound semiconductor layer 21 may be etched to form a concave part on the first surface 21a of the first compound semiconductor layer 21, so that the film thickness modulating layer 80 and the first light reflecting layer 41 are formed in the concave part. Further, in this case, the light emitting element having the second-C configuration can be obtained by making the lateral wall of the concave part formed into a forward tapered shape. That is, the first light reflecting layer 41 has a region (inclined part) that reflects or scatters light from the second light reflecting layer 42 toward the outside of a resonator structure constituted by the first light reflecting layer 41 and the second light reflecting layer 42.

Seventeenth Embodiment

A seventeenth embodiment is a modification of the seventh to eleventh embodiments but relates to the light emitting element having the third configuration, specifically the light emitting element having the third-A configuration. The light emitting element of the seventeenth embodiment more specifically includes a surface emitting laser element (light emitting element) (vertical cavity surface emitting laser, VCSEL) that emits laser light from the top surface of a first compound semiconductor layer 21 via a film thickness modulating layer 80 and a first light reflecting layer 41.

The light emitting element of the seventeenth embodiment shown in the schematic partial end view of FIG. 34 includes:

(a) a laminated structure 20 in which a first compound semiconductor layer 21 including a GaN-based compound semiconductor and having a first surface 21*a* and a second surface 21*b* facing the first surface 21*a*, a light emitting layer (active layer) 23 including a GaN-based compound semiconductor and contacting the second surface 21*b* of the first compound semiconductor layer 21, and a second compound semiconductor layer 22 including a GaN-based compound semiconductor, having a first surface 22*a* and a second surface 22*b* facing the first surface 22*a*, and making the first surface 22*a* contact the light emitting layer 23 are laminated to each other;

(b) a second electrode 32 formed on the second surface 22*b* of the second compound semiconductor layer 22;

(c) a second light reflecting layer 42 formed on the second electrode 32;

(d) a mode loss affecting portion 64 provided on the first surface 21*a* of the first compound semiconductor layer 21 and constituting a mode loss affecting region 65 affecting an increase and decrease in oscillating mode loss;

(e) a film thickness modulating layer 80 and a first light reflecting layer 41 formed over the mode loss affecting portion 64 from above the first surface 21*a* of the first compound semiconductor layer 21; and (f) a first electrode 31 electrically connected to the first compound semiconductor layer 21.

Note that the first electrode 31 is formed on the first surface 21*a* of the first compound semiconductor layer 21 in the light emitting element of the seventeenth embodiment.

Further, the laminated structure 20 has a current injecting region 61, a current non-injecting inside region 62 surrounding the current injecting region 61, and a current non-injecting outside region 63 surrounding the current non-injecting inside region 62, and an orthogonal projection image of the mode loss affecting region 65 and an orthogonal projection image of the current non-injecting outside region 63 overlap each other. Here, the laminated structure 20 has the current non-injecting regions 62 and 63. In the example shown in the figure, the current non-injecting regions 62 and 63 are formed over a part of the first compound semiconductor layer 21 from the second compound semiconductor layer 22 in a thickness direction. However, the current non-injecting regions 62 and 63 may be formed in a region on the side of the second electrode of the second compound semiconductor layer 22, may be formed over the entire second compound semiconductor layer 22, or may be formed over the second compound semiconductor layer 22 and the light emitting layer 23 in the thickness direction.

The configurations of the laminated structure 20, a pad electrode 33, the film thickness modulating layer 80, the first light reflecting layer 41, and the second light reflecting layer 42 can be the same as those of the twelfth embodiment, and the configurations of a joining layer 48 and a support substrate 49 can be the same as those of the sixteenth embodiment. The mode loss affecting portion 64 has a circular opening part 64A, and the first surface 21*a* of the first compound semiconductor layer 21 is exposed at the bottom part of the opening part 64A.

The mode loss affecting portion (mode loss affecting layer) 64 is made of a dielectric material such as $SiO_2$ and formed on the first surface 21*a* of the first compound semiconductor layer 21. The value of an optical film thickness to of the mode loss affecting portion 64 can be a value other than an integral multiple of ¼ of a wavelength $\lambda_0$ of light generated by the light emitting element. Alternatively, the value of the optical film thickness to of the mode loss affecting portion 64 can also be an integral multiple of ¼ of the wavelength $\lambda_0$ of light generated by the light emitting element. That is, the optical film thickness to of the mode loss affecting portion 64 can be thickness with which light generated by the light emitting element is not dephased and a standing wave is not broken. However, the value of the optical film thickness to is not necessarily strictly an integral multiple of ¼ but may only satisfy $$(\lambda_0/4n_0) \times m - (\lambda_0/8n_0) \leq t_0 \leq (\lambda_0/4n_0) \times 2m + (\lambda_0/8n_0) \quad \text{(E)}.$$

Specifically, the value of the optical film thickness to of the mode loss affecting portion 64 is preferably in the range of about 25 to 250 when the value of ¼ of the wavelength $\lambda_0$ of light generated by the light emitting element is assumed to be "100." Further, by the employment of these configurations, the phase difference between laser light passing through the mode loss affecting portion 64 and laser light passing through the current injecting region 61 can be changed (the phase difference can be controlled), the control of oscillating mode loss can be performed with a higher degree of freedom, and the degree of freedom in designing the light emitting element can be further enhanced.

In the seventeenth embodiment, the boundary between the current injecting region 61 and the current non-injecting inside region 62 has a circular shape (diameter: 8 μm), and the boundary between the current non-injecting inside region 62 and the current non-injecting outside region 63 has a circular shape (diameter: 15 μm). That is, $$0.01 \leq S_{1'}/(S_{1'}+S_{2'}) \leq 0.7 \quad \text{(D-2)}$$

is satisfied when the area of an orthogonal projection image of the current injecting region 61 is $S_{1'}$ and the area of an orthogonal projection image of the current non-injecting inside region 62 is $S_{2'}$. Specifically, $$S_{1'}/(S_{1'}+S_{2'}) = 8^2/15^2 = 0.28$$

is satisfied.

In the light emitting element of the seventeenth embodiment, $$L_{0'} > L_{1'}$$

is satisfied when an optical distance from the light emitting layer 23 to the first surface of the first compound semiconductor layer 21 in the current injecting region 61 is $L_{1'}$ and an optical distance from the light emitting layer 23 to the top surface (the surface facing the first electrode 31) of the mode loss affecting portion 64 in the mode loss affecting region 65 is $L_{0'}$. Specifically, $$L_{0'}/L_{1'} = 1.01$$

is satisfied. Then, generated laser light having a higher order mode is scattered and lost by the mode loss affecting region 65 toward the outside of a resonator structure constituted by the first light reflecting layer 41 and the second light reflecting layer 42, whereby oscillating mode loss is increased. That is, the generated optical field intensity of a basic mode and a higher order mode decreases in proportion to a distance from a Z-axis in an orthogonal projection image of the mode loss affecting region 65 due to the existence of the mode loss affecting region 65 affecting an increase and decrease in oscillating mode loss (see the conceptual diagram of (B) of FIG. 28). However, since the decrease in the optical field intensity of the higher order mode is larger than the decrease in the optical field intensity of the basic mode, the basic mode can be further stabilized, a threshold current can be reduced, and the relative optical field intensity of the basic mode can be increased.

In the light emitting element of the seventeenth embodiment, the current non-injecting inside region 62 and the current non-injecting outside region 63 are formed by ion implantation into the laminated structure 20 like the twelfth embodiment. Boron is, for example, selected as an ion type, but the ion type is not limited to boron.

Hereinafter, a description will be given of a method for manufacturing the light emitting element of the seventeenth embodiment.

[Step 1700]

First, a laminated structure 20 can be obtained in the same step as [Step 1200] of the twelfth embodiment. Next, a current non-injecting inside region 62 and a current non-injecting outside region 63 can be formed in the laminated structure 20 in the same step as [Step 1210] of the twelfth embodiment.

[Step 1710]

Next, on a second surface 22b of a second compound semiconductor layer 22, a second electrode 32 is formed on the basis of, for example, a lift-off method, and a pad electrode 33 is also formed on the basis of a known method. Subsequently, a second light reflecting layer 42 is formed over the pad electrode 33 from above the second electrode 32 on the basis of a known method.

[Step 1720]

Subsequently, the second light reflecting layer 42 is fixed to a support substrate 49 via a joining layer 48.

[Step 1730]

Next, a light emitting element manufacturing substrate 11 is removed to expose a first surface 21a of a first compound semiconductor layer 21. Specifically, the light emitting element manufacturing substrate 11 is first thinned on the basis of a machine polishing method, and a residual part of the light emitting element manufacturing substrate 11 is next removed on the basis of a CMP method. Thus, the first surface 21a of the first compound semiconductor layer 21 is exposed.

[Step 1740]

Subsequently, a mode loss affecting portion (mode loss affecting layer) 64 having an opening part 64A and made of $SiO_2$ is formed on the first surface 21a of the first compound semiconductor layer 21 on the basis of a known method.

[Step 1750]

Next, on the first surface 21a of the first compound semiconductor layer 21 exposed at the bottom part of the opening part 64A of the mode loss affecting portion 64, a base part 45F and a film thickness modulating layer 80 and a first light reflecting layer 41 constituted by a concave mirror part 43 including the film thickness modulating layer 80 and a multilayer light reflecting film 46 are formed, and a first electrode 31 is also formed. Thus, the light emitting element of the seventeenth embodiment having a configuration shown in FIG. 34 can be obtained.

[Step 1760]

Subsequently, the light emitting element is separated by so-called element separation, and the lateral surface or the exposed surface of the laminated structure is coated with, for example, an insulating film made of $SiO_2$. Then, packaging or sealing is performed, whereby the light emitting element of the seventeenth embodiment is completed.

In the light emitting element of the seventeenth embodiment as well, the laminated structure has the current injecting region, the current non-injecting inside region surrounding the current injecting region, and the current non-injecting outside region surrounding the current non-injecting inside region, and an orthogonal projection image of the mode loss affecting region and an orthogonal projection image of the current non-injecting outside region overlap each other. Therefore, as shown in the conceptual diagram of (B) of FIG. 28, it is possible to bring an increase and decrease (specifically, an increase in the seventeenth embodiment) in oscillating mode loss into a desired state. Furthermore, since the control of the oscillating mode loss and the control of the light emitting state of the light emitting element can be separately performed, the degree of freedom in control and the degree of freedom in designing the light emitting element can be increased. Specifically, the magnitude of the oscillating mode loss given by the mode loss affecting region with respect to the basic mode and the higher order mode can be controlled by arranging the current injecting region, the current non-injecting region, and the mode loss affecting region in the above prescribed relationship. The basic mode can be further stabilized by making the oscillating mode loss given to the higher order mode relatively larger than the oscillating mode loss given to the basic mode. Further, the influence of a reverse lens effect can be reduced. Furthermore, since the light emitting element of the seventeenth embodiment has the concave mirror part 43, the occurrence of diffraction loss can be further reliably suppressed.

In the seventeenth embodiment as well, the current non-injecting inside region 62 and the current non-injecting outside region 63 can be formed by irradiation of plasma onto the second surface of the second compound semiconductor layer 22, ashing of the second surface of the second compound semiconductor layer 22, or reactive ion etching (RIE) of the second surface of the second compound semiconductor layer 22 like the thirteenth embodiment (the light emitting element having the third-B configuration). Since the current non-injecting inside region 62 and the current non-injecting outside region 63 are exposed to plasma particles like this, the conductivity of the second compound semiconductor layer 22 is degraded, whereby the current non-injecting inside region 62 and the current non-injecting outside region 63 become highly resistant. That is, the current non-injecting inside region 62 and the current non-injecting outside region 63 are formed by making the second surface 22b of the second compound semiconductor layer 22 exposed to the plasma particles.

Further, like the fourteenth embodiment, the second light reflecting layer 42 can have a region that reflects or scatters light from the first light reflecting layer 41 toward the outside of a resonator structure constituted by the first light reflecting layer 41 and the second light reflecting layer 42 (that is, toward the mode loss affecting region 65) (the light emitting element having the third-C configuration). Alternatively, like the sixteenth embodiment, in the formation of the film thickness modulating layer 80 and the first light reflecting layer 41 on the first surface 21a of the first compound semiconductor layer 21, the first compound semiconductor layer 21 is etched to form a concave part on the first surface 21a of the first compound semiconductor layer 21, so that the film thickness modulating layer 80 and the first light reflecting layer 41 are formed in the concave part. However, the lateral wall of the concave part may be formed into a forward tapered shape.

Further, like the fifteenth embodiment, a convex part may be formed on the side of the first surface 21a of the first compound semiconductor layer 21, and the mode loss affecting portion (mode loss affecting layer) 64 may be formed on the region of the first surface 21a of the first compound semiconductor layer 21 surrounding the convex part (the light emitting element having the third-D configuration). The mode loss affecting portion (mode loss affecting layer) 64 may only be formed on the region of the first surface 21a of the first compound semiconductor layer 21 surrounding the convex part. The convex part occupies the current injecting region 61, the current injecting region 61, and the current non-injecting inside region 62. Thus, generated laser light having a higher order mode is confined in the current injecting region 61 and the current non-injecting inside region 62 by the mode loss affecting region 65, whereby oscillating mode loss is decreased. That is, the generated optical field intensity of a basic mode and a higher order mode increases in orthogonal projection images of the current injecting region 61 and the current non-injecting inside region 62 due to the existence of the mode loss affecting region 65 affecting an increase and decrease in oscillating mode loss. In the modified example of the light emitting element of the seventeenth embodiment thus configured as well, the threshold of laser oscillation can be reduced, besides suppressing oscillating mode loss given by the mode loss affecting region 65 with respect to various modes and making a lateral mode undergo multimode oscillation. Further, as shown in the conceptual diagram of (C) of FIG. 28, the generated optical field intensity of a basic mode and a higher order mode can be increased in orthogonal projection images of the current injecting region and the current non-injecting inside region due to the existence of the mode loss affecting region 65 affecting an increase and decrease (specifically, a decrease in the modified example of the light emitting element of the seventeenth embodiment) in oscillating mode loss.

According to circumstances, a convex part (mesa structure) may be formed on the side of the first surface 21a of the first compound semiconductor layer 21 to make the region of the first compound semiconductor layer 21 surrounding the convex part serve as the mode loss affecting region (mode loss affecting portion). That is, in this case, the formation of the mode loss affecting layer may be omitted, and the mode loss affecting portion may be constituted by the region of the first compound semiconductor layer surrounding the convex part. Further, the film thickness modulating layer 80 and the first light reflecting layer 41 may only be formed on the top surface of the convex part. The convex part occupies the current injecting region 61, the current injecting region 61, and the current non-injecting inside region 62. Thus, generated laser light having a higher order mode is confined in the current injecting region 61 and the current non-injecting inside region 62 by the mode loss affecting region, whereby oscillating mode loss is decreased. That is, the generated optical field intensity of a basic mode and a higher order mode increases in orthogonal projection images of the current injecting region 61 and the current non-injecting inside region 62 due to the existence of the mode loss affecting region affecting an increase and decrease in oscillating mode loss. In the modified example of the light emitting element of the seventeenth embodiment thus configured as well, the threshold of laser oscillation can be reduced, besides suppressing oscillating mode loss given by the mode loss affecting region with respect to various modes and making a lateral mode undergo multimode oscillation. Further, as shown in the conceptual diagram of (C) of FIG. 28, the generated optical field intensity of a basic mode and a higher order mode can be increased in orthogonal projection images of the current injecting region and the current non-injecting inside region due to the existence of the mode loss affecting region affecting an increase and decrease (specifically, a decrease in the modified example of the light emitting element of the seventeenth embodiment) in oscillating mode loss.

Eighteenth Embodiment

An eighteenth embodiment is a modification of the seventh to seventeenth embodiments, is also a modification of the fourth embodiment, and relates to the light emitting element having the fourth configuration.

As shown in the schematic partial cross-sectional view of FIG. 35, a laminated structure 20 including a second electrode 32 has at least two light absorbing material layers 91, preferably at least four light absorbing material layers 91, and specifically 20 light absorbing material layers 91 in the eighteenth embodiment in parallel with a virtual plane occupied by a light emitting layer 23 in the light emitting element of the eighteenth embodiment like the fourth embodiment. Note that only the two light absorbing material layers 91 are shown for simplification in the drawing.

In the eighteenth embodiment as well, an oscillating wavelength (desired oscillating wavelength emitted from the light emitting element) $\lambda_0$ is 450 nm. The 20 light absorbing material layers 91 are made of a compound semiconductor material having a band gap narrower than that of a compound semiconductor constituting the laminated structure 20, specifically n-$In_{0.2}Ga_{0.8}N$, and formed inside a first compound semiconductor layer 21. The light absorbing material layers 91 have a thickness of $\lambda_0/(4 \cdot n_{eq})$ or less, specifically 3 mm. Further, the light absorbing material layers 91 have a light absorbing coefficient twice or more, specifically $1 \times 10^3$ times as large as the light absorbing coefficient of the first compound semiconductor layer 21 made of an n-GaN layer.

Further, the light absorbing material layers 91 are positioned at a minimum amplitude portion occurring in the standing wave of light formed inside the laminated structure, and the light emitting layer 23 is positioned at a maximum amplitude portion occurring in the standing wave of light formed inside the laminated structure. The distance between the center in the thickness direction of the light emitting layer 23 and the center in the thickness direction of the light absorbing material layers 91 adjacent to the light emitting layer 23 is 46.5 nm. In addition, when the entire equivalent refractive index of the two light absorbing material layers 91 and the portion of the laminated structure positioned between the light absorbing material layers 91 (specifically, the first compound semiconductor layer 21 in the eighteenth embodiment) is $n_{eq}$ and the distance between the light absorbing material layers 91 is $L_{Abs}$, the above formula (B-1) [however, m=1] is satisfied. Accordingly, the distance between the adjacent light absorbing material layers 91 satisfies the above formula (B-2) in all the plurality of light absorbing material layers 91 (the 20 light absorbing material layers 91). The value of the equivalent refractive index $n_{eq}$ is specifically 2.42, and $$L_{Abs}=1\times450/(2\times2.42)=93.0 \text{ nm}$$

is satisfied when m is one. Note that m can be any integer of two or more in a part of the light absorbing material layers 91 inside the 20 light absorbing material layers 91.

In the manufacturing of the light emitting element of the eighteenth embodiment, the laminated structure 20 is formed in the same step as [Step 700] of the seventh embodiment. At this time, the 20 light absorbing material layers 91 are simultaneously formed inside the first compound semiconductor layer 21. Other than this point, the light emitting element of the eighteenth embodiment can be manufactured in the same manner as the light emitting element of the seventh embodiment.

A plurality of longitudinal modes occurring in a gain spectrum determined by the light emitting layer 23 are schematically expressed as shown in FIG. 11 described above. Further, it is assumed in this case that the light absorbing material layers 91 are positioned at the minimum amplitude portion of the longitudinal mode A and are not positioned at the minimum amplitude portion of the longitudinal mode B. As a result, the mode loss of the longitudinal mode A is minimized, but the mode loss of the longitudinal mode B is large. Accordingly, the longitudinal mode A facilitates oscillation compared with the longitudinal mode B. Therefore, the employment of such a structure, that is, the control of the position or the cycle of the light absorbing material layers 91 can stabilize a specific longitudinal mode and facilitate oscillation. On the other hand, since the mode loss of the other undesirable longitudinal mode can be increased, it is possible to suppress the oscillation of the other undesired longitudinal mode.

As described above, in the light emitting element of the eighteenth embodiment, at least the two light absorbing material layers are formed inside the laminated structure. Therefore, the oscillation of laser light in an undesired longitudinal mode among laser light in a plurality of types of longitudinal modes capable of being emitted from a surface emitting laser element can be suppressed. As a result, it is possible to accurately control the oscillating wavelength of the emitted laser light. Furthermore, since the light emitting element of the eighteenth embodiment has the concave mirror part 43, the occurrence of diffraction loss can be reliably suppressed.

In the light emitting element of the eighteenth embodiment, the light absorbing material layers 91 can be made of a compound semiconductor material doped with impurities, specifically a compound semiconductor material (specifically, n-GaN: Si) having an impurity concentration (impurities: Si) of $1 \times 10^{19}/cm^3$ like the fifth embodiment.

Further, like the sixth embodiment, five light absorbing material layers can be made of $n-In_{0.3}Ga_{0.7}N$, and one light absorbing material layer (serving also as the second electrode 32 made of ITO) can be made of a transparent conductive material. The five light absorbing material layers satisfy the above formula (B-2), and also satisfy the above formula (B-3). Note that the positional relationship between the light absorbing material layer serving also as the second electrode 32 and the light absorbing material layers 91 satisfies the above formula (B-1).

Further, as a modified example of the light emitting element of the eighteenth embodiment, laser light can be emitted from the top surface of the first compound semiconductor layer 21 via the first light reflecting layer 41. That is, as shown in the schematic partial cross-sectional view of FIG. 36, a second light reflecting layer 42 is fixed to a support substrate 49 constituted by a silicon semiconductor substrate via a joining layer 48 made of a gold (Au) layer or a soldier layer containing tin (Sn) on the basis of a soldier joining method. 33. Such a light emitting element can be manufactured in the same method as the light emitting element of the seventh embodiment except for the point that the 20 light absorbing material layers 91 are simultaneously formed inside the first compound semiconductor layer 21 and the point that the support substrate 49 is not removed.

The light emitting elements of the present disclosure are described above on the basis of the various preferred embodiments but are not limited to these embodiments. The configurations and structures of the light emitting elements described in the embodiments are given for exemplification and can be appropriately modified, and the methods for manufacturing the light emitting elements can be appropriately modified. According to circumstances, a surface emitting laser element that emits light from the top surface of a second compound semiconductor layer via a second light reflecting layer can be obtained by properly selecting a joining layer or a support substrate. A surface emitting laser element that emits light from the top surface of a second compound semiconductor layer via a second light reflecting layer can be completed by removing a support substrate after forming a first light reflecting layer and a first electrode. Alternatively, a surface emitting laser element that emits light from the top surface of a second compound semiconductor layer via a second light reflecting layer can be completed by removing a support substrate to expose the second light reflecting layer after fixing a first light reflecting layer to the second support substrate.

Note that the present disclosure can employ the following configurations.

<<Light Emitting Element>>

A light emitting element including a first light reflecting layer, a laminated structure, and a second light reflecting layer laminated to each other, wherein
    the laminated structure includes a first compound semiconductor layer, a light emitting layer, and a second compound semiconductor layer laminated to each other from a side of the first light reflecting layer,
    light from the laminated structure is emitted to an outside via the first light reflecting layer or the second light reflecting layer,
    the first light reflecting layer has a structure in which at least two types of thin films are alternately laminated to each other in plural numbers, and
    a film thickness modulating layer is provided between the laminated structure and the first light reflecting layer.

[A02] The light emitting element according to [A01], wherein
    the first light reflecting layer has a structure in which first thin films having an optical film thickness of $t_1$ and second thin films having an optical film thickness of $t_2$ (where $t_2 \neq t_1$) are alternately laminated to each other in plural numbers, and
    the film thickness modulating layer is constituted by at least one layer of a third thin film having an optical film thickness of $t_3$ (where $t_3 \neq t_1$).

[A03] The light emitting element according to [A02], wherein
    $t_3/t_1 \geq 1.1$ or $t_3/t_1 \leq 0.9$ is satisfied.

[A04] The light emitting element according to [A02] or [A03], wherein
    the first thin films are made of a first material, and
    the second thin films are made of a second material different from the first material.

[A05] The light emitting element according to any one of [A02] to [A04], wherein
    the film thickness modulating layer has a structure in which third thin films and fourth thin films having an optical film thickness of $t_4$ are laminated to each other.

[A06] The light emitting element according to [A05], wherein
    the film thickness modulating layer has a structure in which the third thin films and the fourth thin films are alternately laminated to each other in plural numbers, and an optical film thickness of at least one layer among the third thin films satisfies $t_3 \neq t_1$.

[A07] The light emitting element according to [A06], wherein
an optical film thickness of at least one layer among the fourth thin films satisfies $t_4 \neq t_2$.

[A08] The light emitting element according to [A07], wherein
the third thin film satisfying $t_3 \neq t_1$ or the fourth thin film satisfying $t_4 \neq t_2$ contacts the first light reflecting layer.

[A09] The light emitting element according to [A08], wherein
the third thin film other than the third thin film satisfying $t_3 \neq t_1$ satisfies $t_3 = t_1$, and
the fourth thin film other than the fourth thin film satisfying $t_4 \neq t_2$ satisfies $t_4 = t_2$.

[A10] The light emitting element according to any one of [A06] to [A09], wherein
the total number of the layers of the third thin films and the fourth thin films is five or less.

[A11] The light emitting element according to any one of [A05] to [A10], wherein
the third thin films are made of the first material, and the fourth thin films are made of the second material.

[A12] The light emitting element according to any one of [A01] to [A11], wherein
the first light reflecting layer is formed on a substrate.

[A13] The light emitting element according to [A12], wherein
the laminated structure is formed on a region of the substrate where the first light reflecting layer is not formed.

[A14] The light emitting element according to any one of [A01] to [A11], wherein
the first light reflecting layer is formed on an exposed surface of the laminated structure.

[A15] The light emitting element according to any one of [A04] to [A11], wherein
the first material includes a compound semiconductor material, and
the second material also includes a compound semiconductor material.

[A16] The light emitting element according to any one of [A04] to [A14], wherein
the first material includes a dielectric material, and
the second material also includes a dielectric material.

[A17] The light emitting element according to any one of [A01] to [A16], wherein
the first light reflecting layer has a concave mirror part, and
the second light reflecting layer has a flat shape.

[A18] The light emitting element according to any one of [A01] to [A17], wherein
the first compound semiconductor layer has a thickness larger than a thickness of the second compound semiconductor layer.

[A19] The light emitting element according to any one of [A01] to [A18], wherein
the laminated structure includes a GaN-based compound semiconductor.

[A20] The light emitting element according to any one of [A01] to [A19], wherein
irregularities are formed at an interface between the laminated structure and the film thickness modulating layer and have a root-mean-square roughness Rq of 1 nm or more as surface roughness.

[A21] The light emitting element according to any one of [A01] to [A20], wherein
point defects are formed at the interface between the laminated structure and the film thickness modulating layer and have a density of $1 \times 10^{17}/cm^3$ or more.

[A22] The light emitting element according to any one of [A01] to [A21], wherein
pores are formed at the interface between the laminated structure and the film thickness modulating layer and have a thickness of 10 nm or less.

[A23] The light emitting element according to any one of [A01] to [A22], wherein
a material constituting the film thickness modulating layer is different from materials constituting the first compound semiconductor layer, the light emitting layer, and the second compound semiconductor layer.

[B01] <<Light Emitting Element Including Light Absorbing Material Layers>>
The light emitting element according to any one of [A01] to [A23], wherein
at least two light absorbing material layers are formed inside the laminated structure in parallel with a virtual plane occupied by the light emitting layer.

[B02] The light emitting element according to [B01], wherein
at least four light absorbing material layers are formed.

[B03] The light emitting element according to [B01] or [B02], wherein $$0.9 \times \{(m \cdot \lambda_0)/(2 \cdot n_{ep})\} \leq L_{Abs} \leq 1.1 \times \{(m \cdot \lambda_0)/(2 \cdot n_{ep})\}$$

is satisfied when an oscillating wavelength is $\lambda_0$, an entire equivalent refractive index of the two light absorbing material layers and a portion of the laminated structure positioned between the light absorbing material layers is $n_{eq}$, and a distance between the light absorbing material layers is $L_{Abs}$.

Here, m is one or any integer of two or more including one.

[B04] The light emitting element according to any one of [B01] to [B03], wherein
the light absorbing material layers have a thickness of $\lambda_0/(4 \cdot n_{eq})$ or less.

[B05] The light emitting element according to any one of [B01] to [B04], wherein
the light absorbing material layers are positioned at a minimum amplitude portion occurring in a standing wave of light formed inside the laminated structure.

[B06] The light emitting element according to any one of [B01] to [B05], wherein
the light emitting layer is positioned at a maximum amplitude portion occurring in the standing wave of the light formed inside the laminated structure.

[B07] The light emitting element according to any one of [B01] to [B06], wherein
the light absorbing material layers have a light absorbing coefficient twice or more as large as a light absorbing coefficient of a compound semiconductor constituting the laminated structure.

[B08] The light emitting element according to any one of [B01] to [B07], wherein
the light absorbing material layers are made of at least one type of a material selected from a group including a compound semiconductor material having a band gap narrower than a band gap of the compound semiconductor constituting the laminated structure, a compound semiconductor material doped with impurities, a transparent conductive material, and a light reflecting layer constituting material having light absorbing characteristics.

[C01] <<Light Emitting Element Having Concave Mirror Part>>
The light emitting element according to any one of [A01] to [B08], wherein
the first light reflecting layer and the film thickness modulating layer have a concave mirror part, and
the second light reflecting layer has a flat shape.

[C02] The light emitting element according to [C01], wherein
$1 \times 10^{-5}$ m $\leq L_{OR}$ is satisfied when a resonator length is $L_{OR}$.

[C03] The light emitting element according to [C01] or [C02], wherein
a graphic drawn by an interface at which a part of the concave mirror part constituted by the first light reflecting layer and the film thickness modulating layer faces the laminated structure is a part of a circle or a part of a parabola when the first light reflecting layer and the film thickness modulating layer are cut along a virtual plane including a laminating direction of the laminated structure.

[D01] <<Light Emitting Element Having First Configuration>>
The light emitting element according to any one of [C01] to [C03], wherein
the second compound semiconductor layer is provided with a current injecting region and a current non-injecting region surrounding the current injecting region, and
a shortest distance $D_{CI}$ from an area gravity point of the current injecting region to a boundary between the current injecting region and the current non-injecting region satisfies the following formula.

$$D_{CI} \geq \omega_0/2$$

However, $$\omega_0^2 = (\lambda_0/\pi)\{L_{OR}(R_{DBR}-L_{OR})\}^{1/2}$$

where
$\lambda_0$: the wavelength of light mainly emitted from the light emitting element
$L_{OR}$: an oscillator length
$R_{DBR}$: a curvature radius of the concave mirror part constituted by the first light reflecting layer and the film thickness modulating layer

[D02] The light emitting element according to [D01] further including:
a mode loss affecting portion provided on a second surface of the second compound semiconductor layer and constituting a mode loss affecting region affecting an increase and decrease in oscillation mode loss;
a second electrode formed over the mode loss affecting portion from above the second surface of the second compound semiconductor layer; and
a first electrode electrically connected to the first compound semiconductor layer, wherein
the second light reflecting layer is formed on the second electrode,
the laminated structure has a current injecting region, a current non-injecting inside region surrounding the current injecting region, and a current non-injecting outside region surrounding the current non-injecting inside region, and
an orthogonal projection image of the mode loss affecting region and an orthogonal projection image of the current non-injecting outside region overlap each other.

[D03] The light emitting element according to [D01] or [D02], wherein
a radius $r'_{DBR}$ of an effective region in the concave mirror part constituted by the first light reflecting layer and the film thickness modulating layer satisfies $$\omega_0 \leq r'_{DBR} \leq 20 \cdot \omega_0.$$

[D04] The light emitting element according to any one of [D01] to [D03], wherein
$D_{CI} \geq \omega_0$ is satisfied.

[D05] The light emitting element according to any one of [D01] to [D04], wherein
$R_{DBR} \leq 1 \times 10^{-3}$ m is satisfied.

[E01] <<Light Emitting Element Having Second Configuration>>
The light emitting element according to any one of [C01] to [C03], further including:
a mode loss affecting portion provided on a second surface of the second compound semiconductor layer and constituting a mode loss affecting region affecting an increase and decrease in oscillation mode loss;
a second electrode formed over the mode loss affecting portion from above the second surface of the second compound semiconductor layer; and
a first electrode electrically connected to the first compound semiconductor layer, wherein
the second light reflecting layer is formed on the second electrode,
the laminated structure has a current injecting region, a current non-injecting inside region surrounding the current injecting region, and a current non-injecting outside region surrounding the current non-injecting inside region, and
an orthogonal projection image of the mode loss affecting region and an orthogonal projection image of the current non-injecting outside region overlap each other.

[E02] The light emitting element according to [E01], wherein
the current non-injecting outside region is positioned below the mode loss affecting region.

[E03] The light emitting element according to [E01] or [E02], wherein $$0.01 \leq S_1/(S_1+S_2) \leq 0.7$$

is satisfied when an area of an orthogonal projection image of the current injecting region is $S_1$ and an area of an orthogonal projection image of the current non-injecting inside region is $S_2$.

[E04] The light emitting element according to any one of [E01] to [E03], wherein
the current non-injecting inside region and the current non-injecting outside region are formed by ion implantation into the laminated structure.

[E05] The light emitting element according to [E04], wherein an ion type is at least one type of ion selected from a group including boron, proton, phosphor, arsenic, carbon, nitrogen, fluorine, oxygen, germanium, and silicon.

[E06] <<Light Emitting Element Having Second-B Configuration>>

The light emitting element according to any one of [E01] to [E05], wherein the current non-injecting inside region and the current non-injecting outside region are formed by irradiation of plasma onto the second surface of the second compound semiconductor layer, ashing of the second surface of the second compound semiconductor layer, or reactive ion etching of the second surface of the second compound semiconductor layer.

[E07] <<Light Emitting Element Having Second-C Configuration>>

The light emitting element according to any one of [E01] to [E06], wherein the second light reflecting layer has a region that reflects or scatters light from the first light reflecting layer toward an outside of a resonator structure constituted by the first light reflecting layer and the second light reflecting layer.

[E08] The light emitting element according to any one of [E04] to [E07], wherein $$L_0 > L_2$$

is satisfied when an optical distance from the light emitting layer to the second surface of the second compound semiconductor layer in the current injecting region is $L_2$ and an optical distance from the light emitting layer to a top surface of the mode loss affecting portion in the mode loss affecting region is $L_0$.

[E09] The light emitting element according to any one of [E04] to [E08], wherein generated light having a higher order mode is scattered and lost by the mode loss affecting region toward the outside of the resonator structure constituted by the first light reflecting layer and the second light reflecting layer, whereby oscillating mode loss is increased.

[E10] The light emitting element according to any one of [E04] to [E09], wherein the mode loss affecting portion is made of a dielectric material, a metal material, or an alloy material.

[E11] The light emitting element according to [E10], wherein the mode loss affecting portion is made of a dielectric material, and a value of optical film thickness of the mode loss affecting portion is a value other than an integral multiple of ¼ of a wavelength of light generated by the light emitting element.

[E12] The light emitting element according to [E10], wherein the mode loss affecting portion is made of a dielectric material, and a value of an optical film thickness of the mode loss affecting portion is an integral multiple of ¼ of a wavelength of light generated by the light emitting element.

[E13] <<Light Emitting Element Having Second-D Configuration>>

The light emitting element according to any one of [E01] to [E03], wherein a convex part is formed on a side of the second surface of the second compound semiconductor layer, and the mode loss affecting portion is formed on a region of the second surface of the second compound semiconductor layer surrounding the convex part.

[E14] The light emitting element according to [E13], wherein $$L_0 < L_2$$

is satisfied when an optical distance from the light emitting layer to the second surface of the second compound semiconductor layer in the current injecting region is $L_2$ and an optical distance from the light emitting layer to a top surface of the mode loss affecting portion in the mode loss affecting region is $L_0$.

[E15] The light emitting element according to [E13] or [E14], wherein generated light having a higher order mode is confined in the current injecting region and the current non-injecting inside region by the mode loss affecting region, whereby oscillating mode loss is decreased.

[E16] The light emitting element according to any one of [E13] to [E15], wherein the mode loss affecting portion is made of a dielectric material, a metal material, or an alloy material.

[E17] The light emitting element according to any one of [E01] to [E16], wherein the second electrode is made of a transparent conductive material.

[F01] <<Light Emitting Element Having Third Configuration>>

The light emitting element according to any one of [C01] to [C03], further including:

a second electrode formed on a second surface of the second compound semiconductor layer;

the second light reflecting layer formed on the second electrode;

a mode loss affecting portion provided on a first surface of the first compound semiconductor layer and constituting a mode loss affecting region affecting an increase and decrease in oscillation mode loss; and a first electrode electrically connected to the first compound semiconductor layer, wherein the first light reflecting layer and the film thickness modulating layer are formed over the mode loss affecting portion from above the first surface of the first compound semiconductor layer, the laminated structure has a current injecting region, a current non-injecting inside region surrounding the current injecting region, and a current non-injecting outside region surrounding the current non-injecting inside region, and an orthogonal projection image of the mode loss affecting region and an orthogonal projection image of the current non-injecting outside region overlap each other.

[F02] The light emitting element according to [F01], wherein $$0.01 \leq S_1/(S_1+S_2) \leq 0.7$$

is satisfied when an area of an orthogonal projection image of the current injecting region is $S_1$ and an area of an orthogonal projection image of the current non-injecting inside region is $S_2$.

[F03]<<Light Emitting Element Having Third-A Configuration>>

The light emitting element according to [F01] or [F02], wherein
the current non-injecting inside region and the current non-injecting outside region are formed by ion implantation into the laminated structure.

[F04] The light emitting element according to [F03], wherein
an ion type is at least one type of ion selected from a group including boron, proton, phosphor, arsenic, carbon, nitrogen, fluorine, oxygen, germanium, and silicon.

[F05]<<Light Emitting Element Having Third-B Configuration>>

The light emitting element according to any one of [F01] to [F04], wherein
the current non-injecting inside region and the current non-injecting outside region are formed by irradiation of plasma onto the second surface of the second compound semiconductor layer, ashing of the second surface of the second compound semiconductor layer, or reactive ion etching of the second surface of the second compound semiconductor layer.

[F06]<<Light Emitting Element Having Third-C Configuration>>

The light emitting element according to any one of [F01] to [F05], wherein
the second light reflecting layer has a region that reflects or scatters light from the first light reflecting layer toward an outside of a resonator structure constituted by the first light reflecting layer and the second light reflecting layer.

[F07] The light emitting element according to any one of [F03] to [F06], wherein $$L_{0'} > L_{1'}$$

is satisfied when an optical distance from the light emitting layer to the first surface of the first compound semiconductor layer in the current injecting region is $L_{1'}$ and an optical distance from the light emitting layer to a top surface of the mode loss affecting portion in the mode loss affecting region is $L_{0'}$.

[F08] The light emitting element according to any one of [F03] to [F07], wherein
generated light having a higher order mode is scattered and lost by the mode loss affecting region toward the outside of the resonator structure constituted by the first light reflecting layer and the second light reflecting layer, whereby oscillating mode loss is increased.

[F09] The light emitting element according to any one of [F03] to [F08], wherein
the mode loss affecting portion is made of a dielectric material, a metal material, or an alloy material.

[F10] The light emitting element according to [F09], wherein
the mode loss affecting portion is made of a dielectric material, and a value of an optical film thickness of the mode loss affecting portion is a value other than an integral multiple of ¼ of a wavelength of light generated by the light emitting element.

[F11] The light emitting element according to [F09], wherein
the mode loss affecting portion is made of a dielectric material, and a value of an optical film thickness of the mode loss affecting portion is an integral multiple of ¼ of a wavelength of light generated by the light emitting element.

[F12]<<Light Emitting Element Having Third-D Configuration>>

The light emitting element according to [F01] or [F02], wherein
a convex part is formed on a side of the first surface of the first compound semiconductor layer, and
the mode loss affecting portion is formed on a region of the first surface of the first compound semiconductor layer surrounding the convex part.

[F13] The light emitting element according to [F12], wherein $$L_{0'} < L_{1'}$$

is satisfied when an optical distance from the light emitting layer to the first surface of the first compound semiconductor layer in the current injecting region is $L_{1'}$ and an optical distance from the light emitting layer to the top surface of the mode loss affecting portion in the mode loss affecting region is $L_{0'}$.

[F14] The light emitting element according to [F01] or [F02], wherein
a convex part is formed on a side of the first surface of the first compound semiconductor layer, and
the mode loss affecting portion is constituted by a region of the first surface of the first compound semiconductor layer surrounding the convex part.

[F15] The light emitting element according to according to any one of [F12] to [F14], wherein
generated light having a higher order mode is confined in the current injecting region and the current non-injecting inside region by the mode loss affecting region, whereby oscillating mode loss is decreased.

[F16] The light emitting element according to any one of [F12] to [F15], wherein
the mode loss affecting portion is made of a dielectric material, a metal material, or an alloy material.

[F17] The light emitting element according to any one of [F01] to [F16], wherein
the second electrode is made of a transparent conductive material.

[G01] <<Light Emitting Element Having Fourth Configuration>>

The light emitting element according to any one of [C01] to [F17], wherein
the laminated structure including the second electrode has at least two light absorbing material layers in parallel with a virtual plane occupied by the light emitting layer.

[G02] The light emitting element according to [G01], wherein
at least four light absorbing material layers are formed.

[G03] The light emitting element according to [G01] or [G02], wherein $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied when an oscillating wavelength is $\lambda_0$, an entire equivalent refractive index of two light absorbing material layers and a portion of the laminated structure positioned between the light absorbing material layers is $n_{eq}$, and a distance between the light absorbing material layers is $L_{Abs}$.

Here, m is one or any integer of two or more including one.

[G04] The light emitting element according to any one of [G01] to [G03], wherein
the light absorbing material layers have a thickness of $\lambda_0/(4 \cdot n_{eq})$ or less.

[G05] The light emitting element according to any one of [G01] to [G04], wherein
the light absorbing material layers are positioned at the minimum amplitude portion occurring at the standing wave of the light formed inside the laminated structure.

[G06] The light emitting element according to any one of [G01] to [G05], wherein
the light emitting layer is positioned at the maximum amplitude portion occurring in the standing wave of the light formed inside the laminated structure.

[G07] The light emitting element according to any one of [G01] to [G06], wherein
the light absorbing material layers have a light absorbing coefficient twice or more as large as a light absorbing coefficient of a compound semiconductor constituting the laminated structure.

[G08] The light emitting element according to any one of [G01] to [G07], wherein
the light absorbing material layers are made of at least one type of a material selected from a group including a compound semiconductor material having a band gap narrower than a band gap of the compound semiconductor constituting the laminated structure, a compound semiconductor material doped with impurities, a transparent conductive material, and a light reflecting layer constituting material having light absorbing characteristics.

[H01] The light emitting element according to any one of [C01] to [C08], wherein
a compound semiconductor substrate is disposed between the first surface of the first compound semiconductor layer and the first light reflecting layer and the film thickness modulating layer.

[H02] The light emitting element according to [H01], wherein
the compound semiconductor substrate includes a GaN substrate.

[H03] The light emitting element according to [H01] or [H02], wherein
the concave mirror part constituted by the first light reflecting layer and the film thickness modulating layer is constituted by a base part including a protruding part of the compound semiconductor substrate and the film thickness modulating layer and a multilayer light reflecting film formed on at least a part of a surface of the base part.

[H04] The light emitting element according to [H01] or [H02], wherein
the concave mirror part constituted by the first light reflecting layer and the film thickness modulating layer is constituted by a base part formed on the compound semiconductor substrate and a multilayer light reflecting film and the film thickness modulating layer formed on at least a part of a surface of the base part.

[H05] The light emitting element according to any one of [C01] to [G08], wherein
the first light reflecting layer and the film thickness modulating layer are formed on the first surface of the first compound semiconductor layer.

[H06] The light emitting element according to any one of [C01] to [H05], wherein
the laminated structure has a heat conductivity value higher than a heat conductivity value of the first light reflecting layer and the film thickness modulating layer.

[H07] The light emitting element according to any one of [C01] to [H06], wherein $R_{DBR} \leq 1 \times 10^{-3} m$ is satisfied when a curvature radius of the concave mirror part of the light emitting element is $R_{DBR}$.

[H08] The light emitting element according to any one of [C01] to [H07], wherein
a convex-shaped part is formed around the first light reflecting layer and the film thickness modulating layer, and the first light reflecting layer does not protrude from the convex-shaped part.

[J01]<<Method for Manufacturing Light Emitting Element>>

A method for manufacturing a light emitting element, the method including the steps of:
forming on a compound semiconductor substrate a laminated structure including a GaN-based compound semiconductor in which
a first compound semiconductor layer having a first surface and a second surface facing the first surface,
a light emitting layer facing the second surface of the first compound semiconductor layer, and
a second compound semiconductor layer having a first surface facing the light emitting layer and a second surface facing the first surface are laminated to each other;
forming a second electrode and a second light reflecting layer on the second compound semiconductor layer;
fixing the second light reflecting layer to a support substrate;
thinning the compound semiconductor substrate;
forming a base part including a protruding part at an exposed surface of the compound semiconductor substrate or forming the base part including the protruding part on the exposed surface of the compound semiconductor substrate; and
forming a film thickness modulating layer and a first light reflecting layer on at least a part of the base part and forming a first electrode electrically connected to the first compound semiconductor layer, wherein
the base part constitutes a concave mirror part, and
the second light reflecting layer has a flat shape.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 11 compound semiconductor substrate (light emitting element manufacturing substrate)
11a first surface of compound semiconductor substrate (light emitting element manufacturing substrate) facing first compound semiconductor layer
11a' protruding part of first surface of compound semiconductor substrate
11a" concave part
11b second surface of compound semiconductor substrate (light emitting element manufacturing substrate) facing first compound semiconductor layer
11A convex-shaped part
20 laminated structure 21 first compound semiconductor layer
21a first surface of first compound semiconductor layer
21b second surface of first compound semiconductor layer
21d, 21e protruding part of first surface of first compound semiconductor layer
22 second compound semiconductor layer
22a first surface of second compound semiconductor layer
22b second surface of second compound semiconductor layer
23 light emitting layer (active layer)
31 first electrode
32 second electrode
33 pad electrode
34 insulating layer (current constricting layer)
34A opening part provided on insulating layer (current constricting layer)
41 first light reflecting layer
41A first thin film
41B second thin film
41a inclined part formed at first compound semiconductor layer
42 second light reflecting layer
42A forward tapered inclined part formed at second light reflecting layer
43 concave mirror part
43A concave part
43a interface facing laminated structure of effective region in concave mirror part of first light reflecting layer
44 effective region in concave mirror part of first light reflecting layer
45A, 45B, 45D, 45E, 45F base part
45c protruding part
46 multilayer light reflecting film
47 flattening film
48 joining layer
49 support substrate
51, 61 current injecting region
52, 62 current non-injecting inside region
53, 63 current non-injecting outside region
54, 64 mode loss affecting portion (mode loss affecting layer)
54A, 54B, 64A opening part formed on mode loss affecting portion
55, 65 mode loss affecting region
71 light absorbing material layer
80 film thickness modulating layer
81 third thin film
81A third A thin film
81B third B thin film
82 fourth thin film
82A fourth A thin film
82B fourth B thin film
91 light absorbing material layer

The invention claimed is:

1. A light emitting element including a first light reflecting layer, a laminated structure, and a second light reflecting layer laminated to each other, wherein
the laminated structure includes a first compound semiconductor layer, a light emitting layer, and a second compound semiconductor layer laminated to each other from a side of the first light reflecting layer,
light from the laminated structure is emitted to an outside via the first light reflecting layer or the second light reflecting layer,
the first light reflecting layer has a structure in which at least two types of thin films are alternately laminated to each other in plural numbers,
a film thickness modulating layer is provided between the laminated structure and the first light reflecting layer,
at least two light absorbing material layers are formed inside the laminated structure in parallel with a virtual plane occupied by the light emitting layer, and $$0.9 \times \{(m \cdot \lambda_0)/(2 \cdot n_{eq})\} \le L_{Abs} \le 1.1 \times \{(m \cdot \lambda_0)/(2 \cdot n_{eq})\}$$

is satisfied when an oscillating wavelength is $\lambda_0$, an entire equivalent refractive index of two light absorbing material layers and a portion of the laminated structure positioned between the two light absorbing material layers is $n_{eq}$, and a distance between the two light absorbing material layers is $L_{Abs}$, and m is one.

2. The light emitting element according to claim 1, wherein
at least four light absorbing material layers are formed.

3. The light emitting element according to claim 1, wherein
the at least two light absorbing material layers have a thickness of $\lambda_0/(4 \cdot n_{eq})$ or less.

4. The light emitting element according to claim 1, wherein
the at least two light absorbing material layers are positioned at a minimum amplitude portion occurring in a standing wave of light formed inside the laminated structure.

5. The light emitting element according to claim 1, wherein
the light emitting layer is positioned at a maximum amplitude portion occurring in the standing wave of the light formed inside the laminated structure.

6. The light emitting element according to claim 1, wherein
the at least two light absorbing material layers have a light absorbing coefficient twice or more as large as a light absorbing coefficient of a compound semiconductor constituting the laminated structure.

7. The light emitting element according to claim 1, wherein
the at least two light absorbing material layers are made of at least one type of a material selected from a group including a compound semiconductor material having a band gap narrower than a band gap of the compound semiconductor constituting the laminated structure, a compound semiconductor material doped with impurities, a transparent conductive material, and a light reflecting layer constituting material having light absorbing characteristics.

8. A light emitting element including a first light reflecting layer, a laminated structure, and a second light reflecting layer laminated to each other, wherein
the laminated structure includes a first compound semiconductor layer, a light emitting layer, and a second compound semiconductor layer laminated to each other from a side of the first light reflecting layer,
light from the laminated structure is emitted to an outside via the first light reflecting layer or the second light reflecting layer,
the first light reflecting layer has a structure in which at least two types of thin films are alternately laminated to each other in plural numbers,
a film thickness modulating layer is provided between the laminated structure and the first light reflecting layer, at least two light absorbing material layers are formed inside the laminated structure in parallel with a virtual plane occupied by the light emitting layer, and $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied when an oscillating wavelength is $\lambda_0$, an entire equivalent refractive index of two light absorbing material layers and a portion of the laminated structure positioned between the two light absorbing material layers is $n_{eq}$, and a distance between the two light absorbing material layers is $L_{Abs}$, and m is any integer of two or more.

9. The light emitting element according to claim 8, wherein
at least four light absorbing material layers are formed.

10. The light emitting element according to claim 8, wherein
the at least two light absorbing material layers have a thickness of $\lambda_0/(4 \cdot n_{eq})$ or less.

11. The light emitting element according to claim 8, wherein
the at least two light absorbing material layers are positioned at a minimum amplitude portion occurring in a standing wave of light formed inside the laminated structure.

12. The light emitting element according to claim 8, wherein
the light emitting layer is positioned at a maximum amplitude portion occurring in the standing wave of the light formed inside the laminated structure.

13. The light emitting element according to claim 8, wherein
the at least two light absorbing material layers have a light absorbing coefficient twice or more as large as a light absorbing coefficient of a compound semiconductor constituting the laminated structure.

14. The light emitting element according to claim 8, wherein
the at least two light absorbing material layers are made of at least one type of a material selected from a group including a compound semiconductor material having a band gap narrower than a band gap of the compound semiconductor constituting the laminated structure, a compound semiconductor material doped with impurities, a transparent conductive material, and a light reflecting layer constituting material having light absorbing characteristics.

\* \* \* \* \*